(12) United States Patent
Nakagawa et al.

(10) Patent No.: US 12,200,995 B2
(45) Date of Patent: Jan. 14, 2025

(54) DISPLAY DEVICE AND ELECTRONIC DEVICE

(71) Applicant: Semiconductor Energy Laboratory Co., Ltd., Atsugi (JP)

(72) Inventors: Takashi Nakagawa, Sagamihara (JP); Hidetomo Kobayashi, Isehara (JP); Hideaki Shishido, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 445 days.

(21) Appl. No.: 17/762,490

(22) PCT Filed: Sep. 30, 2020

(86) PCT No.: PCT/IB2020/059124
§ 371 (c)(1),
(2) Date: Mar. 22, 2022

(87) PCT Pub. No.: WO2021/070009
PCT Pub. Date: Apr. 15, 2021

(65) Prior Publication Data

US 2022/0336570 A1 Oct. 20, 2022

(30) Foreign Application Priority Data

Oct. 11, 2019 (JP) .................................. 2019-187412
Apr. 7, 2020 (JP) .................................. 2020-069043

(51) Int. Cl.
*G09G 3/32* (2016.01)
*H10K 59/121* (2023.01)
*H10K 59/131* (2023.01)

(52) U.S. Cl.
CPC .......... *H10K 59/1315* (2023.02); *G09G 3/32* (2013.01); *H10K 59/1213* (2023.02); *H10K 59/1216* (2023.02)

(58) Field of Classification Search
None
See application file for complete search history.

(56) References Cited

U.S. PATENT DOCUMENTS 7,688,292 B2 *  3/2010  Park .................... G09G 3/3233
                                                      345/82
7,812,796 B2 * 10/2010  Jung .................... G09G 3/3233
                                                      345/82

(Continued)

FOREIGN PATENT DOCUMENTS

CN    101887687 A    11/2010
CN    102246220 A    11/2011

(Continued)

OTHER PUBLICATIONS

International Search Report (Application No. PCT/IB2020/059124), dated Jan. 19, 2021.

(Continued)

*Primary Examiner* — Matthew Yeung
(74) *Attorney, Agent, or Firm* — Eric J. Robinson; Robinson Intellectual Property Law Office, P.C.

(57) ABSTRACT

A display device with high luminance is provided. A pixel includes a light-emitting device, a first transistor, a second transistor, a third transistor, a fourth transistor, a first capacitor, and a second capacitor. One electrode of the light-emitting device is electrically connected to one of a source and a drain of the first transistor. A gate of the first transistor is electrically connected to one electrode of the first capacitor and one of a source and a drain of the second transistor. The other of the source and the drain of the first transistor is electrically connected to one electrode of the second capacitor. One electrode of the second capacitor is electrically connected to a first wiring having a function of supplying a first potential. The other electrode of the second capacitor is electrically connected to the other electrode of the first (Continued)

capacitor, one of a source and a drain of the third transistor, and one of a source and a drain of the fourth transistor.

10 Claims, 28 Drawing Sheets

(56) References Cited

U.S. PATENT DOCUMENTS

| | | | | |
|---|---|---|---|---|
| 7,898,623 | B2* | 3/2011 | Kimura | G09G 3/3241 |
| | | | | 349/108 |
| 8,339,530 | B2* | 12/2012 | Kimura | G09G 3/2085 |
| | | | | 349/33 |
| 8,358,299 | B2 | 1/2013 | Chaji et al. | |
| 8,471,838 | B2 | 6/2013 | Yamamoto et al. | |
| 8,520,312 | B2 | 8/2013 | Miyano | |
| 8,692,746 | B2 | 4/2014 | Ebisuno | |
| 8,902,138 | B2* | 12/2014 | Kim | G09G 3/3291 |
| | | | | 345/82 |
| 9,370,075 | B2 | 6/2016 | Chaji et al. | |
| 9,496,408 | B2 | 11/2016 | Yamazaki et al. | |
| 9,679,516 | B2 | 6/2017 | Chung et al. | |
| 9,741,865 | B2 | 8/2017 | Yamazaki et al. | |
| 9,792,860 | B2 | 10/2017 | Hokazono et al. | |
| 9,824,632 | B2 | 11/2017 | Chaji et al. | |
| 9,881,587 | B2 | 1/2018 | Chaji et al. | |
| 9,899,536 | B2 | 2/2018 | Yamazaki et al. | |
| 10,134,335 | B2 | 11/2018 | Chaji et al. | |
| 10,290,284 | B2 | 5/2019 | Chaji et al. | |
| 10,586,495 | B2 | 3/2020 | Kobayashi et al. | |
| 10,615,189 | B2* | 4/2020 | Kimura | H01L 27/1225 |
| 10,978,022 | B2 | 4/2021 | Chaji et al. | |
| 11,030,949 | B2 | 6/2021 | Chaji et al. | |
| 11,205,387 | B2 | 12/2021 | Kobayashi et al. | |
| 2006/0066532 | A1* | 3/2006 | Jeong | G09G 3/3233 |
| | | | | 345/76 |
| 2006/0244695 | A1* | 11/2006 | Komiya | G09G 3/006 |
| | | | | 345/76 |
| 2010/0207920 | A1* | 8/2010 | Chaji | G09G 3/3233 |
| | | | | 345/76 |
| 2010/0289782 | A1* | 11/2010 | Yamamoto | G09G 3/3233 |
| | | | | 345/207 |
| 2014/0132175 | A1 | 5/2014 | Hokazono et al. | |
| 2015/0310793 | A1 | 10/2015 | Kawashima et al. | |
| 2016/0104419 | A1* | 4/2016 | Chung | G09G 3/3225 |
| | | | | 345/78 |
| 2016/0274692 | A1* | 9/2016 | Yang | G09G 3/3275 |
| 2016/0293105 | A1* | 10/2016 | Wang | G09G 3/3258 |
| 2018/0026218 | A1 | 1/2018 | Kobayashi et al. | |
| 2021/0090513 | A1 | 3/2021 | Takahashi et al. | |
| 2021/0183308 | A1* | 6/2021 | Xuan | G09G 3/3275 |
| 2021/0280153 | A1 | 9/2021 | Chaji et al. | |
| 2021/0383762 | A1 | 12/2021 | Kobayashi et al. | |
| 2022/0013610 | A1* | 1/2022 | Li | H10K 59/1216 |
| 2024/0164162 | A1* | 5/2024 | Chai | H10K 59/131 |
| 2024/0251602 | A1* | 7/2024 | Xu | H10K 59/8051 |

FOREIGN PATENT DOCUMENTS

| | | |
|---|---|---|
| CN | 103810967 A | 5/2014 |
| CN | 106205479 A | 12/2016 |
| CN | 106233233 A | 12/2016 |
| EP | 2945147 A | 11/2015 |
| EP | 3404646 A | 11/2018 |
| JP | 2009-015276 A | 1/2009 |
| JP | 2010-128313 A | 6/2010 |
| JP | 2010-266492 A | 11/2010 |
| JP | 2012-042569 A | 3/2012 |
| JP | 2012-511183 | 5/2012 |
| JP | 2014-007399 A | 1/2014 |
| JP | 2014-098779 A | 5/2014 |
| JP | 2015-215611 A | 12/2015 |
| JP | 2016-081030 A | 5/2016 |
| JP | 2018-022143 A | 2/2018 |
| KR | 2016-0043593 A | 4/2016 |
| KR | 2016-0145643 A | 12/2016 |
| KR | 2019-0073015 A | 6/2019 |
| WO | WO-2010/066030 | 6/2010 |
| WO | WO-2012/164474 | 12/2012 |
| WO | WO-2015/162522 | 10/2015 |
| WO | WO-2019/123089 | 6/2019 |

OTHER PUBLICATIONS

Written Opinion (Application No. PCT/IB2020/059124), dated Jan. 19, 2021.

* cited by examiner

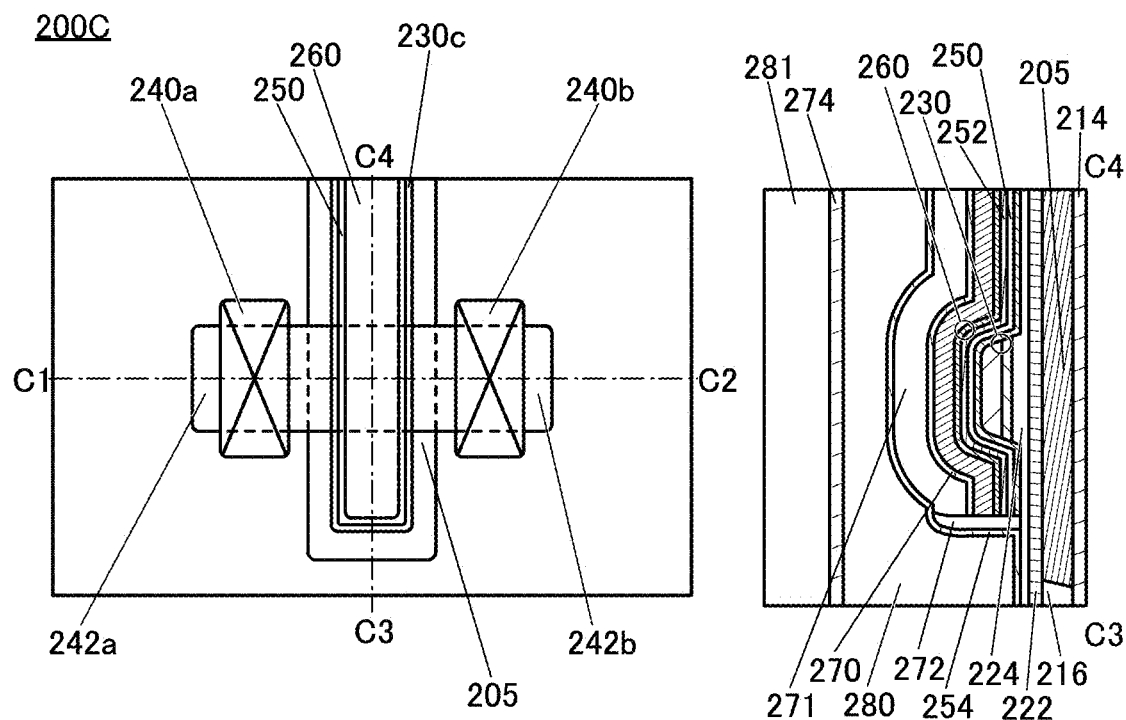
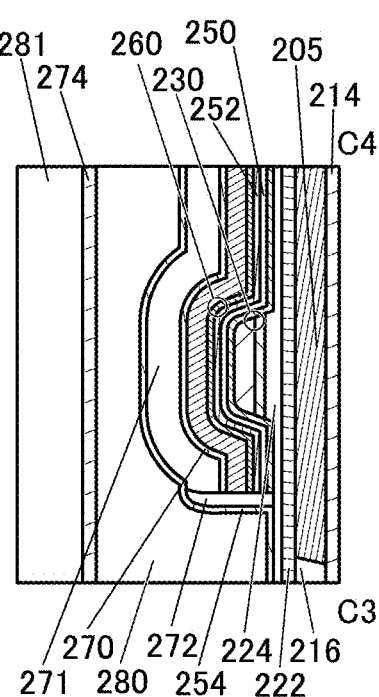
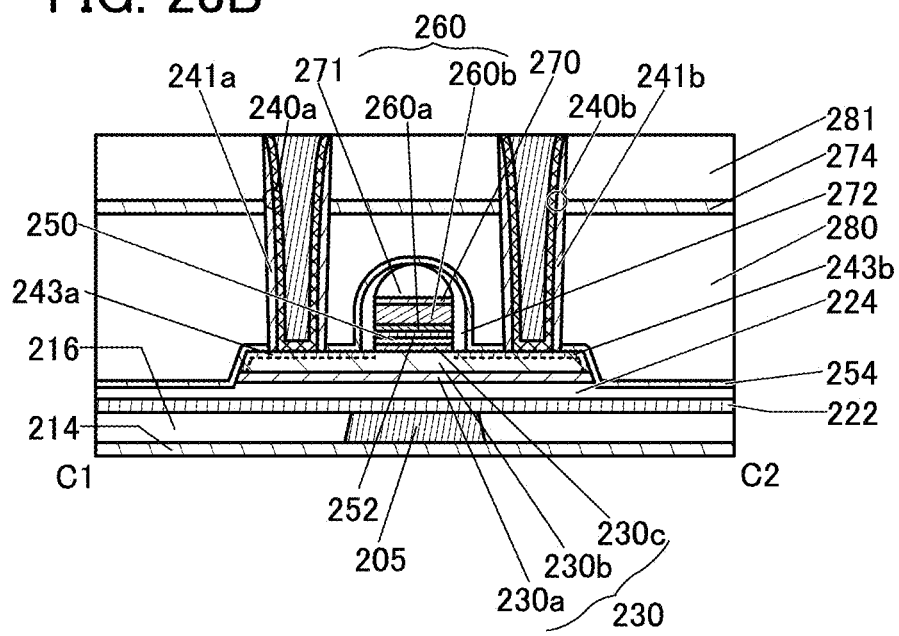

FIG. 24A
Intermediate state
New crystalline phase
| Amorphous | Crystalline | Crystal |
|---|---|---|
| • completely amorphous | • CAAC<br>• nc<br>• CAC<br>excluding single crystal and poly crystal | • single crystal<br>• poly crystal |
FIG. 24B
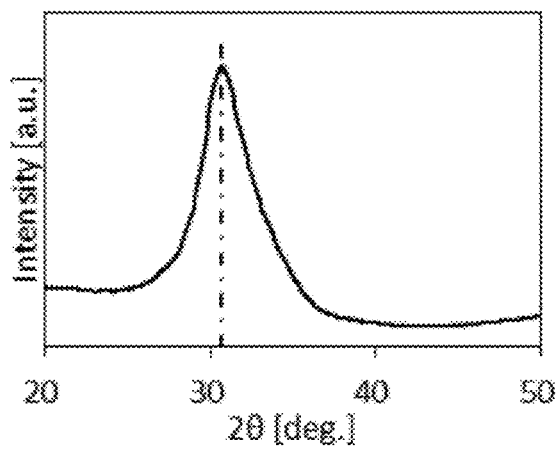
FIG. 24C
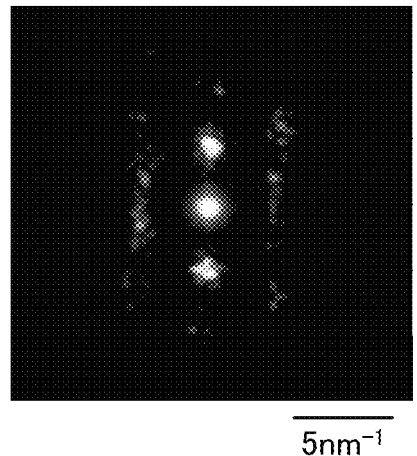
5nm$^{-1}$

DISPLAY DEVICE AND ELECTRONIC DEVICE

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility, μFE, or μ in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a transistor included in a large display device. In addition, capital investment can be reduced because part of production equipment for transistors using polycrystalline silicon or amorphous silicon can be retrofitted and utilized. A transistor using a metal oxide has field-effect mobility higher than that in the case where amorphous silicon is used; thus, a high-functional display device provided with a driver circuit can be obtained.

In addition, as display devices for augmented reality (AR) or virtual reality (VR), wearable display devices and stationary display devices are becoming widespread. Examples of wearable display devices include a head mounted display (HMD) and an eyeglass-type display device. Examples of stationary display devices include a head-up display (HUD).

In an electronic device having an imaging device such as a digital camera, a viewfinder is used to check an image to be captured before capturing the image. An electronic viewfinder is used as the viewfinder. A display portion is provided in the electronic viewfinder, and an image obtained by an image pickup device can be displayed as an image on the display portion. For example, Patent Document 2 discloses an electronic viewfinder that can provide a good visibility state from a central portion of an image to a peripheral portion of the image.

REFERENCE

Patent Document

[Patent Document 1] Japanese Published Patent Application No. 2014-7399
[Patent Document 2] Japanese Published Patent Application No. 2012-42569

SUMMARY OF THE INVENTION

Problems to be Solved by the Invention

With a display device whose display portion is close to the user, such as an HMD, the user is likely to perceive pixels and strongly feels granularity, whereby the sense of immersion or realistic feeling of AR and VR might be diminished. Therefore, an HMD requires a display device that has minute pixels, i.e., a high resolution display device, so that pixels are not perceived by the user. The pixel density of the display device is, for example, preferably 1000 ppi or higher, further preferably 5000 ppi or higher, and still further preferably 7000 ppi or higher. In AR applications, an image of a virtual space is displayed overlapping with a real space; thus, a display device with high luminance is desired in the light usage environment, in particular.

In view of the above, an object of one embodiment of the present invention is to provide a high-resolution display device. Another object of one embodiment of the present invention is to provide a display device with high luminance. Alternatively, an object of one embodiment of the present invention is to provide a display device with low power consumption. Another object of one embodiment of the present invention is to provide a display device with a narrow bezel. Another object of one embodiment of the present invention is to provide a small-size display device. Another object of one embodiment of the present invention is to provide a novel display device.

Note that the description of these objects does not preclude the existence of other objects. One embodiment of the present invention does not have to achieve all of these objects. Objects other than these can be derived from the description of the specification, the drawings, the claims, and the like.

Means for Solving the Problems

One embodiment of the present invention is a display device including a pixel portion having a plurality of pixels, a first wiring, a second wiring, a third wiring, and a fourth wiring. The pixels each include a light-emitting device, a first transistor, a second transistor, a third transistor, a fourth transistor, a first capacitor, and a second capacitor. One electrode of the light-emitting device is electrically connected to one of a source and a drain of the first transistor. A gate of the first transistor is electrically connected to one electrode of the first capacitor and one of a source and a drain of the second transistor. The other of the source and the drain of the first transistor is electrically connected to one electrode of the second capacitor. One electrode of the second capacitor is electrically connected to the first wiring having a function of supplying a first potential. The other electrode of the second capacitor is electrically connected to the other electrode of the first capacitor, one of a source and a drain of the third transistor, and one of a source and a drain of the fourth transistor. A gate of the second transistor and a gate of the fourth transistor are each electrically connected to the second wiring. A gate of the third transistor is electrically connected to the third wiring. The other of the source and the drain of the second transistor and the other of the source and the drain of the third transistor are each electrically connected to the fourth wiring.

In the above-described display device, the first transistor includes a back gate. The back gate is preferably electrically connected to the one of the source and the drain of the first transistor.

In the above-described display device, the first transistor includes a back gate. The back gate is preferably electrically connected to the gate of the first transistor.

The above-described display device further includes a fifth transistor, and one of a source and a drain of the fifth transistor is preferably electrically connected to the one electrode of the light-emitting device.

In the above-described display device, the other electrode of the light-emitting device is preferably electrically connected to a fifth wiring having a function of supplying a second potential, and the second potential is preferably lower than the first potential.

In the above-described display device, the light-emitting device is preferably an organic light-emitting diode.

The above-described display device includes a first driver circuit portion and the first driver circuit portion preferably includes a region overlapping with the pixel portion. The first driver circuit portion is preferably electrically connected to the fourth wiring.

The above-described display device preferably includes a first layer and a second layer over the first layer. The first layer preferably includes the first driver circuit portion and a second driver circuit portion. The second layer preferably includes the pixel portion. The second driver circuit portion is preferably electrically connected to the second wiring and the third wiring.

In the above-described display device, the first transistor, the second transistor, the third transistor, and the fourth transistor each preferably include a metal oxide in a channel formation region. The metal oxide preferably includes indium, zinc, and an element M (one or more of aluminum, titanium, gallium, germanium, yttrium, zirconium, lanthanum, cerium, tin, neodymium, and hafnium).

One embodiment of the present invention is an electronic device including the above-described display device and a camera.

Effect of the Invention

According to one embodiment of the present invention, a display device with high resolution can be provided. Another embodiment of the present invention can provide a display device with high luminance. Another embodiment of the present invention can provide a display device with low power consumption. Another embodiment of the present invention can provide a display device with a narrow bezel. Another embodiment of the present invention can provide a small-size display device. Another embodiment of the present invention can provide a novel display device.

Note that the description of these effects does not preclude the existence of other effects. One embodiment of the present invention does not have to have all of these effects. Other effects can be derived from the description of the specification, the drawings, the claims, and the like.

BRIEF DESCRIPTION OF THE DRAWINGS

FIG. 23A is a top view illustrating a structure example of a transistor. FIG. 23B and FIG. 23C are cross-sectional views illustrating the structure example of the transistor.

FIG. 24A is a diagram showing the classification of crystal structures of IGZO. FIG. 24B is a graph showing an XRD spectrum of a CAAC-IGZO film. FIG. 24C is an image showing a nanobeam electron diffraction pattern of a CAAC-IGZO film.

MODE FOR CARRYING OUT THE INVENTION

Figure 1:
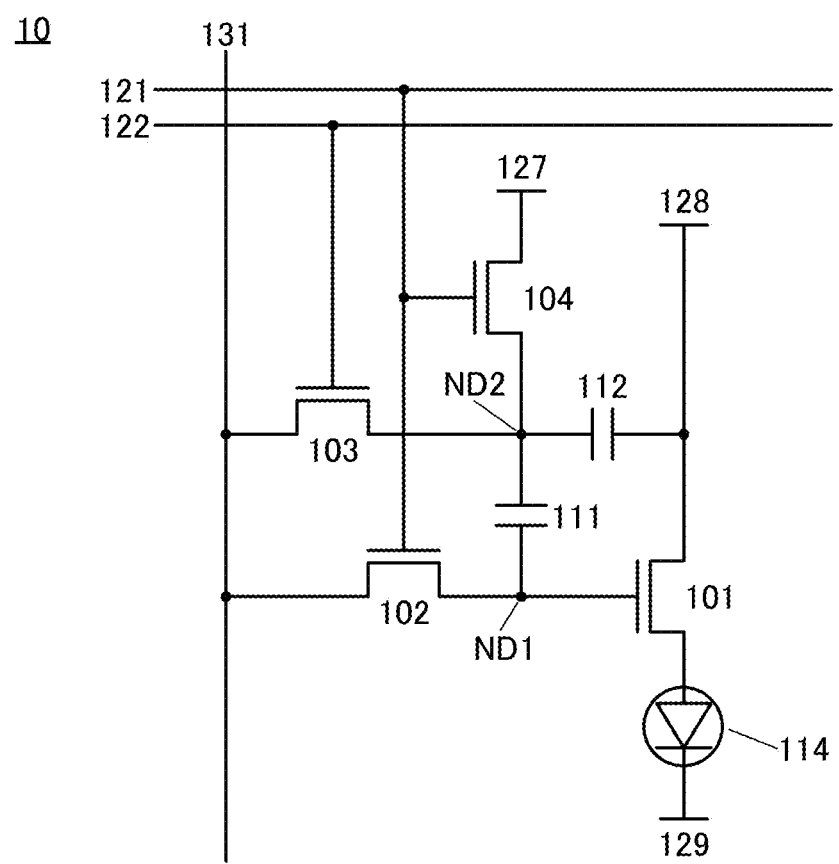
FIG. 1 is a circuit diagram illustrating an example of a pixel configuration.

Hereinafter, embodiments will be described with reference to the drawings. Note that the embodiments can be implemented in many different modes and it is readily understood by those skilled in the art that modes and details thereof can be changed in various ways without departing from the spirit and scope thereof. Therefore, the present invention should not be interpreted as being limited to the description of the embodiments below.

In each drawing described in this specification, the size, the layer thickness, or the region of each component is exaggerated for clarity in some cases.

Ordinal numbers such as "first," "second," and "third" used in this specification are used in order to avoid confusion among components and do not limit the components numerically.

In this specification and the like, terms for describing arrangement such as "over" and "under" are used for convenience to describe the positional relation between components with reference to drawings. The positional relation between components is changed as appropriate in accordance with the direction in which each component is described. Thus, without limitation to terms described in this specification, the description can be changed appropriately depending on the situation.

In this specification and the like, functions of a source and a drain of a transistor are sometimes switched from each other depending on the polarity of the transistor, the case where the direction of current flow is changed in circuit operation, or the like. Therefore, the terms "source" and "drain" can be used interchangeably.

In this specification and the like, the terms "electrode," "wiring," and "terminal" do not functionally limit those components. For example, an "electrode" is used as part of a "wiring" in some cases, and vice versa. Furthermore, the term "electrode" or "wiring" can also mean the case where a plurality of "electrodes" or "wirings" are formed in an integrated manner, for example. For example, a "terminal" is used as part of a "wiring" or an "electrode" in some cases, and vice versa. Furthermore, the term "terminal" can also mean the case where a plurality of "electrodes," "wirings," "terminals," or the like are formed in an integrated manner, for example. Therefore, for example, an "electrode" can be part of a "wiring" or a "terminal," and a "terminal" can be part of a "wiring" or an "electrode." The term "electrode," "wiring," or "terminal" is sometimes replaced with the term "region," for example.

In this specification and the like, as for a "resistor", a resistance value depends on a length of a wiring. Alternatively, a resistor includes a case where it can be formed by connection between a conductor used for a wiring and another conductor with a low efficiency different from that of the conductive layer through a contact. Alternatively, the resistance value is sometimes determined by connection to a conductor with resistivity different from that of a conductor used for a wiring. Alternatively, the resistance value is sometimes determined by doping a semiconductor with an impurity.

In this specification and the like, the expression "electrically connected" includes the case where components are directly connected to each other and the case where components are connected through an "object having any electric function." Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit. In addition, the expression "directly connected" includes the case where a wiring is formed in different conductive layers through a contact. Note that a wiring may be formed of conductors that contain one or more of the same elements or may be formed of conductors that contain different elements.

In this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to drain current of a transistor in an off state (also referred to as a non-conduction state or a cutoff state). Unless otherwise specified, an off state refers to a state where the voltage $V_{gs}$ between its gate and source is lower than the threshold voltage $V_{th}$ in an n-channel transistor (higher than $V_{th}$ in a p-channel transistor).

In the drawings, the size, the layer thickness, or the region is exaggerated for clarity in some cases. Therefore, they are not limited to the illustrated scale. Note that the drawings are schematic illustrations, and embodiments of the present invention are not limited to shapes or values illustrated in the drawings. For example, in an actual manufacturing process, a layer, a resist mask, or the like might be unintentionally reduced in size by treatment such as etching, which might not be reflected in the drawings for easy understanding. In the drawings, the same portions or portions having similar functions and materials are denoted by the same reference numerals in different drawings, and explanation thereof is not repeated in some cases. Furthermore, the same hatch pattern is used for the portions having similar functions and materials, and the portions are not especially denoted by reference numerals in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when an OS transistor is described, it can also be referred to as a transistor including an oxide or an oxide semiconductor.

Embodiment 1

In this embodiment, a display device of one embodiment of the present invention will be described.

One embodiment of the present invention is a display device having pixels. The pixels each have a function of generating a voltage higher than a voltage corresponding to image data supplied from a source driver. A storage node is provided in each pixel, and first data can be held in the storage node. Second data is supplied to each pixel and the first data is added to the second data by capacitive coupling. Then, the second data to which the first data is added can be supplied to a light-emitting device. Alternatively, the first data can be added by capacitive coupling after the second data is written to the storage node.

The same image data can be used as the first data and the second data. In this case, a pixel included in the display device can generate a voltage higher than the voltage corresponding to the image data supplied from the source driver and supply the voltage to a driving transistor controlling the amount of current flowing to the light-emitting device. Accordingly, the current flowing in the light-emitting device can be increased, and a display device with high luminance can be obtained.

For example, a display device that is one embodiment of the present invention can be favorably used as an AR display device that requires high luminance. The output voltage of the source driver can reduced and thus the display device can be a low-power consumption display device. Furthermore, a high-voltage-output driver is unnecessary and a general driver IC or the like can be used. Alternatively, a light-emitting device that is difficult to operate even with a high-voltage-output driver can be operated.

Note that in this specification and the like, generation of a voltage higher than a voltage to be supplied can be referred to as "boosting".

The display device of one embodiment of the present invention can use the image data as the first data and data for correction as the second data, for example. In this case, the display device can display a corrected image. Through the correction, image upconversion can be performed. Alternatively, HDR (High Dynamic Range) display can be performed by correction of part or the whole of an image in a display region.

Alternatively, in the display device of one embodiment of the present invention, given images superimposed on each other can be displayed when different image data are used as the first data and the second data.

The display device of one embodiment of the present invention includes an overlapping region of a pixel portion including a plurality of pixels and the source driver. When the overlapping region of the pixel portion and the source driver is included, the area of a bezel where pixels are not provided can be small. Therefore, a display device with a small bezel can be obtained. In addition, by narrowing the bezel of the display device, a small-size display device can be obtained.

Note that in this specification and the like, a pixel refers to one element whose brightness can be controlled, for example. Therefore, for example, one pixel expresses one color element by which brightness is expressed. Accordingly, in the case of a color display device having color elements of R (red), G (green), and B (blue), a minimum unit of an image is composed of three pixels of an R pixel, a G pixel, and a B pixel. In this case, each of the RGB pixels may be referred to as a subpixel, and RGB subpixels may be collectively referred to as a pixel.

Example 1 of Pixel Configuration

FIG. 1 illustrates an example of a configuration of a pixel 10 that can be used in a display device of one embodiment of the present invention. The pixel 10 includes a light-emitting device 114, a transistor 101, a transistor 102, a transistor 103, a transistor 104, a capacitor 111, and a capacitor 112.

One electrode of the light-emitting device 114 is electrically connected to one of a source and a drain of the transistor 101. A gate of the transistor 101 is electrically connected to one electrode of the capacitor 111. The gate of the transistor 101 is electrically connected to one of a source and a drain of the transistor 102. The other of the source and the drain of the transistor 101 is electrically connected to one electrode of the capacitor 112. The other electrode of the capacitor 112 is electrically connected to the other electrode of the capacitor 111. The other electrode of the capacitor 112 is electrically connected to one of a source and a drain of the transistor 103. The other electrode of the capacitor 112 is electrically connected to one of a source and a drain of the transistor 104.

In the pixel 10 illustrated in FIG. 1, the capacitor 111 and the capacitor 112 are connected in series, and the gate of the transistor 101 serving as a driving transistor and the other of the source and the drain of the transistor 101 are electrically connected to each other through these capacitors.

Examples of the light-emitting device 114 include self-light-emitting devices such as a light-emitting diode (LED), an organic light-emitting diode (OLED), a light-emitting diode in which quantum dots are used in a light-emitting layer (QLED: Quantum-dot Light Emitting Diode), and a semiconductor laser. It is also possible to use, for example, a MEMS (Micro Electro Mechanical Systems) shutter element, an optical interference type MEMS element, or an element using a microcapsule method, an electrophoretic method, an electrowetting method, an Electronic Liquid Powder (registered trademark) method, or the like.

A wiring to which the gate of the transistor 101, the one of the source and the drain of the transistor 102, and the one electrode of the capacitor 111 are connected is referred to as a node ND1. The current flowing to the light-emitting device 114 can be controlled with the potential of the node ND1 to control the emission luminance of the light-emitting device 114. A wiring to which the one of the source and the drain of the transistor 103, one electrode of the source and the drain of the transistor 104, the other electrode of the capacitor 111, and the other electrode of the capacitor 112 are connected is referred to as a node ND2.

The transistor 101 functions as a driving transistor that controls the amount of current flowing to the light-emitting device 114. The transistor 102 and the transistor 103 each function as a selection transistor that selects a pixel. The transistor 104 functions as a switch for writing, to the pixel, a specific potential (a reference potential) "Vref" for driving the pixel 10.

A gate of the transistor 102 is electrically connected to a wiring 121. A gate of the transistor 104 is electrically connected to the wiring 121. A gate of the transistor 103 is electrically connected to a wiring 122. The other of the source and the drain of the transistor 102 is electrically connected to a wiring 131. The other of the source and the drain of the transistor 103 is electrically connected to the wiring 131.

One electrode of the capacitor 112 is electrically connected to a wiring 128. The wiring 128 preferably has a function of supplying a specific potential. The one electrode of the capacitor 112 is electrically connected to the wiring 128, whereby the potential of the one electrode of the capacitor 112 can be fixed to a specific potential supplied from the wiring 128 and a boosting operation can be stably performed. The other electrode of the light-emitting device 114 is electrically connected to a wiring 129. The wiring 128 and the wiring 129 can each function as a wiring (power supply line) to which a power supply potential is supplied. For example, the wiring 128 can function as a high potential power supply line for supplying a potential higher than that of the wiring 129. The wiring 129 can function as a low potential power supply line for supplying a potential lower than that of the wiring 128.

The wiring 121 and the wiring 122 have a function of a scan line for controlling the operation of the transistor 102, the transistor 103, and the transistor 104. A scan signal supplied to the scan line is a signal for controlling the conducting state or non-conducting state (on or off) of the selection transistor (the transistor 102, the transistor 103, and the transistor 104) that functions as a switch in the pixel 10. The wiring 131 has a function of a data line for supplying the first data and the second data. The wiring 127 has a function of supplying a specific potential (reference potential) "Vref" for driving the pixel 10.

The node ND1 is a storage node, and the first data supplied to the wiring 131 can be written to the node ND1 when the transistor 102 is turned on. When the transistor 102 is turned off, the first data written to the node ND1 can be held.

The node ND2 is a storage node, and the second data supplied to the wiring 131 can be written to the node ND2 when the transistor 103 is turned on. When the transistor 104 is turned on, the second data supplied to the wiring 127 can be written to the node ND2. In addition, when the transistor 103 and the transistor 104 are turned off, the second data written to the node ND2 can be held.

A transistor having an extremely low off-state current is preferably used as at least one of the transistor 101, the transistor 102, the transistor 103, and the transistor 104. In particular, when transistors having an extremely low off-state current are used as the transistor 102, the transistor 103, and the transistor 104, the potentials of the node ND1 and the node ND2 can be held for a long time. As the transistor, a transistor using a metal oxide in a channel formation region (hereinafter an OS transistor) can be suitably used, for example.

It is further preferable that OS transistors be used as all the transistors 101, 102, 103, and 104. An OS transistor may be used as a transistor (not illustrated) other than the transistor 101, the transistor 102, the transistor 103, and the transistor 104. In the case of operating within a range where the amount of leakage current is acceptable, a transistor including silicon in a channel formation region (hereinafter a Si transistor) may be used. Alternatively, an OS transistor and a Si transistor may be used together. Examples of the Si transistor include a transistor including amorphous silicon and a transistor including crystalline silicon (microcrystalline silicon, low-temperature polysilicon, or single crystal silicon). Note that the transistors illustrated in FIG. 1 are all n-channel transistors, but p-channel transistors can also be used.

As a semiconductor material used for an OS transistor, a metal oxide whose energy gap is greater than or equal to 2 eV, preferably greater than or equal to 2.2 eV, further preferably greater than or equal to 2.5 eV can be used. A typical example thereof is an oxide semiconductor containing indium, and a CAAC-OS (C-Axis Aligned Crystalline Oxide Semiconductor) or a CAC-OS (Cloud-Aligned Composite Oxide Semiconductor), each of which will be described later, or the like can be used, for example. A CAAC-OS has a stable crystal structure and is suitable for a transistor that is required to have high reliability, for example. A CAC-OS has high mobility and is suitable for a transistor that operates at high speed, for example.

Since the semiconductor layer of an OS transistor has a large energy gap, the OS transistor can exhibit extremely low off-state current characteristics of several yA/µm (y is $10^{-24}$), which is an off-state current per micrometer of a channel width. An OS transistor has features such that impact ionization, an avalanche breakdown, a short-channel effect, and the like do not occur, which are different from those of a Si transistor, enabling formation of a highly reliable circuit. Moreover, variations in electrical characteristics due to crystallinity unevenness, which are caused in Si transistors, are less likely to occur in OS transistors.

The semiconductor layer included in the OS transistor can be, for example, a film represented by an In-M-Zn-based oxide that contains indium, zinc, and an element M (M is one or more of aluminum, titanium, gallium, germanium, yttrium, zirconium, lanthanum, cerium, tin, neodymium, and hafnium).

In the case where the oxide semiconductor included in the semiconductor layer is an In-M-Zn-based oxide, it is preferable that the atomic ratio of the metal elements in a sputtering target used for forming a film of the In-M-Zn oxide satisfy In and Zn M. The atomic ratio of the metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=10:1:3, In:M:Zn=10:1:6, or In:M:Zn=10:1:8. Note that the atomic ratio in the formed semiconductor layer may vary from the above atomic ratio of the metal elements in the sputtering target in a range of ±40%.

An oxide semiconductor with a low carrier concentration is used for the semiconductor layer. For example, an oxide semiconductor that has a carrier concentration lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$ and higher than or equal to $1\times10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Without being limited to those described above, a material with an appropriate composition can be used in accordance with required semiconductor characteristics and electrical characteristics (e.g., field-effect mobility and threshold voltage) of the transistor. To obtain the required semiconductor characteristics of the transistor, the carrier concentration, the impurity concentration, the defect density, the atomic ratio of a metal element to oxygen, the interatomic distance, the density, and the like of the semiconductor layer are preferably set to appropriate values.

When the oxide semiconductor in the semiconductor layer contains silicon or carbon, which is an element belonging to Group 14, the amount of oxygen vacancies is increased and the semiconductor layer becomes n-type. Thus, the concentration of silicon or carbon in the semiconductor layer (the concentration obtained by secondary ion mass spectrometry) is $2\times10^{18}$ atoms/cm$^3$ or lower, preferably $2\times10^{17}$ atoms/cm$^3$ or lower.

An alkali metal and an alkaline earth metal might generate carriers when bonded to a component contained in an oxide semiconductor, in which case the off-state current of the transistor might increase. Therefore, the concentration of an alkali metal or an alkaline earth metal in the semiconductor layer (the concentration obtained by secondary ion mass spectrometry) is $1\times10^{18}$ atoms/cm$^3$ or lower, preferably $2\times10^{16}$ atoms/cm$^3$ or lower.

When nitrogen is included in the oxide semiconductor forming the semiconductor layer, electrons serving as carriers are generated in the oxide semiconductor and the carrier concentration increases; hence, the semiconductor layer easily becomes n-type. Thus, a transistor using an oxide semiconductor that contains nitrogen is likely to have normally-on characteristics. Therefore, the concentration of nitrogen in the semiconductor layer (the concentration obtained by secondary ion mass spectrometry) is preferably $5\times10^{18}$ atoms/cm$^3$ or lower.

When hydrogen is contained in the oxide semiconductor forming the semiconductor layer, hydrogen reacts with oxygen bonded to a metal atom contained in the oxide semiconductor to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy which hydrogen enters functions as a donor, generating an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor obtained by secondary ion mass spectrometry (SIMS) is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When an oxide semiconductor with sufficiently reduced impurities such as hydrogen is used for a channel formation region of a transistor, the transistor can have stable electrical characteristics.

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of a CAAC-OS, and a region having a single crystal structure. The mixed film has, for example, a single-layer structure or a layered structure including two or more of the foregoing regions in some cases.

The composition of a CAC-OS, which is one embodiment of a non-single-crystal semiconductor layer, will be described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, the CAC-OS in the In—Ga—Zn oxide (an In—Ga—Zn oxide in the CAC-OS may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film (this composition is also referred to as a cloud-like composition).

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, when the atomic ratio of In to the element M in a first region is greater than the atomic ratio of In to the element M in a second region, for example, the first region is described as having a higher In concentration than the second region.

Note that a compound containing In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different compositions is not included. For example, a two-layer structure of a film containing In as a main component and a film containing Ga as a main component is not included.

A boundary between the region containing GaO$_{X3}$ as a main component and the region containing In$_{X2}$Zn$_{Y2}$O$_{Z2}$ or InO$_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated, for example. In the case where the CAC-OS is formed by a sputtering method, one or more of an inert gas (typically, argon), an oxygen gas, and a nitrogen gas may be used as a deposition gas. The flow rate of the oxygen gas with respect to the total flow rate of the deposition gas in deposition is preferably as low as possible; for example, the flow rate of the oxygen gas is preferably higher than or equal to 0% and lower than 30%, further preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the X-ray diffraction measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. Thus, it is found from the electron diffraction pattern that the crystal structure of the CAC-OS includes an nc (nanocrystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions containing $GaO_{X3}$ as a main component and the regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is exhibited. Accordingly, when the regions containing $In_{X2}Zn_{Y2}O_{Z2}$ or $InO_{X1}$ as a main component are distributed like a cloud in an oxide semiconductor, high field-effect mobility (µ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the regions containing $GaO_{X3}$ or the like as a main component are distributed in an oxide semiconductor, leakage current can be suppressed and a favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (µ) can be achieved.

A semiconductor element using a CAC-OS has high reliability. Thus, the CAC-OS is suitably used as a material in a variety of semiconductor devices.

Example 1 of Pixel Operation

An example of the boosting operation of the pixel 10 will be described with reference to a timing chart shown in FIG. 2. Here is described an example of an operation in which the same image data are used as the first data and the second data and the second data is added to the first data to generate a voltage higher than a voltage corresponding to the image data.

Note that in the following description, a high potential is represented by "High" and a low potential is represented by "Low". The image data and a specific potential are represented by "Vdata" and "Vref", respectively. As "Vref", 0 V, a GND potential, or a certain reference potential can be used, for example. In addition, the potential of the wiring 128 is represented by "Vano". For example, "Vano" is preferably a potential at which the transistor 101 operates in a saturation region when luminance of the light-emitting device 114 is maximum. In addition, the potential of the wiring 129 is represented by "Vcath". "Vcath" is preferably a potential at which the light-emitting device 114 does not emit light at the time when the potential of the node ND1 is minimum.

First, an operation of writing image data "Vdata" to the node ND1 as the first data is described. Note that in potential distribution, potential coupling, or potential loss, detailed changes due to a circuit configuration, operation timing, or the like are not considered here.

At time T1, the potential of the wiring 121 is set to "High", the potential of the wiring 122 is set to "Low", the potential of the wiring 131 is set to "Vdata", and the potential of the wiring 127 is set to "Vref", so that the transistor 102 and the transistor 104 are turned on, and the potential "Vdata" of the wiring 131 is written to the node ND1 and the potential "Vref" of the wiring 127 is written to the node ND2.

At this time, when a difference between potentials applied to both terminals of the capacitor 111 is V1, the potential difference V1 can be expressed in Formula (1).

$$V1 = V\text{data} - V\text{ref} \tag{1}$$

Similarly, when a difference between potentials applied to both terminals of the capacitor 112 is V2, the potential difference V2 can be expressed in Formula (2).

$$V2 = V\text{ano} - V\text{ref} \tag{2}$$

At time T2, the potential of the wiring 121 is set to "Low" and the potential of the wiring 122 is set to "Low", so that the transistor 102 and the transistor 104 are turned off.

At this time, the potential $V_{ND1}$ of the node ND1 can be expressed in Formula (3). The potential $V_{ND2}$ of the node ND2 can be expressed in Formula (4).

$$V_{ND1} = V\text{data} - a \tag{3}$$

$$V_{ND2} = V\text{ref} - b \tag{4}$$

At this time, the potential difference V1 between both terminals of the capacitor 111 can be expressed in Formula (5). The potential difference V2 between both terminals of the capacitor 112 can be expressed in Formula (6).

$$V1 = (V\text{data} - a) - (V\text{ref} - b) \tag{5}$$

$$V2 = V\text{ano} - (V\text{ref} - b) \tag{6}$$

Note that a is a constant and represents the amount of change in potential because of influences by feedthrough, charge injection, or the like when the transistor 102 is turned off. In addition, b is a constant and represents the amount of change in potential because of influences by feedthrough, charge injection, or the like when the transistor 104 is turned off.

Next, an operation in which the image data "Vdata" is written to the node ND2 as the second data and the potential of the node ND1 is boosted is described.

At time T3, the potential of the wiring 121 is set to "Low", and the potential of the wiring 122 is set to "High", whereby the transistor 103 is turned on, and the potential "Vdata" of the wiring 131 is written to the node ND2.

At this time, as the potential difference V1 between both terminals of the capacitor 111, the potential difference V1 expressed in Formula (5) is held; thus, the potential $V_{ND1}$ of the node ND1 can be expressed in Formula (7). The potential $V_{ND2}$ of the node ND2 can be expressed in Formula (8).

$$V_{ND1} = 2V\text{data} - V\text{ref} - a + b \quad (7)$$

$$V_{ND2} = V\text{data} \quad (8)$$

At Time T4, the potential of the wiring 121 is set to "Low" and the potential of the wiring 122 is set to "Low" to turn off the transistor 103 and a voltage Vgs between the gate and source of the transistor 101 becomes the sum of voltages held in the capacitor 111 and the capacitor 112, and current corresponding to Vgs flows through the light-emitting device 114.

In this case, the potential $V_{ND1}$ of the node ND1 can be expressed in Formula (9). The potential $V_{ND2}$ of the node ND2 can be expressed in Formula (10).

$$V_{ND1} = 2V\text{data} - V\text{ref} - a + b - c \quad (9)$$

$$V_{ND2} = V\text{data} - c \quad (10)$$

Note that c is a constant and represents the amount of change in potential because of influences by feedthrough, charge injection, or the like when the transistor 103 is turned off.

Here, in Formula (9), when Vref is "0 V" and the constant a, the constant b, and the constant c are zero, $V_{ND1}$ can be expressed as "2Vdata" and can be obtained as a higher value than a potential "Vdata" supplied to the pixel 10. That is, by boosting $V_{ND1}$ to a voltage higher than the voltage (Vdata) corresponding to the image data supplied to the pixel 10, the boosted voltage can be supplied to the transistor 101 serving as a driving transistor. Accordingly, the amount of current flowing to the light-emitting device 114 can be increased, and thus the display device can have high luminance.

Figure 2:
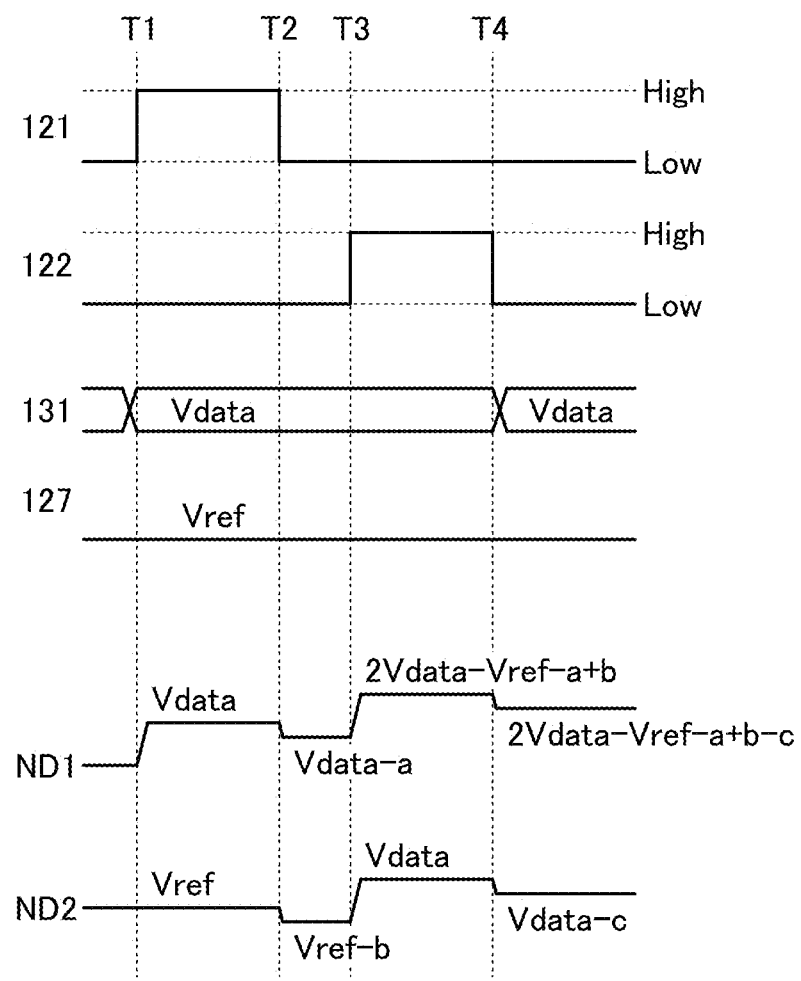
FIG. 2 is a timing chart showing an operation of a pixel circuit.

The operations in FIG. 2 can be sequentially performed in one horizontal period.

In the display device of one embodiment of the present invention, a high voltage can be generated even by using a general-purpose driver IC. For example, a voltage that is supplied from a driver IC in order to drive the light-emitting device or the like can be approximately halved; thus, power consumption of the display device can be reduced. As another example, by writing the same image data twice, the current flowing through the light-emitting device can be increased, so that the luminance of the display can be increased.

Such a combination of the first data and the second data enables upconversion, HDR display, correction of display unevenness unique to display devices, and correction of the threshold voltage of transistors included in pixels, for example. Alternatively, they can be performed in combination.

In the upconversion operation, for example, different correction data are supplied to four adjacent pixels (in two rows and two columns) and the same image data are supplied to these pixels. The supplied image data are corrected (converted) into different image data in the respective pixels, and display in each pixel can be performed. For example, image data that is applied to one given pixel for 4K2K data is input to four given pixels in a display device having pixels in number corresponding to 8K4K, and different correction data are input to the four pixels, whereby display with increased resolution can be performed.

The display device of one embodiment of the present invention can display different images superimposed on each other, which is the correction of image data in a broad sense. For example, it is possible to display a composite image in which a first image composed of the image data "Vdata" and a second image composed of the correction data "Vw" are superimposed on each other. Such a combination of the image data and the correction data enables improvement in luminance of the entire displayed image, for example, as well as display of an image synthesized from different images. For example, the combination can be applied to insertion of a character, display of augmented reality (AR), or the like.

Example 2 of Pixel Configuration

Figure 3A:
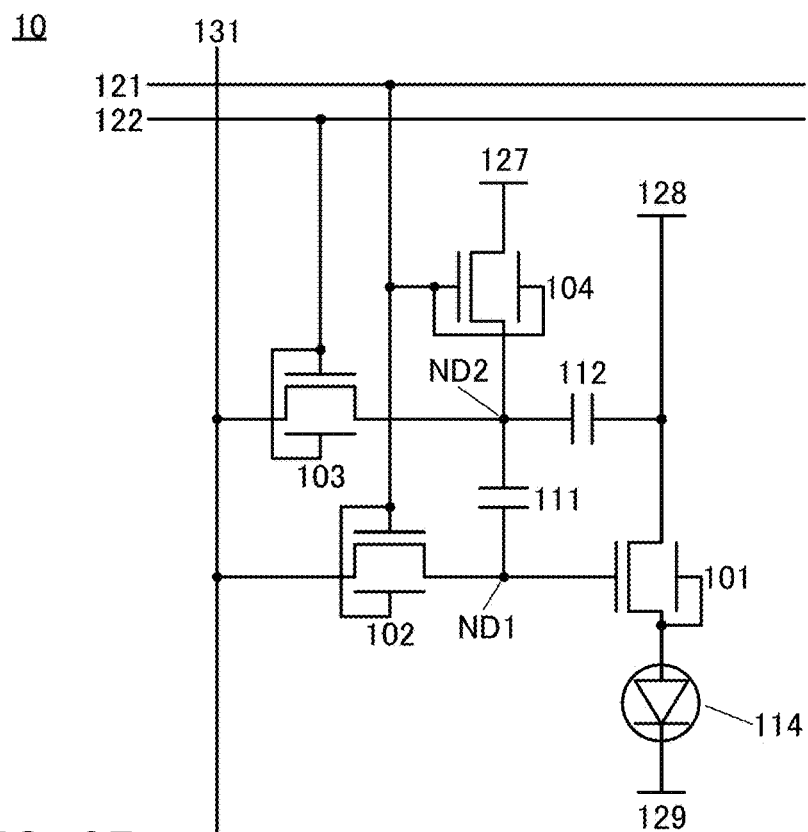
FIG. 3A and FIG. 3B are circuit diagrams each showing an example of a pixel configuration.
Figure 3B:
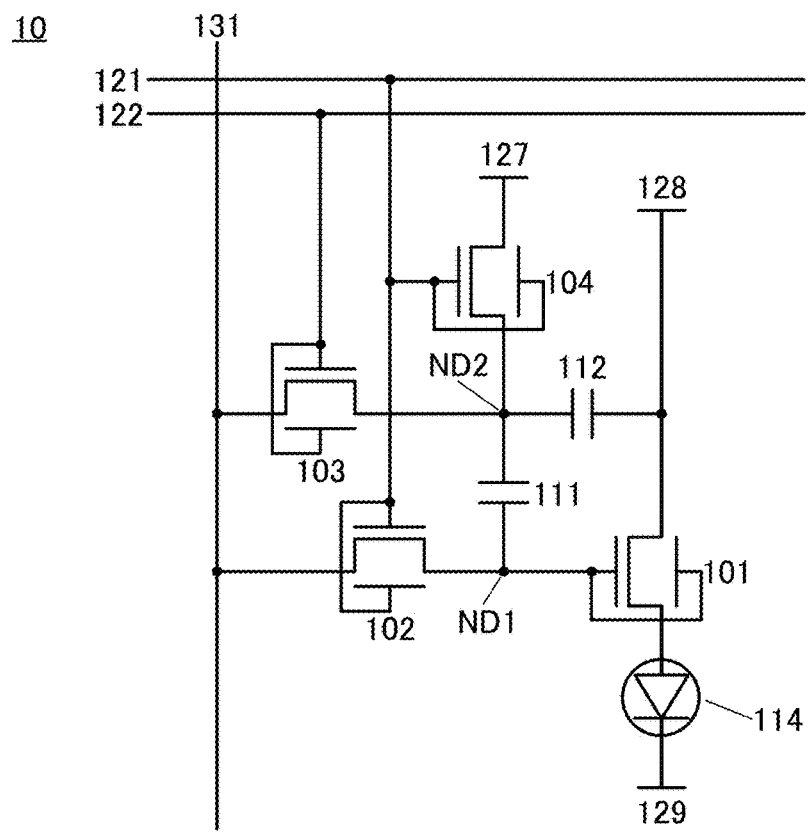
Figure 4:
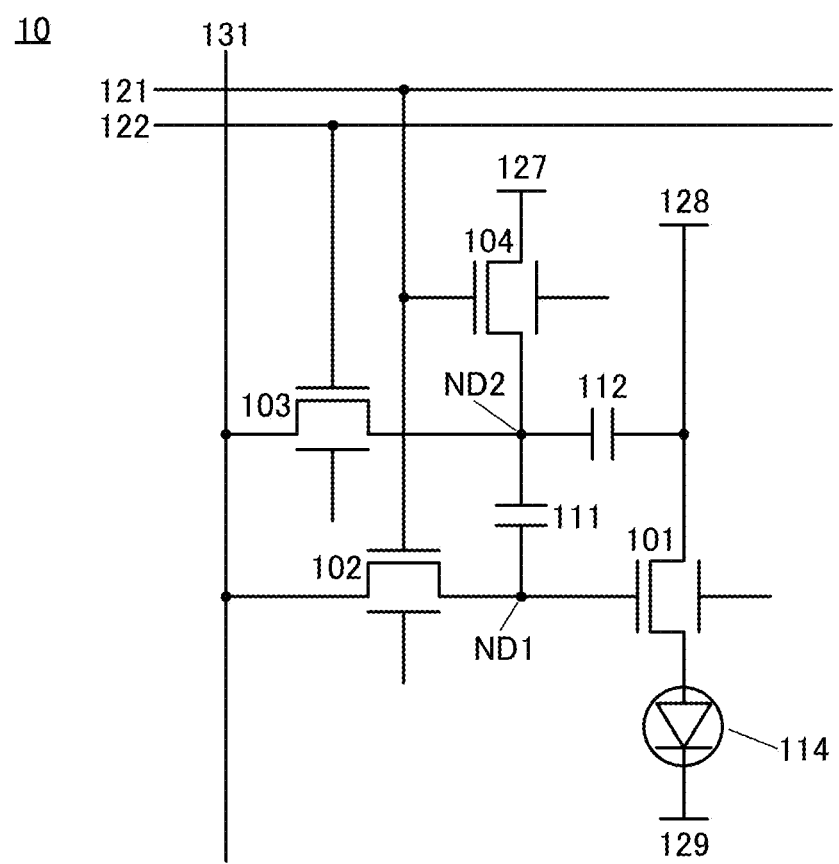
FIG. 4 is a circuit diagram illustrating an example of a pixel configuration.

Configurations different from that of the pixel 10 illustrated in FIG. 1 are illustrated in FIG. 3A, FIG. 3B, and FIG. 4.

As illustrated in FIG. 3A, the transistor 101, the transistor 102, the transistor 103, and the transistor 104 may each include a back gate. In particular, the transistor 101 functioning as a driving transistor preferably includes a back gate. FIG. 3A illustrates a configuration in which the back gate of the transistor 101 is electrically connected to one of the source and the drain of the transistor 101, offering an effect of improving of the saturation in transistor characteristics. The back gates of the transistor 102, the transistor 103, and the transistor 104 is electrically connected to their respective gates (referred to as front gates in some cases), and the on-state current can be increased.

As illustrated in FIG. 3B, the back gate of the transistor 101 may be electrically connected to the front gate. Such a structure increases the on-state current of the transistor 101.

As illustrated in FIG. 4, the back gate may be electrically connected to a wiring capable of supplying a constant potential so that the threshold voltage of the transistor can be controlled. Note that although FIG. 3A, FIG. 3B, and FIG. 4 illustrate a structure in which all of the transistors have back gates, a transistor without a back gate may be included.

Example 3 of Pixel Configuration

Figure 5:
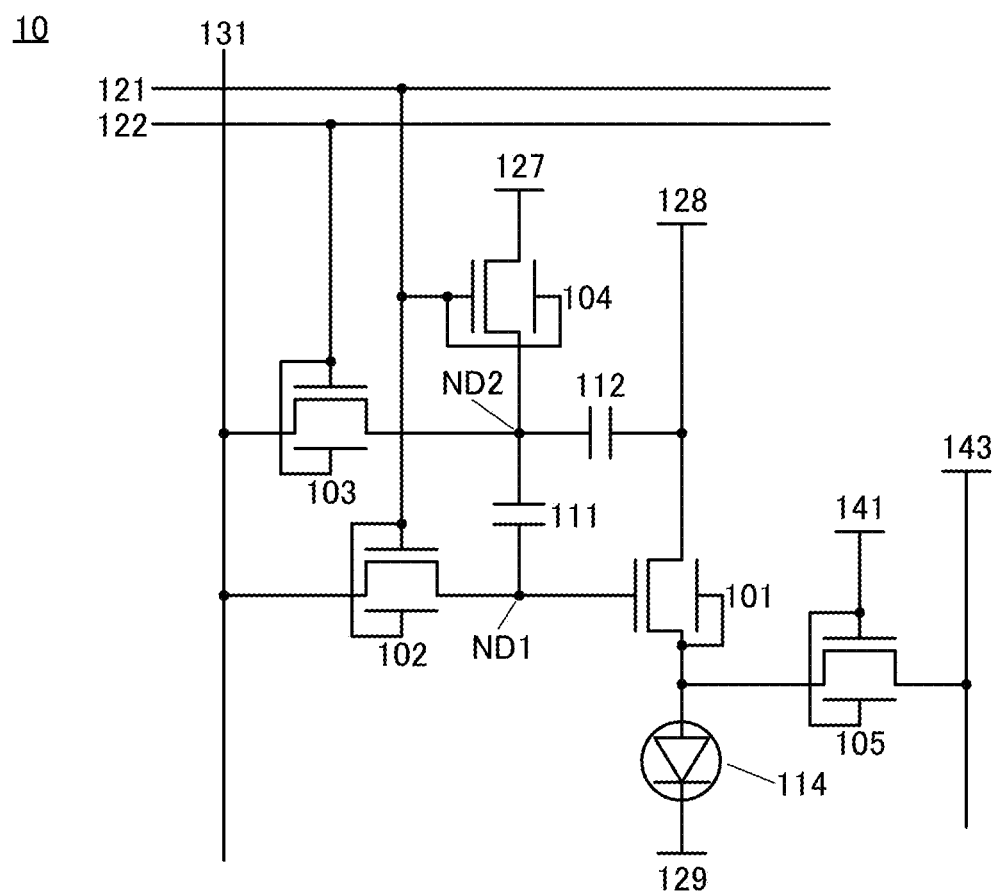
FIG. 5 is a circuit diagram illustrating an example of a pixel configuration.

FIG. 5 illustrates a configuration different from that of the pixel 10 illustrated in FIG. 3A.

The pixel 10 illustrated in FIG. 5 is different from the pixel 10 illustrated in FIG. 3A in that the transistor 105 is provided. One of a source and a drain of the transistor 105 is electrically connected to one electrode of the light-emitting device 114. The other of the source and the drain of the transistor 105 is electrically connected to a wiring 143. A gate of the transistor 105 is electrically connected to a wiring 141. The wiring 141 has a function of a scan line for controlling the operation of the transistor 105.

The transistor 105 can have a function of resetting the potential of one electrode of the light-emitting device 114 to the potential of the wiring 143. When the potential of the one electrode of the light-emitting device 114 is reset, a malfunction of unintentional current flowing to the light-emitting device 114 is suppressed.

The transistor 105 can be electrically connected to a circuit (not illustrated) having a function of monitoring current through the wiring 141. Thus, current flowing when a predetermined potential is supplied to the gate of the transistor 101 is supplied to the circuit through the transistor 105 and the wiring 141, whereby electric characteristics of the transistor 101 can be monitored. Variation in mobility and variation in the threshold voltage of the transistor 101 can be calculated from current flowing into the circuit and data for correcting the threshold voltage is given to the transistor 101, whereby the display device with less display unevenness can be provided.

The transistor 105 may have a back gate. FIG. 5 illustrates a configuration in which the back gate of the transistor 105 is electrically connected to its gate (front gate). Note that the back gate of the transistor 105 may be electrically connected to one of a source and a drain thereof. The transistor 105 may have a structure without a back gate.

Example 4 of Pixel Configuration

Figure 6:
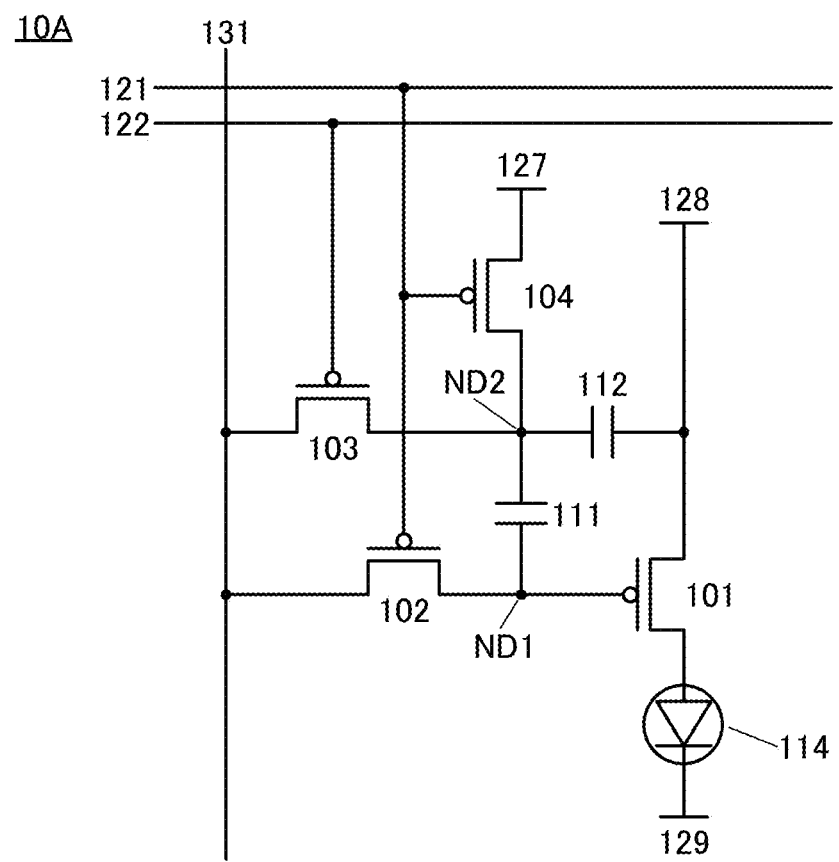
FIG. 6 is a circuit diagram illustrating an example of a pixel configuration.

FIG. 6 illustrates a configuration different from that of the pixel 10 illustrated in FIG. 1.

In the pixel 10A illustrated in FIG. 6, p-channel transistors are used as the transistor 101, the transistor 102, the transistor 103, and the transistor 104. For the connection relation between the light-emitting device 114, the transistors, the capacitors, and the wirings, the description of the pixel 10 illustrated in FIG. 1 can be referred to, and thus detailed description is omitted.

Example 2 of Pixel Operation

Figure 7:
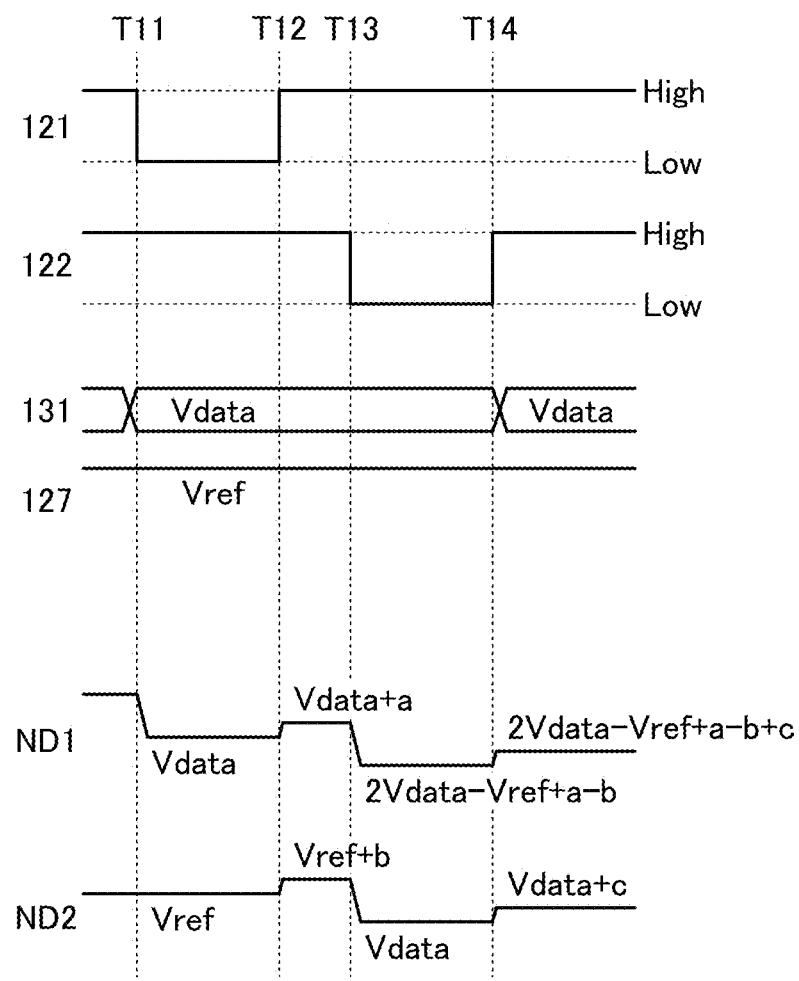
FIG. 7 is a timing chart showing an operation of a pixel circuit.

An example of the boosting operation of the pixel 10A illustrated in FIG. 6 will be described with reference to a timing chart shown in FIG. 7. "Vref" can be a high potential. "Vref" can be the same as the potential "Vano" of the wiring 128, for example.

First, an operation of writing image data "Vdata" to the node ND1 as first data is described. Note that in potential distribution, potential coupling, or potential loss, detailed changes due to a circuit configuration, operation timing, or the like are not considered here.

At time T11, the potential of the wiring 121 is set to "Low", the potential of the wiring 122 is set to "High", the potential of the wiring 131 is set to "Vdata", and the potential of the wiring 127 is set to "Vref", so that the transistor 102 and the transistor 104 are turned on, and the potential "Vdata" of the wiring 131 is written to the node ND1 and the potential "Vref" of the wiring 127 is written to the node ND2.

The potential difference V1 between both terminals of the capacitor 111 at this time can be expressed in Formula (11). The potential difference V2 between both terminals of the capacitor 112 can be expressed in Formula (12).

$$V1 = Vref - Vdata \tag{11}$$

$$V2 = Vref - Vano \tag{12}$$

At time T12, the potential of the wiring 121 is set to "High" and the potential of the wiring 122 is set "High", so that the transistor 102 and the transistor 104 are turned off.

At this time, the potential $V_{ND1}$ of the node ND1 can be expressed in Formula (13). The potential $V_{ND2}$ of the node ND2 can be expressed in Formula (14).

$$V_{ND1} = Vdata + a \tag{13}$$

$$V_{ND2} = Vref + b \tag{14}$$

At this time, the potential difference V1 between both terminals of the capacitor 111 can be expressed in Formula (15). The potential difference V2 between both terminals of the capacitor 112 can be expressed in Formula (16).

$$V1 = (Vref + b) - (Vdata + a) \tag{15}$$

$$V2 = (Vref + b) - Vano \tag{16}$$

Next, an operation in which the image data "Vdata" is written to the node ND2 as the second data and the potential of the node ND1 is boosted is described.

At time T13, the potential of the wiring 121 is set to "High", the potential of the wiring 122 is set to "Low", whereby the transistor 103 is turned on, and the potential "Vdata" of the wiring 131 is written to the node ND2.

At this time, as the potential difference between both terminals of the capacitor 111, the potential difference V1 expressed in Formula (15) is held; thus, the potential $V_{ND1}$ of the node ND1 can be expressed in Formula (17). The potential $V_{ND2}$ of the node ND2 can be expressed in Formula (18).

$$V_{ND1} = 2Vdata - Vref + a - b \tag{17}$$

$$V_{ND2} = Vdata \tag{18}$$

At Time T14, the potential of the wiring 121 is set to "High" and the potential of the wiring 122 is set to "High" to turn off the transistor 103 and a voltage Vgs between the gate and source of the transistor 101 becomes the sum of voltages held in the capacitor 111 and the capacitor 112, and current corresponding to Vgs flows through the light-emitting device 114.

In this case, the potential $V_{ND1}$ of the node ND1 can be expressed in Formula (19). The potential $V_{ND2}$ of the node ND2 can be expressed in Formula (20).

$$V_{ND1} = 2Vdata - Vref + a - b + c \tag{19}$$

$$V_{ND2} = Vdata + c \tag{20}$$

As described above, the voltage can be boosted to a voltage higher than the voltage (Vdata) corresponding to the image data supplied to the pixel 10A and the boosted voltage can be supplied to the transistor 101 serving as a driving transistor. Accordingly, the amount of current flowing to the light-emitting device 114 can be increased, and thus the display device can have high luminance.

Example of Pixel Layout

A layout example of the pixel 10 is described below.

Figure 8A:
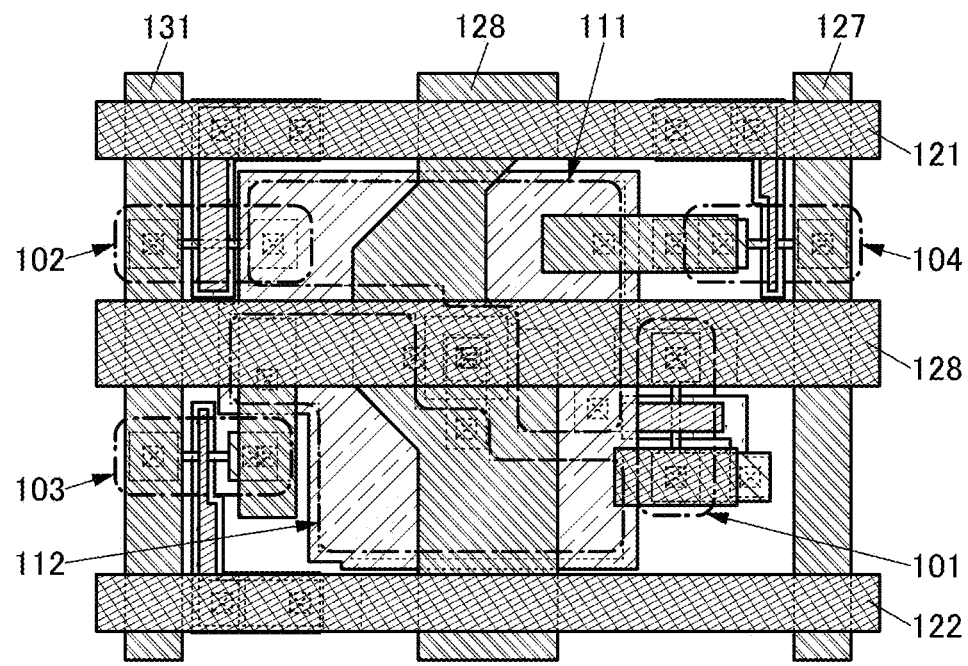
FIG. 8A and FIG. 8B are diagrams illustrating an example of a pixel layout.

FIG. 8A illustrates an example of a layout of the pixel 10 illustrated in FIG. 3A.

Figure 8B:
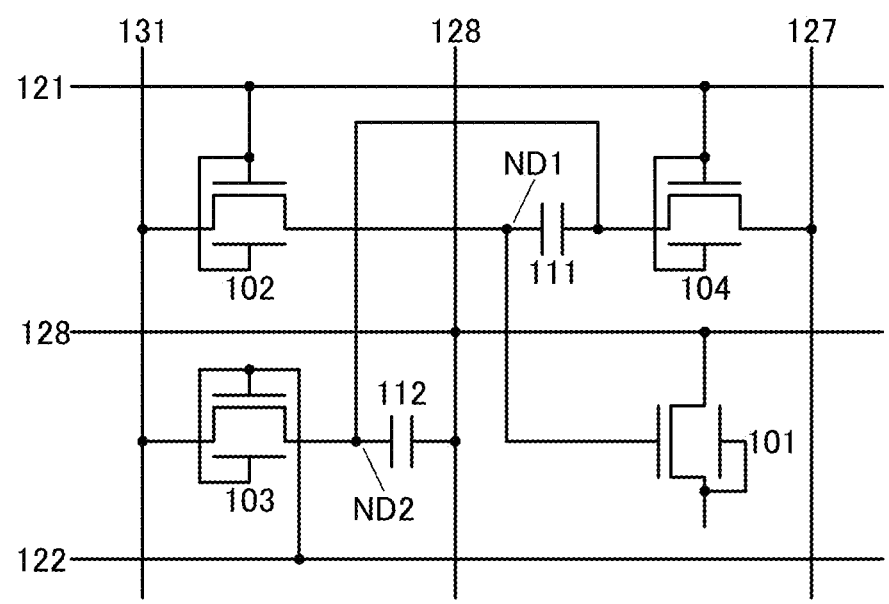

FIG. 8A illustrates the transistor 101, the transistor 102, the transistor 103, the transistor 104, the capacitor 111, the capacitor 112, the wiring 121, the wiring 122, the wiring 131, the wiring 127, and the wiring 128. FIG. 8B is a circuit diagram corresponding to the layout illustrated in FIG. 8A.

Note that the light-emitting device 114 and the wiring 129 are not illustrated in FIG. 8A and FIG. 8B for clarity of the drawings.

Figure 9:
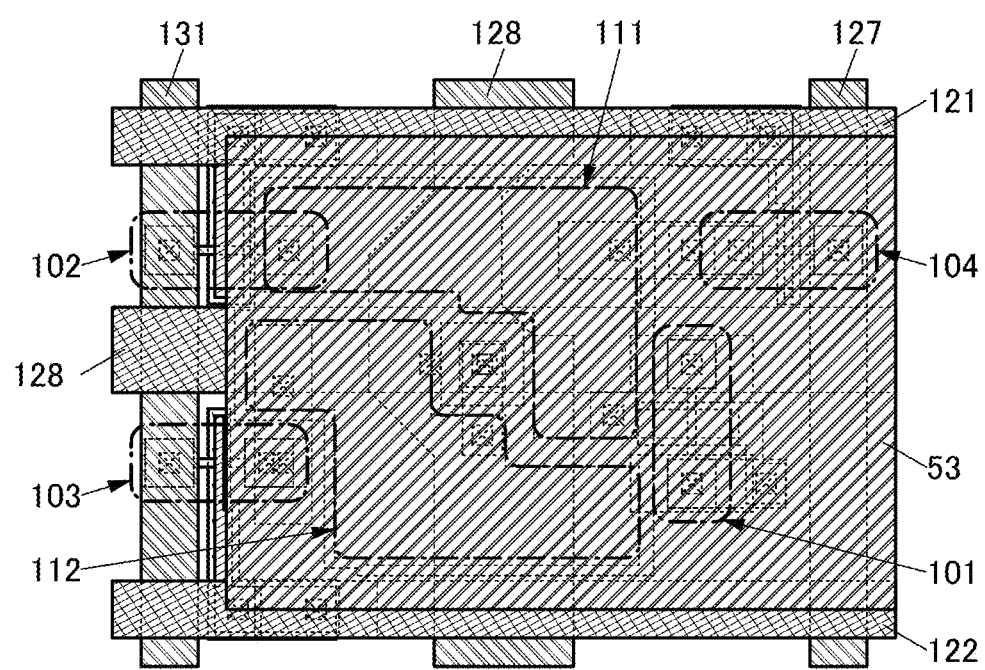
FIG. 9 illustrates an example of a pixel layout.

FIG. 9 illustrates a structure in which a pixel electrode 53 is provided in addition to the structure of FIG. 8A. The pixel electrode 53 is electrically connected to the light-emitting device 114. The light-emitting device 114 can be provided over the pixel electrode 53.

In FIG. 9, the pixel electrode 53 is provided to overlap with elements included in the pixel 10, such as the transistor 101 and the capacitor 111, or part of wirings. Such a structure is effective particularly when a top-emission light-emitting element device is used. When the transistor 101 and the like are provided below the pixel electrode 53 in this manner, the aperture ratio can be high even if the area occupied of the pixel 10 is reduced.

As illustrated in FIG. 9, preferably, the pixel electrode 53 does not overlap with the wiring 131 functioning as a signal line. When the pixel electrode 53 and the wiring 131 do not overlap with each other, a change in the potential of the wiring 131 can be prevented from affecting the potential of the pixel electrode 53. Note that in the case where the pixel electrode 53 needs to overlap with the wiring 131, the percentage of their overlapping area to the area of the pixel electrode 53 is 10% or less, preferably 5% or less.

Example of Subpixel Configuration

Figure 10:
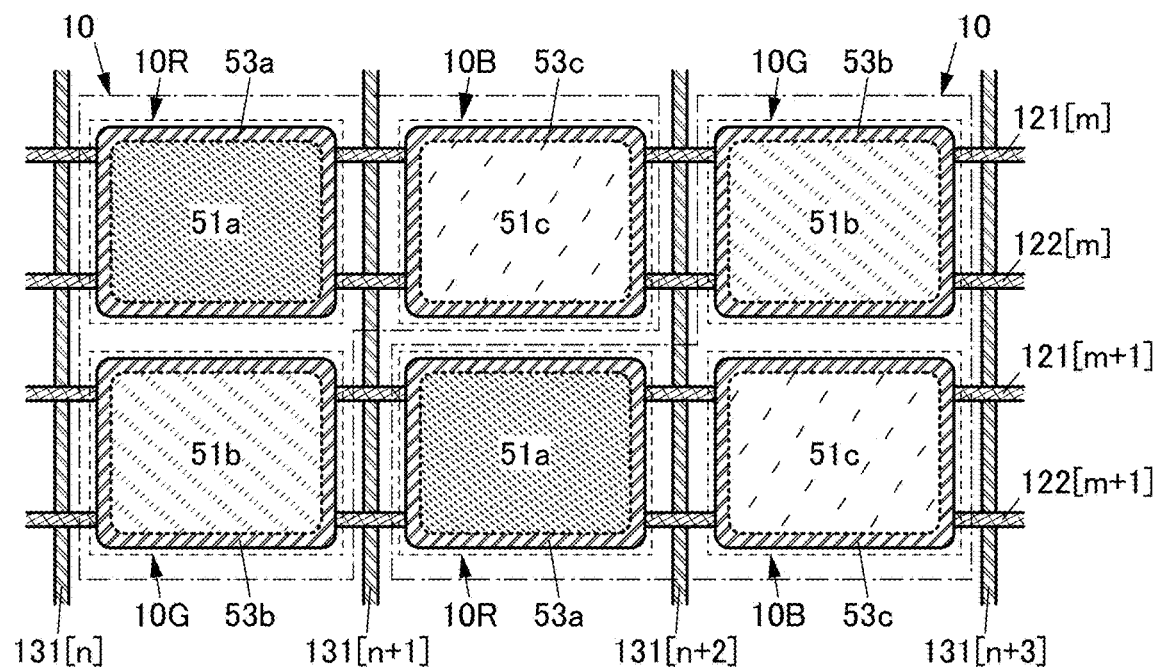
FIG. 10 is a schematic diagram illustrating an example of a pixel configuration.
Figure 11A:
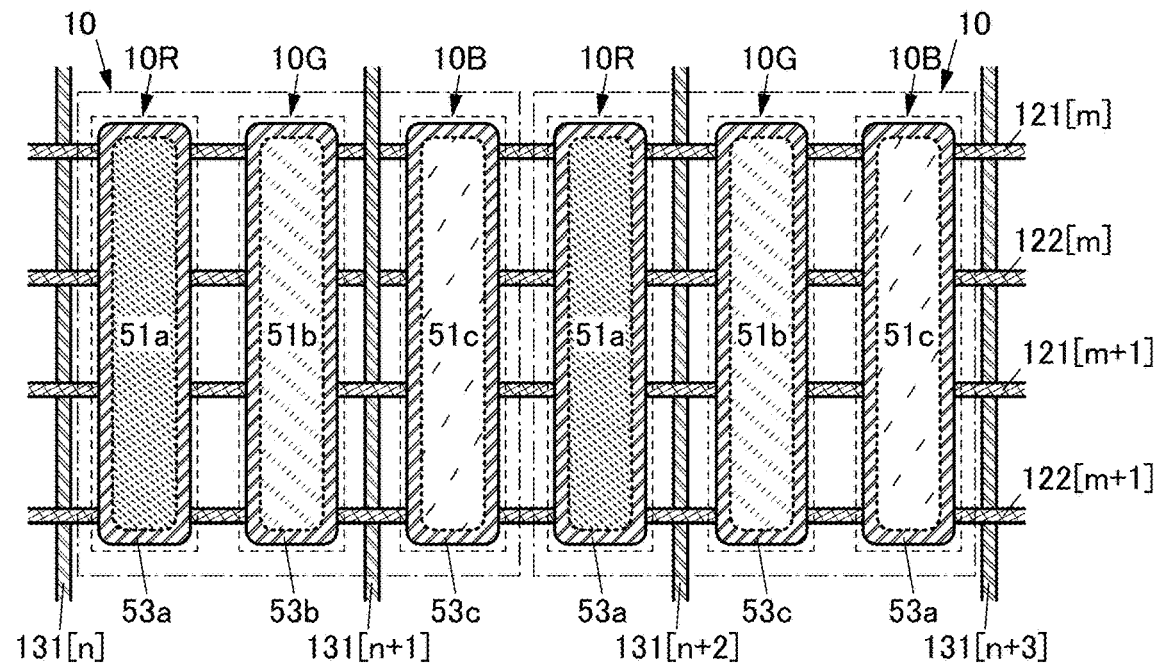
FIG. 11A and FIG. 11B are each schematic diagrams illustrating an example of a pixel configuration.
Figure 11B:
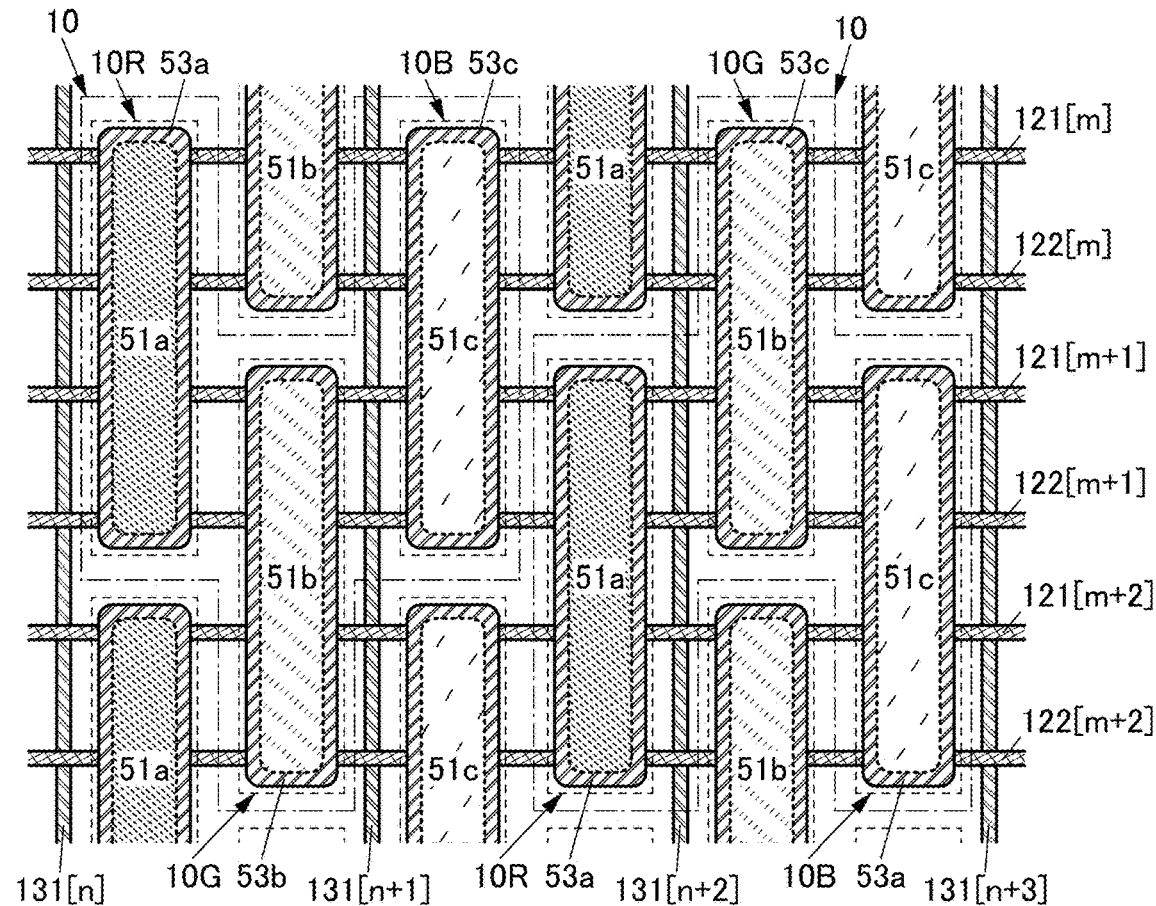

FIG. 10, FIG. 11A, and FIG. 11B each illustrate a configuration example of a subpixel applicable to the display device of one embodiment of the present invention.

In the illustrated example, the pixel 10 illustrated in FIG. 10 includes a subpixel 10R emitting red light, a subpixel 10G emitting green light, and a subpixel 10B emitting blue light, and the three subpixels constitute one pixel 10. FIG. 10 illustrates subpixels arranged in a matrix of two rows and three columns (two pixels 10), the wiring 121, the wiring 122, and the wiring 131. The wiring 121 and the wiring 122 may each include a region overlapping with the pixel electrode 53.

The subpixel 10R includes a pixel electrode 53a, and a display region 51a in the subpixel 10R is positioned inside the pixel electrode 53a. The subpixel 10G includes a pixel electrode 53b, and a display region 51b of the subpixel 10G is positioned inside the pixel electrode 53b. The subpixel 10B includes a pixel electrode 53c, and a display region 51c of the subpixel 10B is positioned inside the pixel electrode 53c. Note that FIG. 10 illustrates an example where the pixel electrode 53a, the pixel electrode 53b, and the pixel electrode 53c have the same area; however, they may have different areas. In addition, the display region 51a, the display region 51b, and the display region 51c may have different areas.

In the pixels 10 in the example illustrated in FIG. 10, positions of the subpixels of the same color are not aligned in the extending direction of the wiring 121 and the wiring 122. In other words, in the pixel 10, the subpixels of the same color are arranged in a zig-zag manner in the extending direction of the wiring 121 and the wiring 122.

Although the colors of light emitted from the subpixels are three, red (R), green (G), and blue (B) in the example in FIG. 10, the combination of colors and the number of colors are not limited thereto. Four colors, red (R), green (G), blue (B), and white (W), or four colors, red (R), green (G), blue (B), and yellow (Y) may be possible for the combination of light emitted from the subpixels. Note that color elements used for the subpixels are not limited to the above, and may be combined with cyan (C), magenta (M), or the like.

The pixel 10 in FIG. 11A has a rectangular shape where subpixels have long sides in the extending direction of the wiring 131 and are arranged in stripe in the extending direction of the wiring 121 and the wiring 122. In addition, an example in which the subpixel 10R, the subpixel 10G, and the subpixel 10B are aligned in the extending direction of the wiring 121 and the wiring 122 is illustrated.

In the example of the pixels 10 in FIG. 11B, subpixels are arranged in stripe and positions of the subpixels of the same color are not aligned in the extending direction of the wiring 121 and the wiring 122. In other words, in the pixel 10, subpixels of the same color are arranged in a zig-zag manner in the extending direction of the wiring 121 and the wiring 122.

In this specification and the like, a blue wavelength range is greater than or equal to 400 nm and less than 490 nm, and blue light has at least one emission spectrum peak in the wavelength range. A green wavelength range of green is greater than or equal to 490 nm and less than 580 nm, and green light has at least one emission spectrum peak in the wavelength range. A red wavelength range is greater than or equal to 580 nm and less than or equal to 680 nm, and red light has at least one emission spectrum peak in that wavelength range.

Structure Example 1 of Display Device

A display device of one embodiment of the present invention will be described below in detail.

Figure 12:
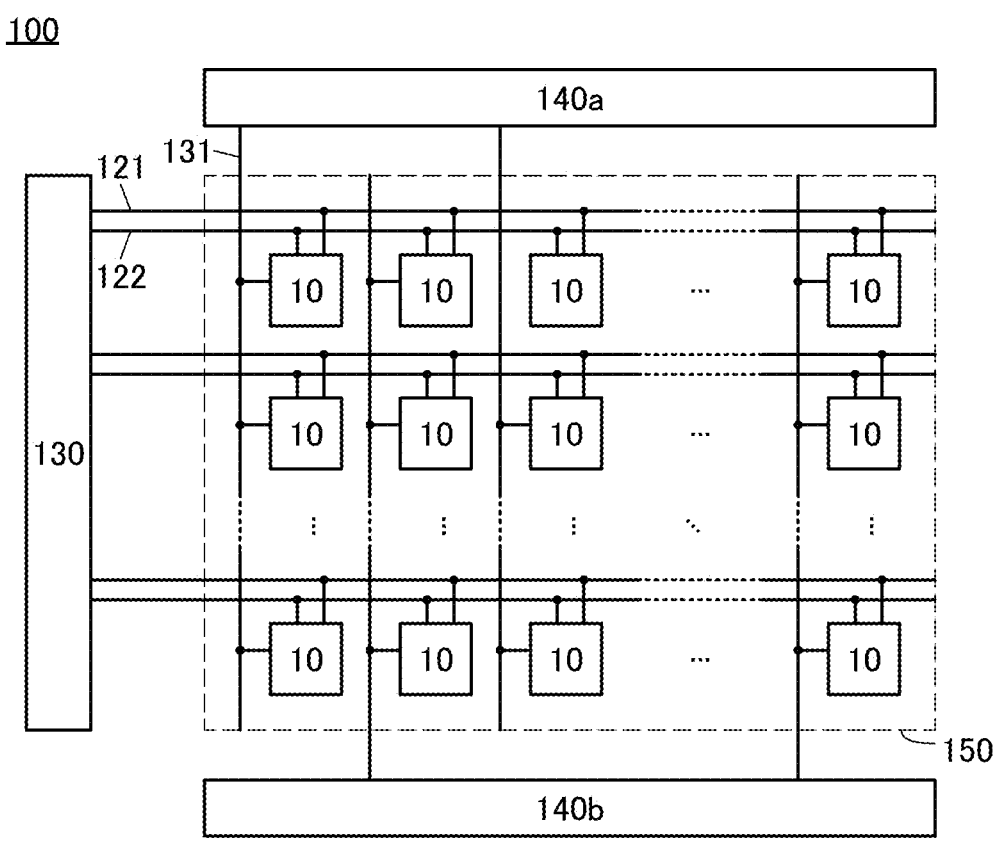
FIG. 12 is a block diagram illustrating a structure example of a display device.

FIG. 12 is a block diagram illustrating a structure example of the display device 100. The display device 100 includes a pixel portion 150 including a plurality of pixels 10, a driver circuit portion 130, a driver circuit portion 140a, a driver circuit portion 140b, the wiring 121, the wiring 122, and the wiring 131.

The pixel portion 150 includes the plurality of pixels 10, and the pixels 10 can be arranged in a matrix. The driver circuit portion 130 is electrically connected to the pixels 10 through the wiring 121. The driver circuit portion 130 is electrically connected to the pixels 10 through the wiring 122. The driver circuit portion 130 functions as a gate line driver circuit (also referred to as a gate driver). The plurality of pixels 10 are each supplied with signals from the driver circuit portion 130 through the wiring 121 and the wiring 122, and the driving thereof is controlled. The driver circuit portion 140a is electrically connected to the pixels 10 through the wiring 131. The driver circuit portion 140b is electrically connected to the pixels 10 which are different from the pixels 10 electrically connected to the driver circuit portion 140a, through the wiring 131. The driver circuit portion 140a and the driver circuit portion 140b each function as a source line driver circuit (also referred to as a source driver). The plurality of pixels 10 are each supplied with signals from the driver circuit portion 140a or the driver circuit portion 140b through the wiring 131, and the driving thereof is controlled. FIG. 12 illustrates an example where the pixels 10 in odd-numbered columns are electrically connected to the driver circuit portion 140a, and the pixels 10 in even-numbered columns are electrically connected to the driver circuit portion 140b.

The display device that is one embodiment of the present invention can operate at high speed by having a plurality of driver circuit portions serving as source drivers, even when having a large number of pixels. The display device that is one embodiment of the present invention can be favorably used as a high-resolution display device with, for example, 1000 ppi or higher, 2000 ppi or higher, or 5000 ppi or higher.

Although FIG. 12 illustrates the example in which two driver circuit portions, the driver circuit portion 140*a* and the driver circuit portion 140*b*, are provided as the driver circuit portions serving as source drivers, one embodiment of the present invention is not limited to the example. Three or more driver circuit portions serving as source drivers may be provided. In addition, one driver circuit portion serving as a source driver may be provided.

Figure 13A:
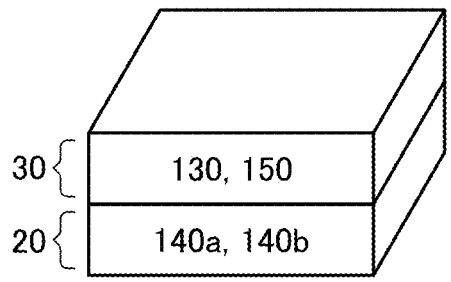
FIG. 13A is a schematic diagram illustrating a structure example of a display device.

FIG. 13A is a schematic view illustrating a structure example of the display device 100. The display device 100 has a stacked-layer structure of a first layer 20 and a second layer 30 over the first layer 20. Although FIG. 13A illustrates a structure in which the second layer 30 is provided over the first layer 20, one embodiment of the present invention is not limited to the structure. The first layer 20 may be provided over the second layer 30. One or more of an interlayer insulating layer and a wiring layer may be provided between the first layer 20 and the second layer 30. Each of the interlayer insulating layer and the wiring layer provided between the first layer 20 and the second layer 30 may have a plurality of layers.

The first layer 20 includes the driver circuit portion 140*a* and the driver circuit portion 140*b*. The second layer 30 includes the driver circuit portion 130 and the pixel portion 150.

Figure 13B:
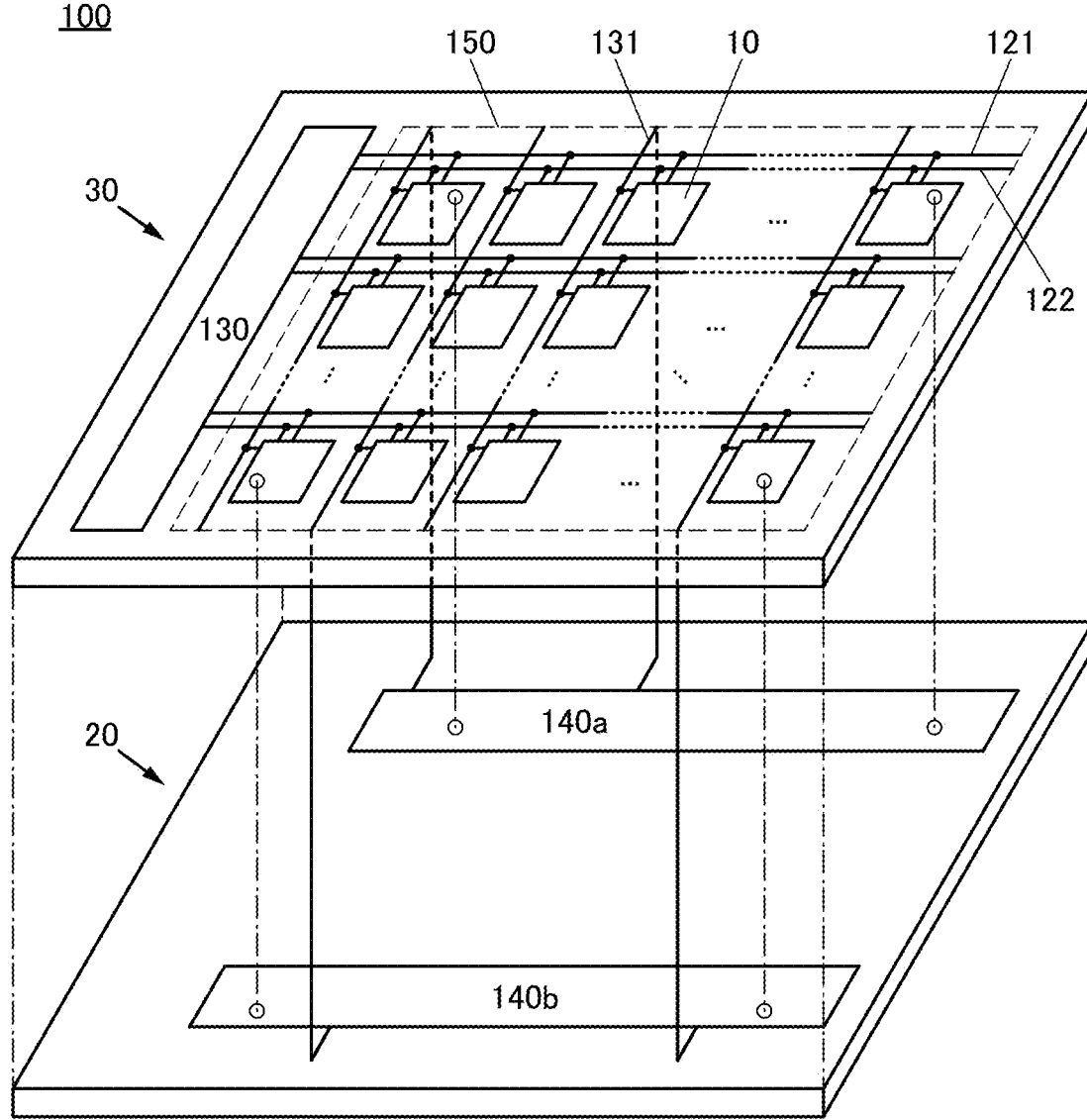
FIG. 13B is a block diagram illustrating the structure example of the display device.

FIG. 13B illustrates a structure example of the first layer 20 and the second layer 30 illustrated in FIG. 13A. In FIG. 13B, the positional relation between the first layer 20 and the second layer 30 is denoted by hollow circles and dashed-dotted lines and the hollow circles in the first layer 20 and the hollow circles in the second layer 30, which are connected with the dashed-dotted lines, overlap with each other in a planar view. Note that the same representation is used in other diagrams. Note that in FIG. 13B, wirings other than the wiring 121, the wiring 122, and the wiring 131 are omitted for clarity of the drawing.

In the display device 100, each of the driver circuit portion 140*a* and the driver circuit portion 140*b* provided in the first layer 20 preferably has a region overlapping with the pixel portion 150. The pixel portion 150 is stacked to be overlapped with the driver circuit portion 140*a* and the driver circuit portion 140*b*, which enables reduction of the area of a bezel where the pixel portion 150 is not provided. Thus, the bezel of the display device 100 can be narrowed. In addition, the bezel of the display device 100 is narrowed, so that the display device 100 can be downsized.

Although FIG. 13B illustrates an example in which the first layer 20 and the second layer 30 have substantially the same size, summary of the present invention is not limited to this. The size of the first layer 20 may be different from that of the second layer 30. For example, the first layer 20 may be larger than the second layer 30. Alternatively, the first layer 20 may be smaller than the second layer 30.

The second layer 30 is formed over the first layer 20 after the first layer 20 is formed, whereby the display device 100 can be manufactured. The second layer 30 is formed over the first layer 20, whereby the alignment accuracy of the first layer 20 and the second layer 30 can be improved. Thus, the productivity of the display device 100 can be improved.

The first layer 20 and the second layer 30 may each be formed and then bonded to each other, whereby the display device 100 is manufactured. In the case where the display device 100 is formed in such a manner that the first layer 20 and the second layer 30 are bonded to each other, the first layer 20 and the second layer 30 may have different sizes.

Thus, the first layer 20 and the second layer 30 can be formed without being influenced by each other's size. For example, the display device 100 can be manufactured in such a manner that the plurality of first layers 20 are formed over the substrate over which the first layers 20 are to be formed, and then are separated into individual first layers 20, and then the first layers 20 are bonded to the second layers 30. Also for the second layer 30, the display device 100 may be manufactured in such a manner that the plurality of second layers 30 are formed over the substrate over which the second layers 30 are to be formed, and then are separated into individual second layers 30, and then the second layers 30 are bonded to the first layers 20. In other words, the productivity of the display device 100 can be increased, along with the improvement in the productivities of the first layer 20 and the second layer 30.

Structure Example 2 of Display Device

Figure 14A:
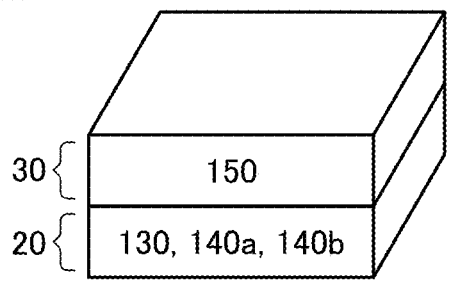
FIG. 14A is a schematic diagram illustrating a structure example of a display device.
Figure 14B:
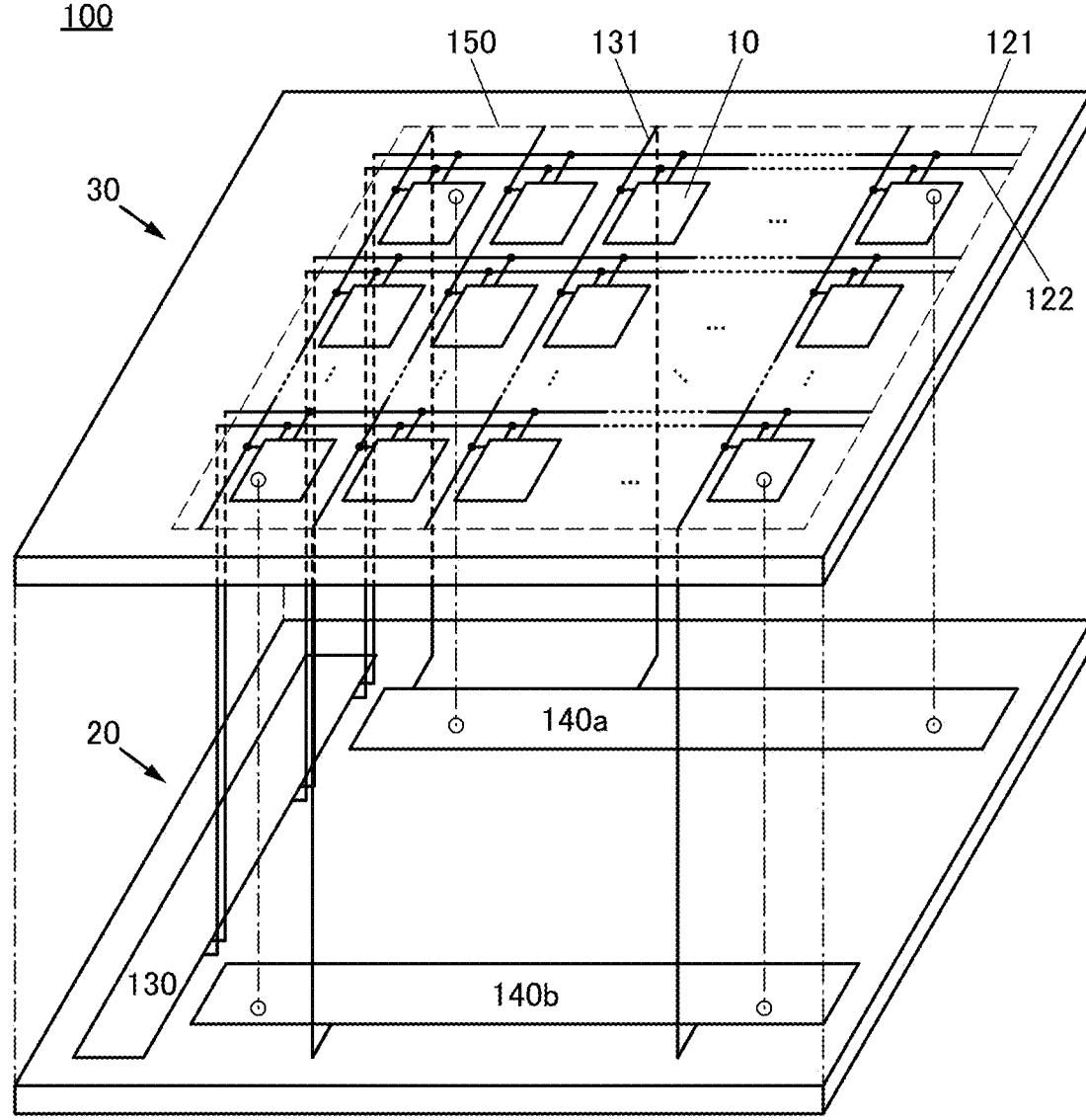
FIG. 14B is a block diagram illustrating the structure example of the display device.

FIG. 14A and FIG. 14B illustrate a structure example different from that of the display device 100 illustrated in FIG. 13A and FIG. 13B. The display device 100 in FIG. 14A and FIG. 14B differs from the display device 100 in FIG. 13A and FIG. 13B mainly in that the first layer 20 includes the driver circuit portion 130. When the driver circuit portion 130 is provided in the first layer 20 in which the driver circuit portion 140*a* and the driver circuit portion 140*b* are provided, manufacturing steps of the driver circuit portion 130, the driver circuit portion 140*a*, and the driver circuit portion 140*b* can be common, whereby the productivity can be increased.

Although FIG. 14B illustrates the example in which the pixel portion 150 does not have a region overlapping with the driver circuit portion 130, one embodiment of the present invention is not limited to this example. The pixel portion 150 may include a region overlapping with the driver circuit portion 130. The pixel portion 150 may include a region overlapping with each of the driver circuit portion 130, the driver circuit portion 140*a*, and the driver circuit portion 140*b*. Such a structure enables the narrow bezel of the display device 100. In addition, the bezel of the display device 100 is narrowed, so that the display device 100 can be downsized.

Cross-Sectional Structure Example 1 of Display Device

Figure 15:
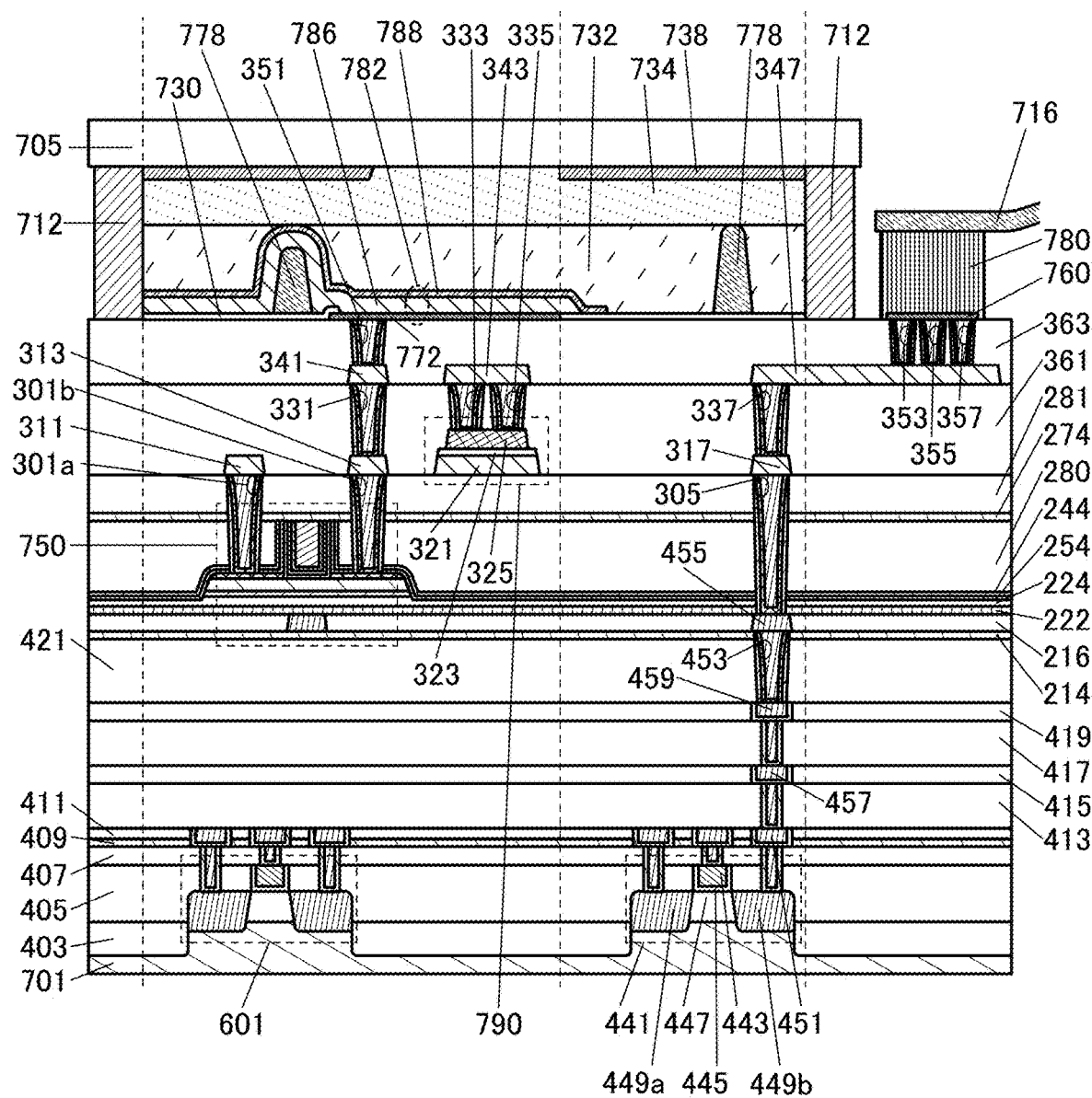
FIG. 15 is a cross-sectional view illustrating a structure example of a display device.

FIG. 15 is a cross-sectional view illustrating a structure example of the display device 100. The display device 100 includes a substrate 701 and a substrate 705. The substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 and the transistor 601 can be transistors provided in the first layer 20. For example, in the display devices 100 illustrated in FIG. 13A and FIG. 13B, the transistor 441 and the transistor 601 can be transistors provided in the driver circuit portion 140*a* or the driver circuit portion 140*b*. For example, in the display devices 100 illustrated in FIG. 14A and FIG. 14B, the transistor 441 and the transistor 601 can be transistors provided in the driver circuit portion 130, the driver circuit portion 140a or the driver circuit portion 140b.

The transistor 441 is formed of a conductor 443 functioning as a gate electrode, an insulator 445 functioning as a gate insulator, and part of the substrate 701 and includes a semiconductor region 447 including a channel formation region, a low-resistance region 449a functioning as one of a source region and a drain region, and a low-resistance region 449b functioning as the other of the source region and the drain region. The transistor 441 can be either a p-channel transistor or an n-channel transistor.

The transistor 441 is electrically isolated from other transistors by an element isolation layer 403. FIG. 15 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 15, the semiconductor region 447 has a projecting shape. Moreover, the conductor 443 is provided to cover the side surface and the top surface of the semiconductor region 447 with the insulator 445 therebetween. Note that FIG. 15 does not illustrate the state where the conductor 443 covers the side surface of the semiconductor region 447. A material that adjusts the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with the top surface of the projecting portion. Although FIG. 15 illustrates the structure in which the projecting portion is formed by processing part of the substrate 701, a semiconductor having a projecting shape may be formed by processing an SOI substrate.

Note that the structure of the transistor 441 illustrated in FIG. 15 is an example; the structure of the transistor 441 is not limited thereto and can be changed as appropriate in accordance with the circuit configuration, an operation method for the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 701, in addition to the element isolation layer 403 and the transistor 441 and the transistor 601. A conductor 451 is embedded in the insulator 405, the insulator 407, the insulator 409, and the insulator 411. Here, the top surface of the conductor 451 and the top surface of the insulator 411 can be substantially level with each other.

An insulator 413 and an insulator 415 are provided over the conductor 451 and the insulator 411. A conductor 457 is embedded in the insulator 413 and the insulator 415. Here, the top surface of the conductor 457 and the top surface of the insulator 415 can be substantially level with each other.

An insulator 417 and an insulator 419 are provided over the conductor 457 and the insulator 415. A conductor 459 is embedded in the insulator 417 and the insulator 419. Here, the top surface of the conductor 459 and the top surface of the insulator 419 can be substantially level with each other.

An insulator 421 and an insulator 214 are provided over the conductor 459 and the insulator 419. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 244, an insulator 280, an insulator 274, and an insulator 281 are provided over the conductor 455 and the insulator 216. A conductor 305 is embedded in the insulator 222, the insulator 224, the insulator 254, the insulator 244, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display device 100 from outside of the display device 100 through the FPC 716.

As illustrated in FIG. 15, the low-resistance region 449b having a function of the other of the source region and the drain region of the transistor 441 is electrically connected to the FPC 716 through the conductor 451, the conductor 457, the conductor 459, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 15 illustrates three conductors, which are the conductor 353, the conductor 355, and the conductor 357, as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be a transistor provided in the second layer 30. For example, in the display devices 100 illustrated in FIG. 13A, FIG. 13B, FIG. 14A, and FIG. 14B, the transistor 750 can be a transistor provided in the pixel portion 150. An OS transistor can be suitably used as the transistor 750. The OS transistor has a feature of extremely low off-state current. Consequently, the retention time for an image signal or the like can be increased, so that the frequency of the refresh operation can be reduced. Thus, power consumption of the display device 100 can be reduced.

A conductor 301a and a conductor 301b are embedded in the insulator 254, the insulator 244, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 413, the insulator 415, the insulator 417, the insulator 419, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased evenness.

For example, in the display device 100 illustrated in FIG. 13 and FIG. 14, the capacitor 790 can be the capacitor 111 or the capacitor 112 provided in the pixel portion 150.

As illustrated in FIG. 15, the capacitor 790 includes the lower electrode 321 and the upper electrode 325. The insulator 323 is provided between the lower electrode 321 and the upper electrode 325. In other words, the capacitor 790 has a stacked-layer structure in which the insulator 323 functioning as a dielectric is positioned between the pair of electrodes. Although FIG. 15 illustrates the example in which the capacitor 790 is provided over the insulator 281, the capacitor 790 may be provided over an insulator different from the insulator 281.

In the example illustrated in FIG. 15, the conductor 301a, the conductor 301b, and the conductor 305 are formed in the same layer; the conductor 311, the conductor 313, the conductor 317, and the lower electrode 321 are formed in the same layer; the conductor 331, the conductor 333, the conductor 335, and the conductor 337 are formed in the same layer; the conductor 341, the conductor 343, and the conductor 347 are formed in the same layer; and the conductor 351, the conductor 353, the conductor 355, and the conductor 357 are formed in the same layer. Forming a plurality of conductors in the same layer simplifies the process of manufacturing the display device 100 and thus the manufacturing cost of the display device 100 can be reduced. Note that these conductors may be formed in different layers or may contain different types of materials.

The display device 100 illustrated in FIG. 15 includes a light-emitting device 782. The light-emitting device 782 includes the conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As such a light-transmitting material, for example, an oxide material containing indium, zinc, tin, or the like is preferably used. As such a reflective material, for example, a material containing aluminum, silver, or the like is preferably used.

Although not illustrated in FIG. 15, an optical member (optical substrate) such as a polarizing member, a retardation member, or an anti-reflection member can be provided in the display device 100, for example.

On the substrate 705 side, a light-blocking layer 738 and an insulator 734 that is in contact with them are provided. The light-blocking layer 738 has a function of blocking light emitted from adjacent regions. Alternatively, the light-blocking layer 738 has a function of preventing external light from reaching the transistor 750 or the like.

In the display device 100 illustrated in FIG. 15, an insulator 730 is provided over the insulator 363. Here, the insulator 730 can cover part of the conductor 772. Here, the light-emitting device 782 is a top-emission light-emitting device, which includes the conductor 788 with a light-transmitting property. Note that the light-emitting device 782 may have a bottom-emission structure in which light is emitted to the conductor 772 side or a dual-emission structure in which light is emitted to both the conductor 772 and the conductor 788.

The light-blocking layer 738 is provided to include a region overlapping with the insulator 730. The light-blocking layer 738 is covered with the insulator 734. A space between the light-emitting device 782 and the insulator 734 is filled with a sealing layer 732.

The structured part 778 is provided between the insulator 730 and the EL layer 786. Moreover, the structured part 778 is provided between the insulator 730 and the insulator 734.

Figure 16:
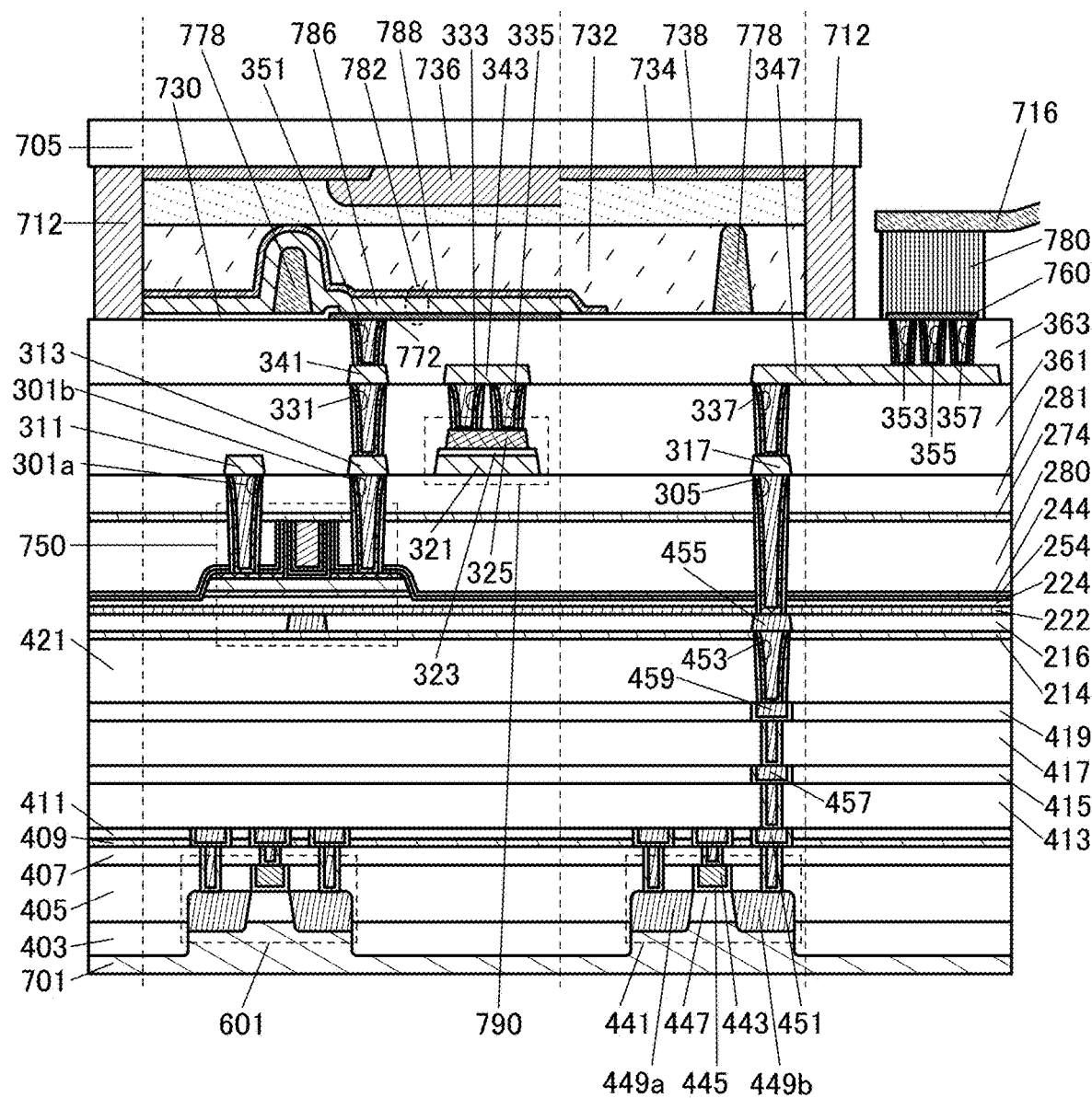
FIG. 16 is a cross-sectional view illustrating a structure example of a display device.

FIG. 16 illustrates a modification example of the display device 100 illustrated in FIG. 15 and the display device 100 illustrated in FIG. 16 differs from the display device 100 illustrated in FIG. 15 in that a coloring layer 736 is provided. Note that the coloring layer 736 is provided to have a region overlapping with the light-emitting device 782. Providing the coloring layer 736 can improve the color purity of light extracted from the light-emitting device 782. Thus, the display device 100 can display high-quality images. Furthermore, all the light-emitting devices 782, for example, in the display device 100 can be light-emitting devices that emit white light; hence, the EL layers 786 are not necessarily formed separately for each color, leading to higher resolution of the display device 100.

The light-emitting device 782 can have a micro optical resonator (microcavity) structure. Thus, light of predetermined colors (e.g., RGB) can be extracted without a coloring layer, and the display device 100 can perform color display. The structure without a coloring layer can prevent light absorption by the coloring layer. As a result, the display device 100 can display high-luminance images, and the power consumption of the display device 100 can be reduced. Note that a structure in which a coloring layer is not provided can be employed even when the EL layer 786 is formed into an island shape for each pixel or into a stripe shape for each pixel column, i.e., the EL layers 786 are formed separately for each color.

Figure 17:
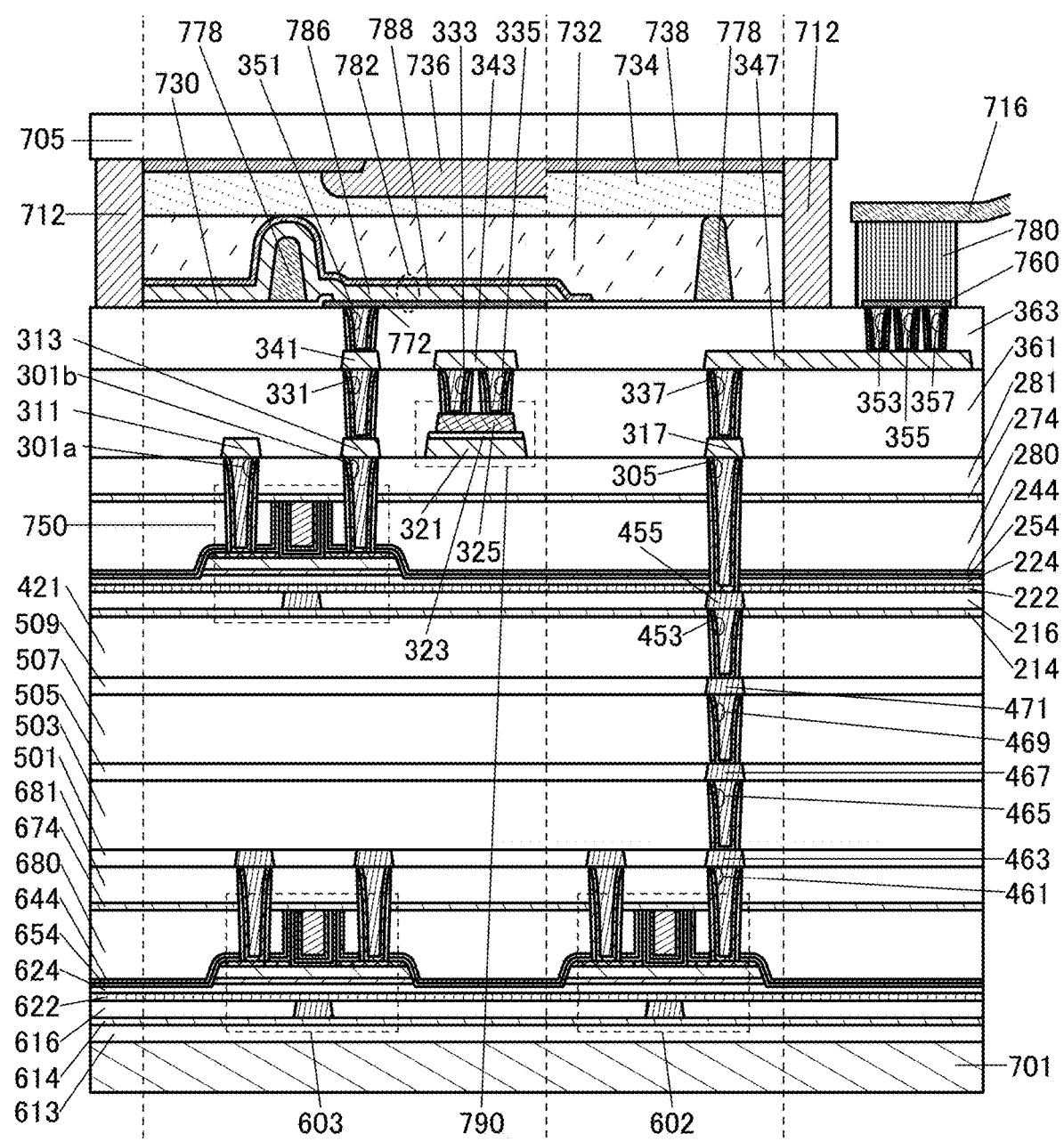
FIG. 17 is a cross-sectional view illustrating a structure example of a display device.

Although FIG. 15 and FIG. 16 each illustrate a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 17 illustrates a modification example of FIG. 16, and the display device 100 illustrated in FIG. 17 is different from the display device 100 illustrated in FIG. 16 mainly in that a transistor 602 and a transistor 603 that are OS transistors are provided in place of the transistor 441 and the transistor 601. As the transistor 750, an OS transistor can be used. That is, the display device 100 illustrated in FIG. 17 includes a stack of OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to those of the transistor 441 and the transistor 601 illustrated in FIG. 16 may be provided between the substrate 701 and the insulator 613.

That is, the transistor 602 and the transistor 603 can be transistors provided in the first layer 20. For example, in the display device 100 illustrated in FIG. 13A and FIG. 13B, the transistor 602 and the transistor 603 can be transistors provided in the driver circuit portion 140a or the driver circuit portion 140b. For example, in the display devices 100 illustrated in FIG. 14A and FIG. 14B, the transistor 602 and the transistor 603 can be transistors provided in the driver circuit portion 130, the driver circuit portion 140a or the driver circuit portion 140b.

The transistor 602 and the transistor 603 can have a structure similar to that of the transistor 750. Note that the transistor 602 and the transistor 603 may be OS transistors having a structure different from that of the transistor 750.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 is embedded in the insulator 654, the insulator 644, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

An insulator 503 is provided over the conductor 463 and the insulator 501. A conductor 465 is embedded in the insulator 503. Here, the top surface of the conductor 465 and the top surface of the insulator 503 can be substantially level with each other.

An insulator 505 is provided over the conductor 465 and the insulator 503. A conductor 467 is embedded in the insulator 505. Here, the top surface of the conductor 467 and the top surface of the insulator 505 can be substantially level with each other.

An insulator 507 is provided over the conductor 467 and the insulator 505. A conductor 469 is embedded in the insulator 507. Here, the top surface of the conductor 469 and the top surface of the insulator 507 can be substantially level with each other.

An insulator 509 is provided over the conductor 469 and the insulator 507. A conductor 471 is embedded in the insulator 509. Here, the top surface of the conductor 471 and the top surface of the insulator 509 can be substantially level with each other.

The insulator 421 and the insulator 214 are provided over the conductor 471 and the insulator 509. A conductor 453 is embedded in the insulator 421 and the insulator 214. Here, the top surface of the conductor 453 and the top surface of the insulator 214 can be substantially level with each other.

As illustrated in FIG. 17, one of a source and a drain of the transistor 602 is electrically connected to the FPC 716 through the conductor 461, the conductor 463, the conductor 465, the conductor 467, the conductor 469, the conductor 471, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, the insulator 501, the insulator 503, the insulator 505, the insulator 507, and the insulator 509 have a function of an interlayer film and may also have a function of a planarization film that covers unevenness thereunder.

When the display device 100 has the structure illustrated in FIG. 17, all the transistors in the display device 100 can be OS transistors while the bezel and size of the display device 100 are reduced. Accordingly, the transistors provided in the first layer 20 and the transistors provided in the second layer 30 can be manufactured using the same apparatus, for example. Consequently, the manufacturing cost of the display device 100 can be reduced, making the display device 100 inexpensive.

Cross-Sectional Structure Example 2 of Display Device

Figure 18:
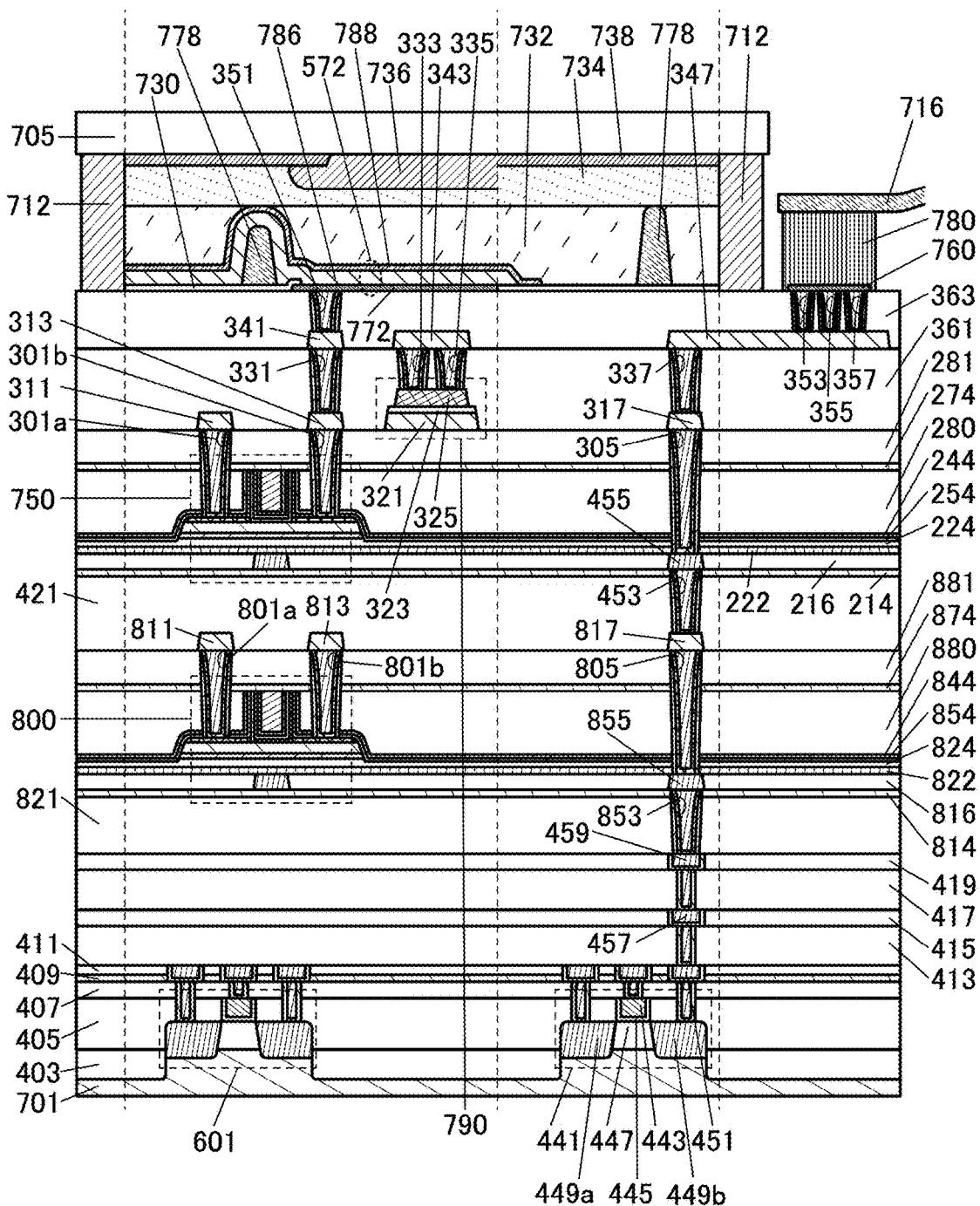
FIG. 18 is a cross-sectional view illustrating a structure example of a display device.

FIG. 18 is a cross-sectional view illustrating a structure example of the display device 100. The display device 100 in FIG. 18 is different from the display device 100 in FIG. 16 mainly in that a layer including a transistor 800 is interposed between the layer including the transistor 750 and the layer including the transistor 601 and the transistor 441.

The first layer 20 illustrated in FIG. 13A and the like can have a stacked structure of a first circuit layer and a second circuit layer over the first circuit layer. For example, the transistor 601 and the transistor 441 can be transistors provided in the first circuit layer. The transistor 800 can be a transistor provided in the second circuit layer. The transistor 750 can be a transistor provided in the second layer 30.

An insulator 821 and an insulator 814 are provided over the conductor 459 and the insulator 419. A conductor 853 is embedded in the insulator 821 and the insulator 814. Here, the top surface of the conductor 853 and the top surface of the insulator 814 can be substantially level with each other.

An insulator 816 is provided over the conductor 853 and the insulator 814. A conductor 855 is embedded in the insulator 816. Here, the top surface of the conductor 855 and the top surface of the insulator 816 can be substantially level with each other.

An insulator 822, an insulator 824, an insulator 854, an insulator 844, an insulator 880, an insulator 874, and an insulator 881 are provided over the conductor 855 and the insulator 816. A conductor 805 is embedded in the insulator 822, the insulator 824, the insulator 854, the insulator 844, the insulator 880, the insulator 874, and the insulator 881. Here, the top surface of the conductor 805 and the top surface of the insulator 881 can be substantially level with each other.

The insulator 421 and the insulator 214 are provided over the conductor 817 and the insulator 881.

As illustrated in FIG. 18, the low-resistance region 449b functioning as the other of the source region and the drain region of the transistor 441 is electrically connected to the FPC 716 through the conductor 451, the conductor 457, the conductor 459, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

The transistor 800 is provided over the insulator 814. The transistor 800 can be a transistor provided in the second layer 30. For example, in the display device 100 illustrated in FIG. 13A and FIG. 13B, the transistor 800 can be a transistor provided in the driver circuit portion 140a or the driver circuit portion 140b. For example, in the display devices 100 illustrated in FIG. 14A and FIG. 14B, the transistor 800 can be a transistor provided in the driver circuit portion 130, the driver circuit portion 140a or the driver circuit portion 140b. The transistor 800 is preferably an OS transistor.

A conductor 801a and a conductor 801b are embedded in the insulator 854, the insulator 844, the insulator 880, the insulator 874, and the insulator 881. The conductor 801a is electrically connected to one of a source and a drain of the transistor 800, and the conductor 801b is electrically connected to the other of the source and the drain of the transistor 800. Here, the top surfaces of the conductor 801a and the conductor 801b and the top surface of the insulator 881 can be substantially level with each other.

The transistor 750 can be a transistor provided in the second layer 30. For example, in each of the display devices 100 illustrated in FIG. 13A, FIG. 13B, FIG. 14A and FIG. 14B, the transistor 750 can be provided in the pixel portion 150. The transistor 750 is preferably an OS transistor.

Note that an OS transistor or the like may be provided between the layer where the transistor 441, the transistor 601, and the like are provided and the layer where the transistor 800 and the like are provided. In addition, an OS transistor or the like may be provided between the layer where the transistor 800 and the like are provided and the layer where the transistor 750 and the like are provided. Furthermore, an OS transistor or the like may be provided above the layer where the transistor 750 and the like are provided.

The insulator 405, the insulator 407, the insulator 409, the insulator 411, the insulator 413, the insulator 415, the insulator 417, the insulator 419, the insulator 821, the insulator 814, the insulator 880, the insulator 874, the insulator 881, the insulator 421, the insulator 214, the insulator 280, the insulator 274, the insulator 281, the insulator 361, and the insulator 363 function as an interlayer films and may also function as a planarization film that covers unevenness thereunder.

In the example in FIG. 18, the conductor 801a, the conductor 801b, and the conductor 805 are formed in the same layer. The conductor 811, the conductor 813, and the conductor 817 are formed in the same layer.

Figure 19:
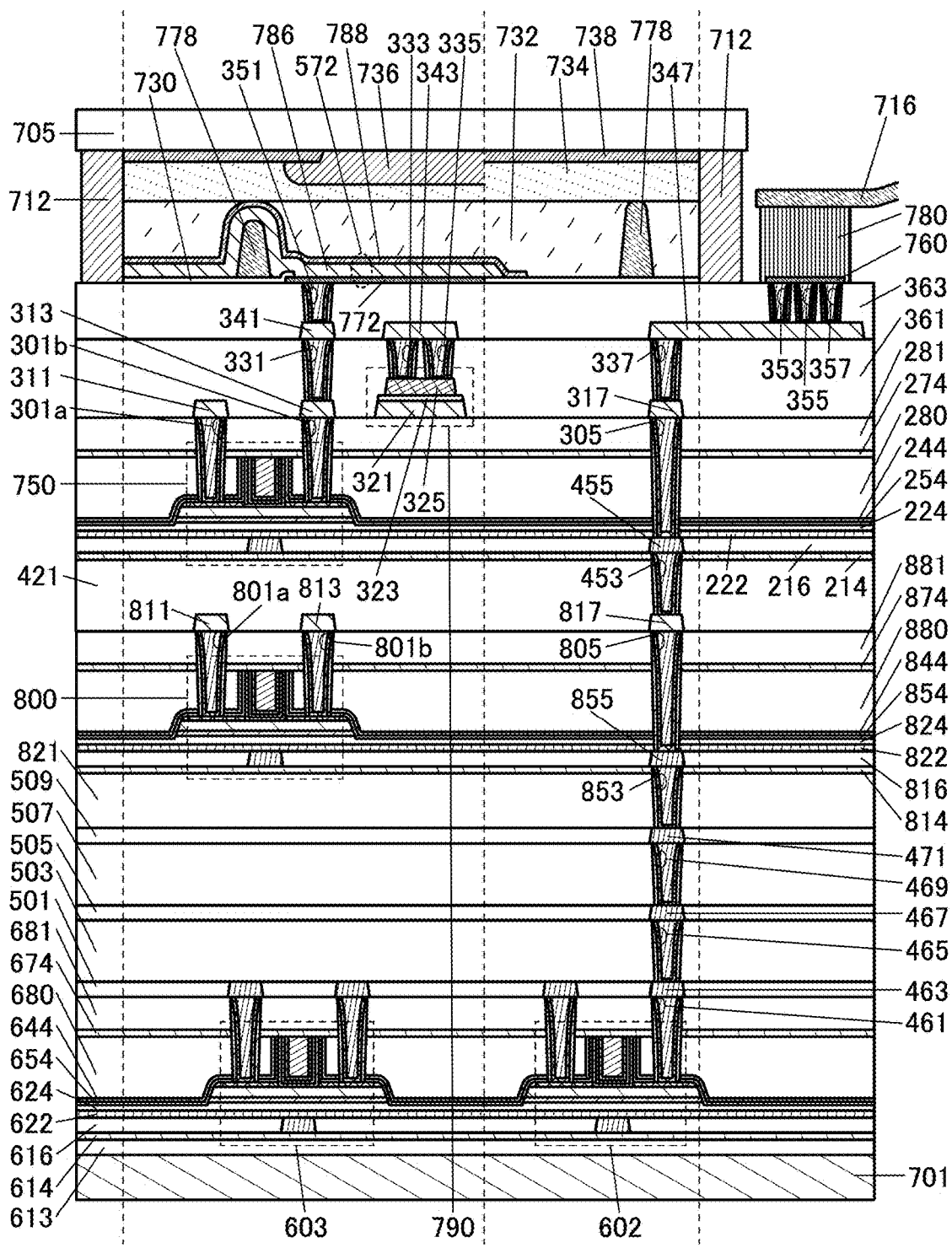
FIG. 19 is a cross-sectional view illustrating a structure example of a display device.

Although FIG. 18 illustrates a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 19 illustrates a modification example of FIG. 18, and the display device 100 illustrated in FIG. 19 is different from the display device 100 illustrated in FIG. 18 mainly in that the transistor 602 and the transistor 603 that are OS transistors are provided in place of the transistor 441 and the transistor 601. That is, the display device 100 illustrated in FIG. 19 includes a stack of three-layers of OS transistors.

An OS transistor or the like may be provided between the layer where the transistor 602, the transistor 603, and the like are provided and the layer where the transistor 800 and the like are provided. In addition, an OS transistor or the like may be provided between the layer where the transistor 800 and the like are provided and the layer where the transistor 750 or the transistor 750 and the like are provided. Furthermore, an OS transistor or the like may be provided above the layer where the transistor 750 and the like are provided.

For example, the transistor 602 and the transistor 603 can be transistors provided in the first circuit layer. The transistor 800 can be a transistor provided in the second circuit layer. The transistor 750 can be a transistor provided in the second layer 30.

The insulator 821 and the insulator 814 are provided over the conductor 471 and the insulator 509. A conductor 853 is embedded in the insulator 821 and the insulator 814. Here, the top surface of the conductor 853 and the top surface of the insulator 814 can be substantially level with each other.

As illustrated in FIG. 19, one of a source and a drain of the transistor 602 is electrically connected to the FPC 716 through the conductor 461, the conductor 463, the conductor 465, the conductor 467, the conductor 469, the conductor 471, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

When the display device 100 has the structure illustrated in FIG. 19, all the transistors in the display device 100 can be OS transistors while the bezel and size of the display device 100 are reduced. Consequently, different types of transistors do not need to be manufactured, whereby the manufacturing cost of the semiconductor device 100 can be reduced and thus the semiconductor device 100 can be inexpensive.

Structure Example of Light-Emitting Device

As the light-emitting device 572, an EL element utilizing electroluminescence can be used, for example. The EL element includes a layer containing a light-emitting compound (hereinafter also referred to as an EL layer) between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. Then, these carriers (electrons and holes) are recombined, which makes a light-emitting organic compound form an excited state and emit light when it returns from the excited state to a ground state. On the basis of such a mechanism, this light-emitting device is referred to as a current-excitation light-emitting device.

In this specification and the like, a voltage supplied to the display element such as a light-emitting device or a liquid crystal element refers to a difference between the potential applied to one electrode of the display element and the potential applied to the other electrode of the display element.

The EL layer may further contain a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), or the like in addition to the light-emitting compound.

The EL layer can be formed by an evaporation method (including a vacuum evaporation method), a transfer method, a printing method, an inkjet method, a coating method, or the like.

The inorganic EL elements are classified according to their device structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localized type light emission that utilizes inner-shell electron transition of metal ions.

In order that light emitted from the light-emitting device can be extracted, at least one of the pair of electrodes is transparent. A transistor and a light-emitting device are formed over a substrate; the light-emitting device can have any of atop emission structure in which light emission is extracted from the surface on the side opposite to the substrate, a bottom emission structure in which light emission is extracted from the surface on the substrate side, or a dual emission structure in which light emission is extracted from both surfaces.

Figure 20A:
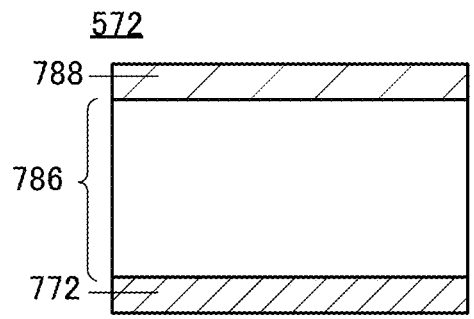
FIG. 20A, FIG. 20B, FIG. 20C, FIG. 20D, and FIG. 20E are diagrams each illustrating a structure example of a light-emitting device.

FIG. 20A to FIG. 20E illustrate structure examples of the light-emitting device 572. FIG. 20A illustrates the structure in which the EL layer 786 is positioned between the conductor 772 and the conductor 788 (single structure). As described above, the EL layer 786 contains a light-emitting material, for example, a light-emitting material of an organic compound.

Figure 20B:
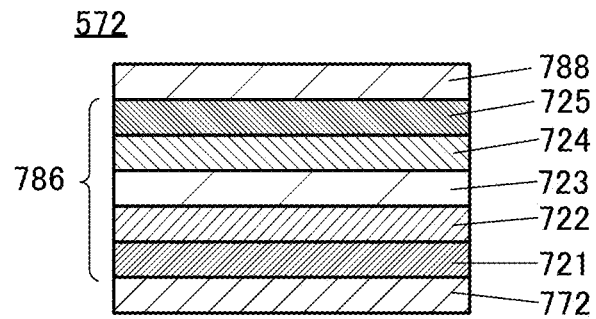

FIG. 20B illustrates a stacked-layer structure of the EL layer 786. In the light-emitting device 572 with the structure illustrated in FIG. 20B, the conductor 772 has a function of an anode and the conductor 788 has a function of a cathode.

The EL layer 786 has a structure in which a hole-injection layer 721, a hole-transport layer 722, a light-emitting layer 723, an electron-transport layer 724, and an electron-injection layer 725 are stacked in this order over the conductor 772. Note that the order of the stacked layers is reversed when the conductor 772 has a function of a cathode and the conductor 788 has a function of an anode.

The light-emitting layer 723 contains a light-emitting material and a plurality of materials in appropriate combination, so that fluorescence or phosphorescence of a desired emission color can be obtained. The light-emitting layer 723 may have a stacked-layer structure having different emission colors. In that case, light-emitting substances and other substances can be different between the stacked light-emitting layers.

For example, when the light-emitting device 572 has a micro optical resonator (microcavity) structure with the conductor 772 and the conductor 788 illustrated in FIG. 20B serving as a reflective electrode and a transflective electrode, respectively, light emitted from the light-emitting layer 723 included in the EL layer 786 can be resonated between the electrodes and thus the light emitted through the conductor 788 can be intensified.

Note that when the conductor 772 of the light-emitting device 572 is a reflective electrode having a stacked-layer structure of a reflective conductive material and a light-transmitting conductive material (transparent conductive film), optical adjustment can be performed by controlling the thickness of the transparent conductive film. Specifically, when the wavelength of light from the light-emitting layer 723 is λ, the interelectrode distance between the conductor 772 and the conductor 788 is preferably adjusted to around mλ/2 (m is a natural number).

To amplify desired light (wavelength: λ) obtained from the light-emitting layer 723, the optical path length from the conductor 772 to a region where desired light is obtained in the light-emitting layer (light-emitting region) and the optical path length from the conductor 788 to the region where desired light is obtained in the light-emitting layer 723 (light-emitting region) are preferably adjusted to around (2m'+1) λ/4 (m' is a natural number). Here, the light-emitting region means a region where holes and electrons are recombined in the light-emitting layer 723.

By such optical adjustment, the spectrum of specific monochromatic light emitted from the light-emitting layer 723 can be narrowed and light emission with high color purity can be obtained.

In the above case, the optical path length between the conductor 772 and the conductor 788 can be, to be exact, the total thickness between a reflective region in the conductor 772 and a reflective region in the conductor 788. However, it is difficult to precisely determine the reflection region in the conductor 772 and the conductor 788; hence, it is assumed that the above effect is sufficiently obtained with given positions in the conductor 772 and the conductor 788 being supposed to be reflective regions. Furthermore, the optical path length between the conductor 772 and the light-emitting layer where desired light is obtained can be, to be exact, the optical path length between the reflective region in the conductor 772 and the light-emitting region where desired light is obtained in the light-emitting layer. However, it is difficult to precisely determine the reflective region in the conductor 772 and the light-emitting region where desired light is obtained in the light-emitting layer; thus, it is assumed that the above effect can be sufficiently obtained with a given position in conductor 772 being supposed to be the reflective region and a given position in the light-emitting layer where desired light is obtained being supposed to be the light-emitting region.

The light-emitting device 572 illustrated in FIG. 20B has a microcavity structure, so that light (monochromatic light)

with different wavelengths can be extracted even when the same EL layer is used. Thus, separate formation for obtaining different emission colors (e.g., RGB) is not necessary. Therefore, high resolution can be easily achieved. In addition, a combination with coloring layers is also possible. Furthermore, the emission intensity of light with a specific wavelength in the front direction can be increased, whereby power consumption can be reduced.

Note that the light-emitting device 572 illustrated in FIG. 20B does not necessarily have a microcavity structure. In that case, light of predetermined colors (e.g., RGB) can be extracted when the light-emitting layer 723 has a structure for emitting white light and coloring layers are provided. In addition, when the EL layers 786 are formed separately for obtaining different emission colors, light of predetermined colors can be extracted without providing coloring layers.

At least one of the conductor 772 and the conductor 788 can be a light-transmitting electrode (e.g., a transparent electrode or a transflective electrode). In the case where the light-transmitting electrode is a transparent electrode, the transparent electrode has a visible light transmittance higher than or equal to 40%. In the case where the electrode having a light-transmitting property is a transflective electrode, the visible light reflectance of the transflective electrode is higher than or equal to 20% and lower than or equal to 80%, preferably higher than or equal to 40% and lower than or equal to 70%. These electrodes preferably have a resistivity lower than or equal to $1 \times 10^{-2}$ Ωcm.

When the conductor 772 or the conductor 788 is an electrode having reflectivity (reflective electrode), the visible light reflectance of the reflective electrode is higher than or equal to 40% and lower than or equal to 100%, preferably higher than or equal to 70% and lower than or equal to 100%. This electrode preferably has a resistivity lower than or equal to $1 \times 10^{-2}$ Ωcm.

Figure 20C:
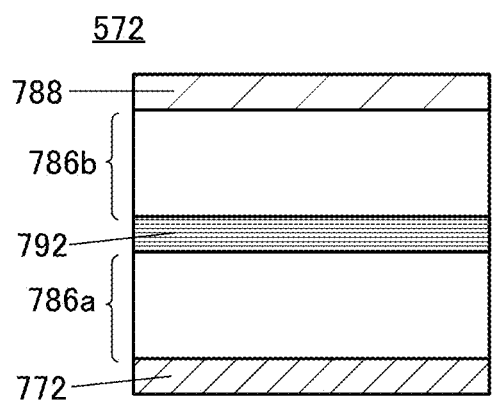

The light-emitting device 572 may have a structure illustrated in FIG. 20C. FIG. 20C illustrates the light-emitting device 572 having a stacked-layer structure (tandem structure) in which two EL layers (an EL layer 786a and an EL layer 786b) are provided between the conductor 772 and the conductor 788, and a charge generation layer 792 is provided between the EL layer 786a and the EL layer 786b. When the light-emitting device 572 has the tandem structure, the current efficiency and external quantum efficiency of the light-emitting device 572 can be increased. Thus, the display device 100 can display high-luminance images. In addition, the power consumption of the display device 100 can be reduced. Here, the EL layer 786a and the EL layer 786b can have a structure similar to that of the EL layer 786 illustrated in FIG. 20B.

The charge generation layer 792 has a function of injecting electrons into one of the EL layer 786a and the EL layer 786b and injecting holes to the other of the EL layer 786a and the EL layer 786b when a voltage is supplied between the conductor 772 and the conductor 788. Accordingly, when a voltage is supplied such that the potential of the conductor 772 becomes higher than the potential of the conductor 788, electrons are injected into the EL layer 786a from the charge generation layer 792 and holes are injected into the EL layer 786b from the charge generation layer 792.

Note that in terms of light extraction efficiency, the charge generation layer 792 preferably transmits visible light (specifically, the visible light transmittance of the charge generation layer 792 is preferably 40% or higher). The conductivity of the charge generation layer 792 may be lower than that of the conductor 772 or the conductor 788.

Figure 20D:
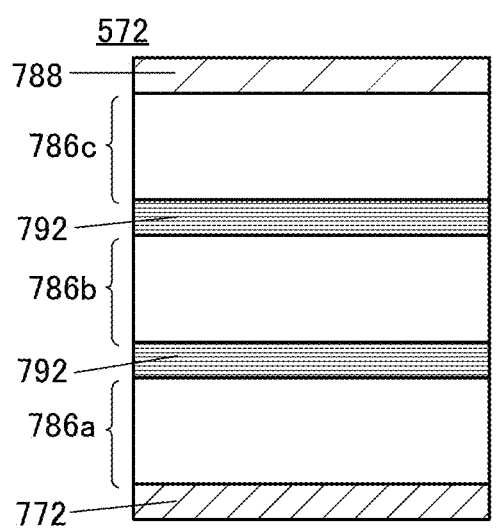

The light-emitting device 572 may have a structure illustrated in FIG. 20D. FIG. 20D illustrates the light-emitting device 572 having a tandem structure in which three EL layers (the EL layer 786a, the EL layer 786b, and an EL layer 786c) are provided between the conductor 772 and the conductor 788, and the charge generation layer 792 is provided between the EL layer 786a and the EL layer 786b and between the EL layer 786b and the EL layer 786c. Here, the EL layer 786a, the EL layer 786b, and the EL layer 786c can have a structure similar to that of the EL layer 786 illustrated in FIG. 20B. When the light-emitting device 572 has the structure illustrated in FIG. 20D, the current efficiency and external quantum efficiency of the light-emitting device 572 can be further increased. As a result, the display device 100 can display higher-luminance images. Moreover, the power consumption of the display device 100 can be further reduced.

Figure 20E:
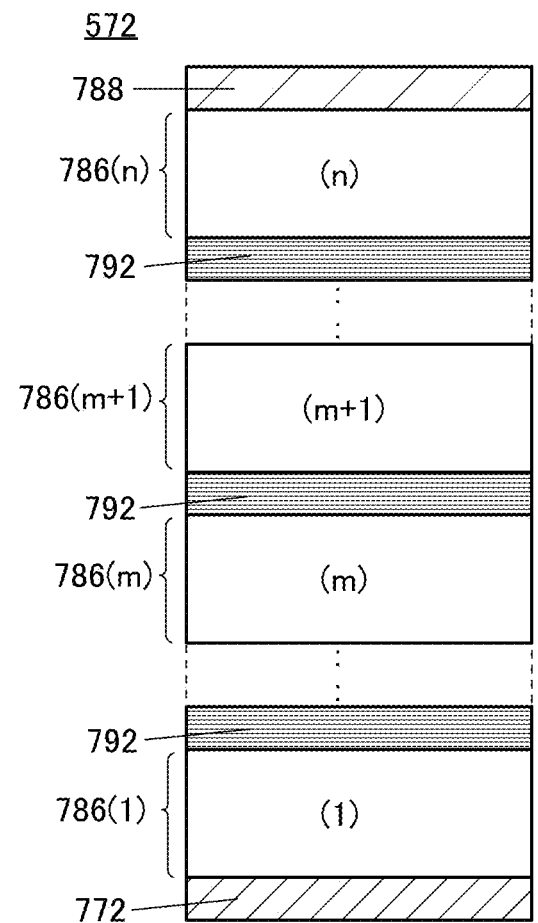

The light-emitting device 572 may have a structure illustrated in FIG. 20E. FIG. 20E illustrates the light-emitting device 572 having a tandem structure in which n EL layers (an EL layer 786(1) to an EL layer 786(n)) are provided between the conductor 772 and the conductor 788, and the charge generation layer 792 is provided between the EL layers 786. Here, the EL layer 786(1) to the EL layer 786(n) can have a structure similar to that of the EL layer 786 illustrated in FIG. 20B. Note that FIG. 20E illustrates the EL layer 786(1), the EL layer 786(m), and the EL layer 786(n) among the EL layers 786. Here, m is an integer greater than or equal to 2 and less than n, and n is an integer greater than or equal to m. As n becomes larger, the current efficiency and external quantum efficiency of the light-emitting device 572 can be increased. Thus, the display device 100 can display high-luminance images. In addition, the power consumption of the display device 100 can be reduced.

Next, materials that can be used for the light-emitting device 572 will be described.

[Conductor 772 and Conductor 788]

For the conductor 772 and the conductor 788, any of the following materials can be used in an appropriate combination as long as the functions of the anode and the cathode can be fulfilled. For example, a metal, an alloy, an electrically conductive compound, a mixture of these, and the like can be appropriately used. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

[Hole-Injection Layer 721 and Hole-Transport Layer 722]

The hole-injection layer 721 injects holes to the EL layer 786 from the conductor 772, which is an anode, or the charge generation layer 792 and contains a material with a high hole-injection property. Here, the EL layer 786 includes the EL layer 786a, the EL layer 786b, the EL layer 786c, and the EL layer 786(1) to the EL layer 786(n).

Examples of the material having a high hole-injection property include transition metal oxides such as molybdenum oxide, vanadium oxide, ruthenium oxide, tungsten oxide, and manganese oxide. Alternatively, it is possible to use a phthalocyanine-based compound, an aromatic amine compound, a high molecular compound, or the like.

Alternatively, as the material having a high hole-injection property, a composite material containing a hole-transport material and an acceptor material (electron-accepting material) can be used. In that case, the acceptor material extracts electrons from the hole-transport material, so that holes are generated in the hole-injection layer 721 and the holes are injected into the light-emitting layer 723 through the hole-transport layer 722. Note that the hole-injection layer 721 may be formed to have a single-layer structure using a composite material containing a hole-transport material and an acceptor material (electron-accepting material), or a stacked-layer structure in which a layer containing a hole-transport material and another layer containing an acceptor material (electron-accepting material) are stacked.

The hole-transport layer 722 transports the holes, which are injected from the conductor 772 by the hole-injection layer 721, to the light-emitting layer 723. Note that the hole-transport layer 722 contains a hole-transport material. It is preferable that the HOMO level of the hole-transport material used for the hole-transport layer 722 be equal or close to the HOMO level of the hole-injection layer 721, in particular.

Examples of the acceptor material used for the hole-injection layer 721 include oxides of a metal belonging to any of Group 4 to Group 8 of the periodic table. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Alternatively, organic acceptors such as a quinodimethane derivative, a chloranil derivative, and a hexaazatriphenylene derivative can be used.

The hole-transport materials used for the hole-injection layer 721 and the hole-transport layer 722 are preferably substances with a hole mobility of greater than or equal to $10^{-6}$ cm$^2$/Vs. Note that other substances can also be used as long as they have a hole-transport property higher than an electron-transport property.

As the hole-transport material, a n-electron rich heteroaromatic compound (e.g., a carbazole derivative or an indole derivative), an aromatic amine compound, or the like is preferable.

Note that the hole-transport material is not limited to the above examples and one of or a combination of various known materials can be used as the hole-transport material for the hole-injection layer 721 and the hole-transport layer 722. Note that the hole-transport layer 722 may be formed of a plurality of layers. In other words, a first hole-transport layer and a second hole-transport layer may be stacked, for example.

[Light-Emitting Layer 723]

The light-emitting layer 723 is a layer containing a light-emitting substance. As the light-emitting substance, a substance whose emission color is blue, violet, bluish violet, green, yellowish green, yellow, orange, red, or the like is appropriately used. Here, when the light-emitting device 572 includes a plurality of EL layers as illustrated in FIG. 20C, FIG. 20D, and FIG. 20E, the use of different light-emitting substances for the light-emitting layers 723 in the EL layers enables different emission colors to be exhibited (e.g., it enables white light emission obtained by combining complementary emission colors). For example, when the light-emitting device 572 has the structure illustrated in FIG. 20C, the use of different light-emitting substances for the light-emitting layer 723 in the EL layer 786a and the light-emitting layer 723 in the EL layer 786b can achieve different emission colors of the EL layer 786a and the EL layer 786b. Note that a stacked-layer structure in which one light-emitting layer includes different light-emitting substances may be employed.

The light-emitting layer 723 may contain one or more kinds of organic compounds (a host material and an assist material) in addition to a light-emitting substance (guest material). As the one or more kinds of organic compounds, one or both of the hole-transport material and the electron-transport material can be used.

There is no particular limitation on the light-emitting substance that can be used for the light-emitting layer 723, and it is possible to use a light-emitting substance that converts singlet excitation energy into light in the visible light range or a light-emitting substance that converts triplet excitation energy into light in the visible light range. Examples of the light-emitting substance are given below.

As an example of the light-emitting substance that converts singlet excitation energy into light, a substance that exhibits fluorescence (fluorescent material) can be given; examples thereof include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. In particular, a pyrene derivative is preferable because it has a high emission quantum yield.

As examples of the light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit different emission colors (emission peaks), and thus are appropriately selected as needed.

As the blue-light-emitting substance, a substance whose photoluminescence peak wavelength is greater than or equal to 430 nm and less than or equal to 470 nm, preferably greater than or equal to 430 nm and less than or equal to 460 nm can be used. As the green-light-emitting substance, a substance whose photoluminescence peak wavelength is greater than or equal to 500 nm and less than or equal to 540 nm, preferably greater than or equal to 500 nm and less than or equal to 530 nm can be used. As the red-light-emitting substance, a substance whose photoluminescence peak wavelength is greater than or equal to 610 nm and less than or equal to 680 nm, preferably greater than or equal to 620 nm and less than or equal to 680 nm can be used. Note that the photoluminescence may be measured with either a solution or a thin film.

With the parallel use of such compounds and the microcavity effect, the above chromaticity can be achieved more easily. Here, a transflective electrode (metal thin film portion) that is needed for obtaining the microcavity effect has a thickness of preferably greater than or equal to 20 nm and less than or equal to 40 nm. The thickness is further preferably greater than 25 nm and less than or equal to 40 nm. However, the thickness greater than 40 nm possibly reduces the efficiency.

As the organic compounds (the host material and the assist material) used in the light-emitting layer 723, one or more kinds of substances having an energy gap larger than the energy gap of the light-emitting substance (the guest material) can be used. Note that the hole-transport materials listed above and the electron-transport materials given below can be used as the host material and the assist material, respectively.

In the case where the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used.

In the case where the light-emitting substance is a phosphorescent material, an organic compound having triplet excitation energy (energy difference between a ground state and a triplet excited state) higher than that of the light-emitting substance can be selected as the host material.

In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, or the like.

When a plurality of organic compounds are used for the light-emitting layer 723, it is preferable to use compounds that form an exciplex in combination with a light-emitting substance. In that case, various organic compounds can be used in appropriate combination; to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (reverse intersystem crossing) using a little thermal energy and efficiently exhibit light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Delayed fluorescence by the TADF material refers to light emission having a spectrum similar to that of normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd).

Alternatively, it is possible to use a heterocyclic compound having a n-electron rich heteroaromatic ring and a π-electron deficient heteroaromatic ring. Note that a substance in which a π-electron rich heteroaromatic ring is directly bonded to a π-electron deficient heteroaromatic ring is particularly preferably used, in which case both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound.

[Electron-Transport Layer 724]

The electron-transport layer 724 transports the electrons, which are injected from the conductor 788 by the electron-injection layer 725, to the light-emitting layer 723. Note that the electron-transport layer 724 contains an electron-transport material. The electron-transport material used for the electron-transport layer 724 is preferably a substance with an electron mobility of higher than or equal to $1\times10^{-6}$ cm$^2$/Vs. Note that other substances can also be used as long as they have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

The electron-transport layer 724 is not limited to a single layer and may have a structure in which two or more layers each containing any of the above substances are stacked.

[Electron-Injection Layer 725]

The electron-injection layer 725 contains a substance having a high electron-injection property. The electron-injection layer 725 can be formed using an alkali metal, an alkaline earth metal, or a compound thereof, such as lithium fluoride (LiF), cesium fluoride (CsF), calcium fluoride (CaF$_2$), or lithium oxide (LiO$_x$). A rare earth metal compound such as erbium fluoride (ErF$_3$) can also be used. An electride may also be used for the electron-injection layer 725. Examples of the electride include a substance in which electrons are added at high concentration to calcium oxide-aluminum oxide. Any of the substances given above for forming the electron-transport layer 724 can also be used.

A composite material in which an organic compound and an electron donor (donor) are mixed may also be used for the electron-injection layer 725. Such a composite material is excellent in an electron-injection property and an electron-transport property because electrons are generated in the organic compound by the electron donor. The organic compound here is preferably a material excellent in transporting the generated electrons; specifically, for example, any of the above-described electron-transport materials used for the electron-transport layer 724 (e.g., a metal complex or a heteroaromatic compound) can be used. As the electron donor, a substance showing a property of donating electrons to an organic compound can be used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. A Lewis base such as magnesium oxide can be used. Further, an organic compound such as tetrathiafulvalene (abbreviation: TTF) can be used.

[Charge Generation Layer 792]

The charge generation layer 792 has a function of injecting electrons into the EL layer 786 that is closer to the conductor 772 of the two EL layers 786 in contact with the charge generation layer 792 and injecting holes to the other EL layer 786 that is different from the conductor 788, when a voltage is applied between the conductor 772 and the conductor 788. For example, in the light-emitting device 572 with the structure illustrated in FIG. 20C, the charge generation layer 792 has a function of injecting electrons into the EL layer 786a and injecting holes into the EL layer 786b. Note that the charge generation layer 792 may have either a structure in which an electron acceptor (acceptor) is added to a hole-transport material or a structure in which an electron donor (donor) is added to an electron-transport material. Alternatively, both of these structures may be stacked. Forming the charge generation layer 792 by using any of the above materials can inhibit an increase in driving voltage of the display device 100 including the stack of the EL layers.

When the charge generation layer 792 has a structure in which an electron acceptor is added to a hole-transport material, the electron acceptor can be 7,7,8,8-tetracyano-2, 3,5,6-tetrafluoroquinodimethane (abbreviation: F4-TCNQ), chloranil, or the like. Other examples include oxides of metals that belong to Group 4 to Group 8 of the periodic table. Specific examples are vanadium oxide, niobium oxide, tantalum oxide, chromium oxide, molybdenum oxide, tungsten oxide, manganese oxide, and rhenium oxide.

When the charge generation layer 792 has a structure in which an electron donor is added to an electron-transport material, an alkali metal, an alkaline earth metal, a rare earth metal, or a metal that belongs to Group 2 or Group 13 of the periodic table, or an oxide or carbonate thereof can be used as the electron donor. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

For fabrication of the light-emitting device 572, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layer, the hole-transport layer, the light-emitting layer, the electron-transport layer, and the electron-injection layer) included in the EL layer and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

Note that materials for the functional layers (the hole-injection layer, the hole-transport layer, the light-emitting layer, the electron-transport layer, and the electron-injection layer) included in the EL layer and the charge generation layer of the light-emitting device described in this embodiment are not limited to the above materials, and other materials can be used in combination as long as the functions of the layers are fulfilled. For example, a high molecular compound (e.g., an oligomer, a dendrimer, and a polymer), a middle molecular compound (a compound between a low molecular compound and a high molecular compound, with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

At least part of the structure examples, the drawings corresponding thereto, and the like described in this embodiment can be implemented in combination with the other structure examples, the other drawings, and the like as appropriate.

At least part of this embodiment can be implemented in combination with any of the other embodiments described in this specification as appropriate.

Embodiment 2

In this embodiment, transistors that can be used in the display device of one embodiment of the present invention will be described.

Structure Example 1 of Transistor

Figure 21A:
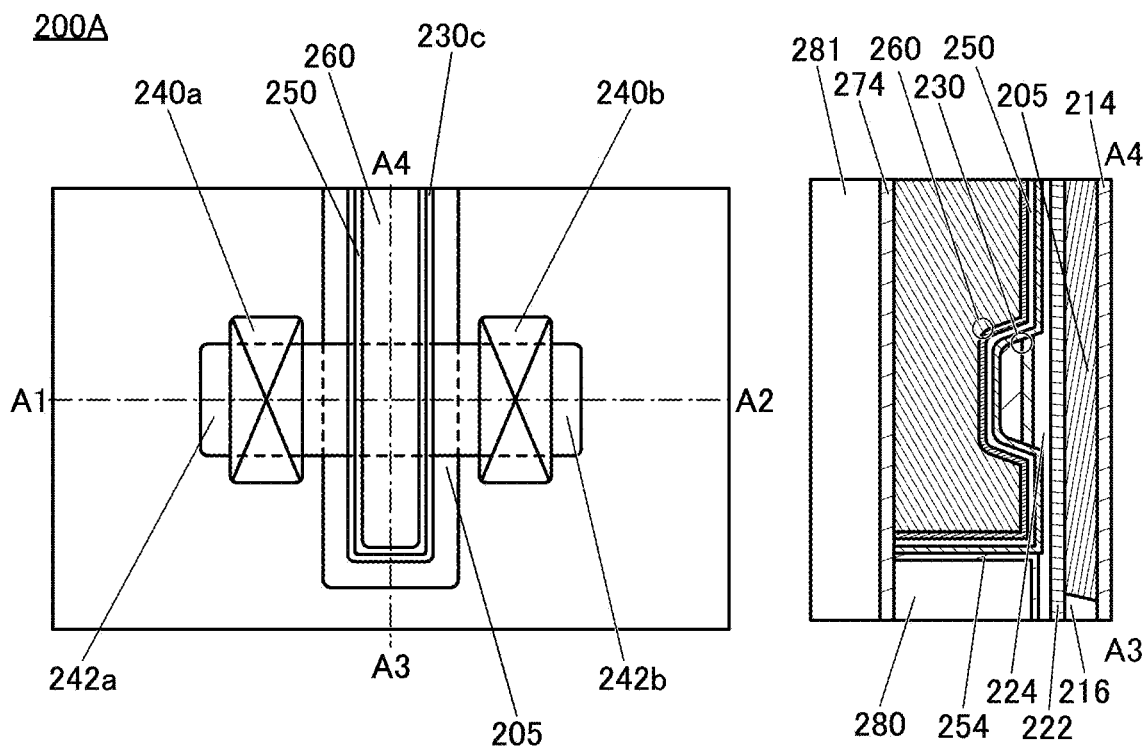
FIG. 21A is a top view illustrating a structure example of a transistor.
Figure 21C:
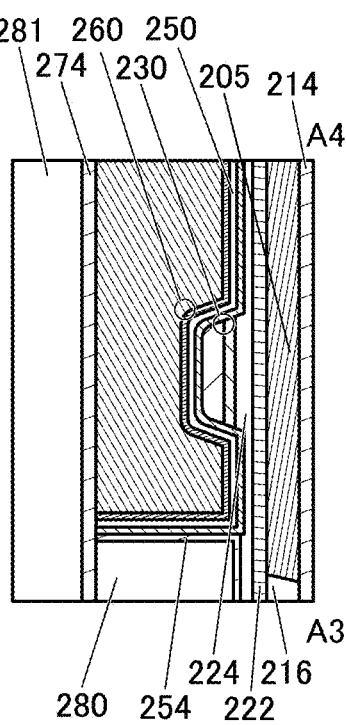
FIG. 21B and FIG. 21C are cross-sectional views illustrating the structure example of the transistor.
Figure 21B:
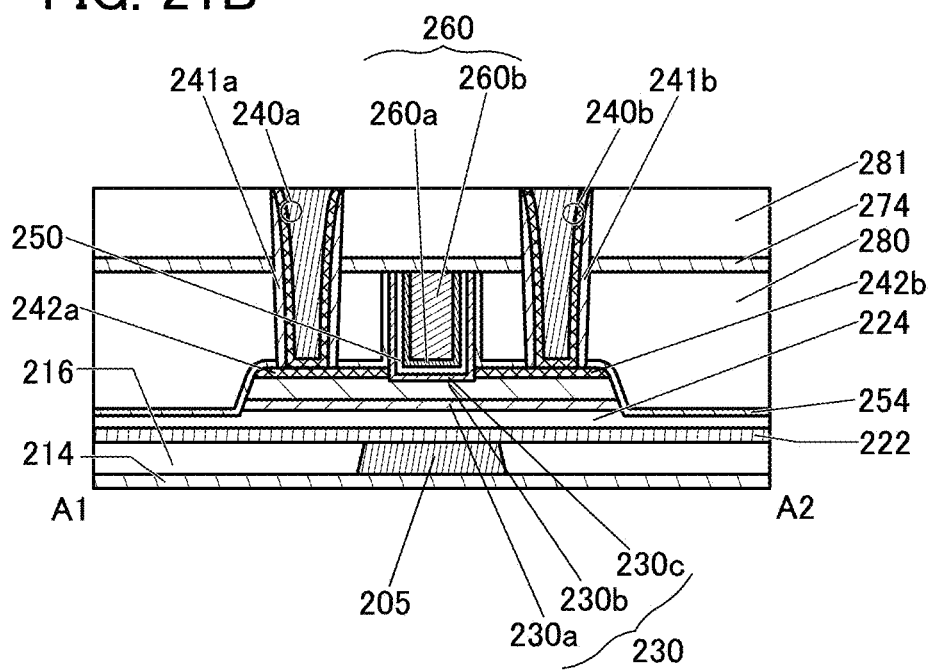

FIG. 21A, FIG. 21B, and FIG. 21C are a top view and cross-sectional views of a transistor 200A that can be used in the display device of one embodiment of the present invention and the periphery of the transistor 200A. The transistor 200A can be used in the display device of one embodiment of the present invention.

FIG. 21A is a top view of the transistor 200A. FIG. 21B and FIG. 21C are cross-sectional views of the transistor 200A. Here, FIG. 21B is a cross-sectional view of a portion indicated by the dashed-dotted line A1-A2 in FIG. 21A and is a cross-sectional view in the channel length direction of the transistor 200A. FIG. 21C is a cross-sectional view of a portion indicated by the dashed-dotted line A3-A4 in FIG. 21A and is a cross-sectional view in the channel width direction of the transistor 200A. Note that some components are not illustrated in the top view of FIG. 21A for clarity of the drawing.

As illustrated in FIG. 21, the transistor 200A includes a metal oxide 230a positioned over a substrate (not illustrated); a metal oxide 230b positioned over the metal oxide 230a; a conductor 242a and a conductor 242b that are positioned apart from each other over the metal oxide 230b; the insulator 280 that is positioned over the conductor 242a and the conductor 242b and has an opening between the conductor 242a and the conductor 242b; a conductor 260 positioned in the opening; an insulator 250 between the conductor 260 and the metal oxide 230b, the conductor 242a, the conductor 242b, and the insulator 280; and a metal oxide 230c between the insulator 250 and the metal oxide 230b, the conductor 242a, the conductor 242b, and the insulator 280. Here, as illustrated in FIG. 21B and FIG. 21C, preferably, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 200A illustrated in FIG. 21, side surfaces of the conductor 242a and the conductor 242b on the conductor 260 side are substantially perpendicular. Note that the transistor 200A illustrated in FIG. 21 is not limited thereto, and the angle formed between the side surfaces and the bottom surfaces of the conductor 242a and the conductor 242b may be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 21, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 21B and FIG. 21C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 200A, three layers of the metal oxide 230a, the metal oxide 230b, and the metal oxide 230c are stacked in and around the region where the channel is formed (hereinafter also referred to as channel formation region); however, the present invention is not limited thereto. For example, a two-layer structure of the metal oxide 230b and the metal oxide 230c or a stacked-layer structure of four or more layers may be employed. Although the conductor 260 has a stacked-layer structure of two layers in the transistor 200A, the present invention is not limited thereto. For example, the conductor 260 may have a single-layer structure or a stacked-layer structure of three or more layers. Alternatively, each of the metal oxide 230a, the metal oxide 230b, and the metal oxide 230c may have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b each function as a source electrode or a drain electrode. As described above, the conductor 260 is formed to be embedded in the opening of the insulator 280 and the region between the conductor 242a and the conductor 242b. Here, the positions of the conductor 260, the conductor 242a, and the conductor 242b are selected in a self-aligned manner with respect to the opening of the insulator 280. In other words, in the transistor 200A, the gate electrode can be positioned between the source electrode and the drain electrode in a self-aligned manner. Thus, the conductor 260 can be formed without an alignment margin, resulting in a reduction in the area occupied by the transistor 200A. Accordingly, the display device can have higher resolution. In addition, the display device can have a narrow bezel.

As illustrated in FIG. 21, the conductor 260 preferably includes a conductor 260a provided inside the insulator 250 and a conductor 260b provided to be embedded inside the conductor 260a.

The transistor 200A preferably includes the insulator 214 positioned over the substrate (not illustrated); the insulator 216 positioned over the insulator 214; a conductor 205 positioned to be embedded in the insulator 216; the insulator 222 positioned over the insulator 216 and the conductor 205; and the insulator 224 positioned over the insulator 222. The metal oxide 230a is preferably provided over the insulator 224.

The insulator 274 and the insulator 281 functioning as interlayer films are preferably provided over the transistor 200A. Here, the insulator 274 is preferably provided in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of at least one of oxygen (e.g., oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen included in the insulator 280 and the insulator 281 into the insulator 224, the metal oxide 230, and the insulator 250 or excess oxygen into the insulator 224, the metal oxide 230a, the metal oxide 230b, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. In addition, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a structured part has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 21B, the metal oxide 230b in a region that does not overlap with the conductor 242 sometimes have smaller thickness than the metal oxide 230b in a region that overlaps with the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. Removing the low-resistance region positioned between the conductor 242a and the conductor 242b on the top surface of the metal oxide 230b in the above manner can prevent formation of the channel in the region.

According to one embodiment of the present invention, a display device that includes small-size transistors and has high resolution can be provided. A display device that includes a transistor with a high on-state current and has high luminance can be provided. A display device that includes a transistor operating at high speed and operates at high speed can be provided. A display device that includes a transistor having stable electrical characteristics and is highly reliable can be provided. A display device that includes a transistor with a low off-state current and has low power consumption can be provided.

The structure of the transistor 200A that can be used in the display device of one embodiment of the present invention is described in detail.

The conductor 205 is placed so as to include a region overlapping with the metal oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This can achieve favorable planarity of the insulator 224 formed over the conductor 205 and can increase the crystallinity of the metal oxide 230b and the metal oxide 230c.

The conductor 260 sometimes functions as a first gate (also referred to as top gate) electrode. The conductor 205 sometimes functions as a second gate (also referred to as bottom gate) electrode. In that case, by changing a potential applied to the conductor 205 independently of a potential applied to the conductor 260, $V_{th}$ of the transistor 200A can be controlled. In particular, by applying a negative potential to the conductor 205, $V_{th}$ of the transistor 200A can be higher than 0 V and the off-state current can be made small. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 21C. In other words, the conductor 205 and the conductor 260 preferably overlap with each other with the insulator positioned therebetween, in a region outside the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

Furthermore, as illustrated in FIG. 21C, the conductor 205 extends to function as a wiring as well. However, without limitation to this structure, a structure in which a conductor functioning as a wiring is provided below the conductor 205 may be employed.

A conductive material containing tungsten, copper, or aluminum as its main component is preferably used for the conductor 205. Note that the conductor 205 is illustrated as a single layer but may have a stacked-layer structure, for example, a stack of any of the above conductive materials and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (a conductor through which the above impurities are less likely to pass) may be used below the conductor 205. Alternatively, it is preferable to use a conductor having a function of inhibiting diffusion of oxygen (e.g., at least one of an oxygen atom, an oxygen molecule, and the like) (a conductor through which the oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used below the conductor 205, the conductivity of the conductor 205 can be inhibited from being lowered because of oxidation. As the conductor having a function of inhibiting oxygen diffusion, for example, tantalum, tantalum nitride, ruthenium, or ruthenium oxide is preferably used. Thus, the first conductor of the conductor 205 is a single layer or a stacked layer of the above conductive materials.

The insulator 214 preferably functions as a barrier insulating film that inhibits the entry of impurities such as water or hydrogen to the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of at least one of oxygen (e.g., an oxygen atom or an oxygen molecule) (an insulating material through which the oxygen is less likely to pass).

For example, aluminum oxide or silicon nitride is preferably used for the insulator 214. Accordingly, it is possible to inhibit diffusion of impurities such as water or hydrogen to the transistor 200A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably release oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 21C, the insulator 224 is sometimes thinner in a region overlapping with neither the insulator 254 nor the metal oxide 230b than in the other regions. In the insulator 224, the region overlapping with neither the insulator 254 nor the metal oxide 230b preferably has a thickness with which the above oxygen can be adequately diffused.

Like the insulator 214 and the like, the insulator 222 preferably functions as a barrier insulating film that inhibits the entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 200A from outside can be inhibited.

Furthermore, it is preferable that the insulator 222 have a function of inhibiting diffusion of at least one of oxygen (e.g., an oxygen atom and an oxygen molecule) (it is preferable that the above oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. Moreover, the conductor 205 can be inhibited from reacting with oxygen contained in the insulator 224 or the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that cases, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a. Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably greater than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably greater than the atomic ratio of the element M to In in the metal oxide 230b.

Here, the energy level of the conduction band minimum gently changes at junction portions between the metal oxide 230a, the metal oxide 230b, and the metal oxide 230c. In other words, the energy level of the conduction band minimum at junction portions between the metal oxide 230a, the metal oxide 230b, and the metal oxide 230c is continuously varied or are continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, an In—Ga—Zn oxide, a Ga—Zn oxide, gallium oxide, or the like may be used as the metal oxide 230a and the metal oxide 230c, in the case where the metal oxide 230b is an In—Ga—Zn oxide. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] can be used. As the metal oxide 230b, a metal oxide with In:Ga:Zn=4:2:3 [atomic ratio] or 3:1:2 [atomic ratio] can be used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 230b serves as a main carrier path. When the metal oxide 230a and the metal oxide 230c have the above structure, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent element of the metal oxide 230c to the insulator 250 side can be expected. Specifically, the metal oxide 230c has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 230c having a stacked-layer structure allows a highly reliable display device to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even when absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be formed in a self-aligned manner between the conductor 242a and the conductor 242b.

The insulator 250 functions as a gate insulator. The insulator 250 is preferably positioned in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 has a two-layer structure in FIG. 21, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of at least one of oxygen (e.g., an oxygen atom and an oxygen molecule).

When the conductor 260a has a function of inhibiting diffusion of oxygen, it is possible to inhibit reduction of the conductivity due to oxidation of the conductor 260b by oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 21A and FIG. 21C, the side surface of the metal oxide 230 is covered with the conductor 260 in a region where the metal oxide 230b does not overlap with the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 200A can be increased and the frequency characteristics can be improved.

The insulator 254, like the insulator 214 and the like, preferably functions as a barrier insulating film that inhibits the entry of impurities such as water or hydrogen into the transistor 200A from the insulator 280 side. The insulator 254 preferably has lower hydrogen permeability than the insulator 224, for example. Furthermore, as illustrated in FIG. 21B and FIG. 21C, the insulator 254 is preferably in contact with the side surface of the metal oxide 230c, the top and side surfaces of the conductor 242a, the top and side surfaces of the conductor 242b, side surfaces of the metal oxide 230a and the metal oxide 230b, and the top surface of the insulator 224. Such a structure can inhibit the entry of hydrogen contained in the insulator 280 into the metal oxide 230 through the top surfaces or side surfaces of the conductor 242a, the conductor 242b, the metal oxide 230a, the metal oxide 230b, and the insulator 224.

Furthermore, it is preferable that the insulator 254 have a function of inhibiting diffusion of at least one of oxygen (e.g., an oxygen atom and an oxygen molecule) (it is preferable that the above oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward diffusion of oxygen, oxygen can be prevented from diffusing from the metal oxide 230 into the insulator 280. Moreover, with the insulator 222 having a function of inhibiting downward diffusion of oxygen, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit the entry of impurities such as hydrogen from outside of the transistor 200A, resulting in favorable electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen to be released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are positioned to face each other with the conductor 260 therebetween. Note that the top surfaces of the conductor 240a and the conductor 240b may be level with the top surface of the insulator 281.

The insulator 241a is provided in contact with the inner walls of the openings in the insulator 281, the insulator 274, the insulator 280, and the insulator 254, and the first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner walls of the openings in the insulator 281, the insulator 274, the insulator 280, and the insulator 254, and the first conductor of the conductor 240b is formed in contact with the side surface of the insulator 241b. The conductor 242b is positioned on at least part of the bottom portion of the opening, and the conductor 240b is in contact with the conductor 242b.

The conductor 240a and the conductor 240b are preferably formed using a conductive material containing tungsten, copper, or aluminum as its main component. The conductor 240a and the conductor 240b may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can prevent oxygen added to the insulator 280 from being absorbed by the conductor 240a and the conductor 240b. Moreover, impurities such as water or hydrogen can be inhibited from entering the metal oxide 230 through the conductor 240a and the conductor 240b from a layer above the insulator 281.

As the insulator 241a and the insulator 241b, for example, the insulator that can be used as the insulator 254 or the like can be used. Since the insulator 241a and the insulator 241b are provided in contact with the insulator 254, impurities such as water or hydrogen in the insulator 280 or the like can be inhibited from entering the metal oxide 230 through the conductor 240a and the conductor 240b. Furthermore, oxygen contained in the insulator 280 can be prevented from being absorbed by the conductor 240a and the conductor 240b.

Although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure and may be a stack of titanium or a titanium nitride and the above conductive material, for example. Note that the conductor may be formed to be embedded in an opening provided in an insulator.

Structure Example 2 of Transistor

Figure 22A:
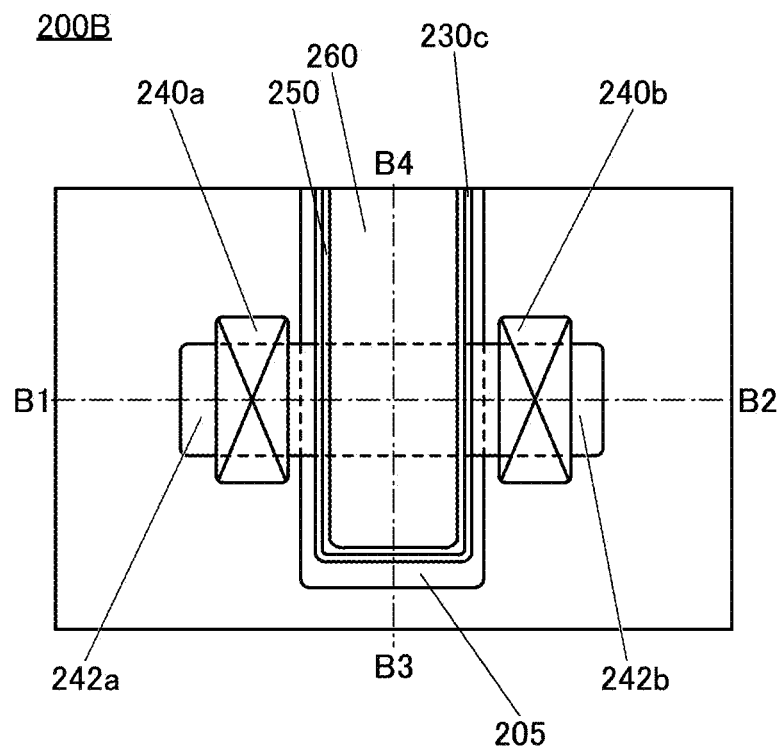
FIG. 22A is a top view illustrating a structure example of a transistor.
Figure 22C:
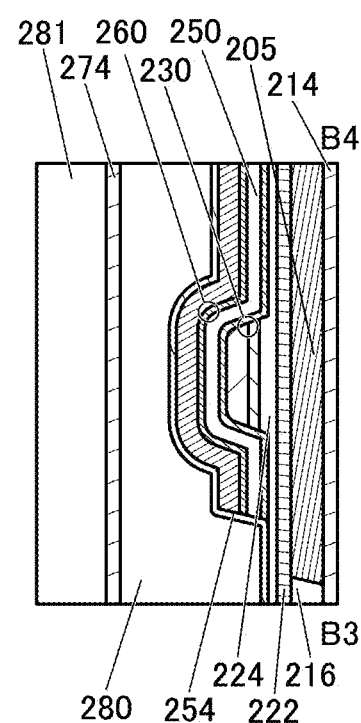
FIG. 22B and FIG. 22C are cross-sectional views illustrating the structure example of the transistor.
Figure 22B:
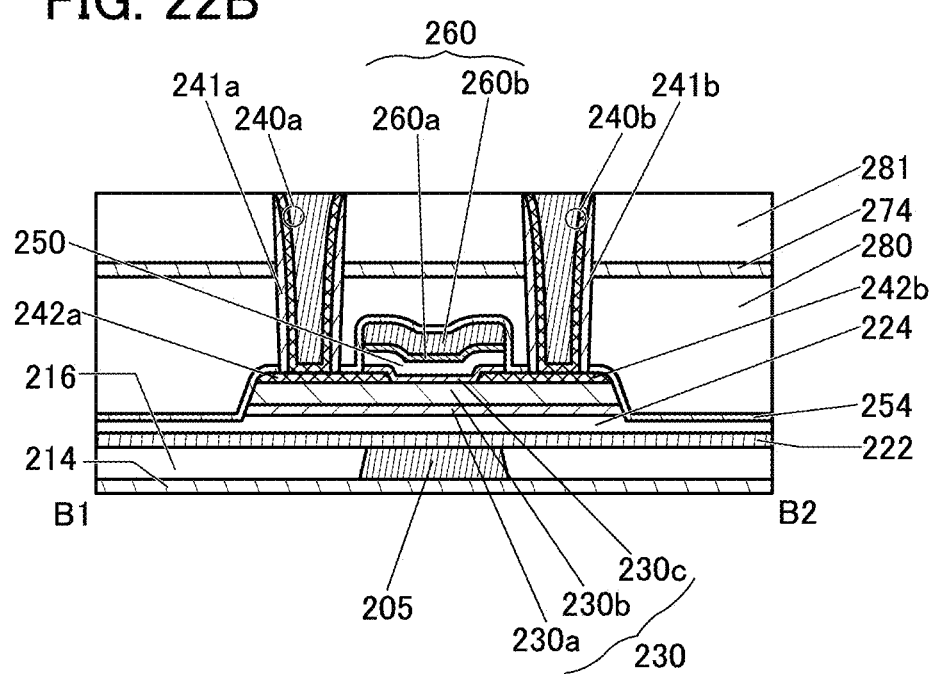

FIG. 22A, FIG. 22B, and FIG. 22C are a top view and cross-sectional views of a transistor 200B that can be used in the display device of one embodiment of the present invention and the periphery of the transistor 200B. The transistor 200B is a modification example of the transistor 200A.

FIG. 22A is a top view of the transistor 200B. FIG. 22B and FIG. 22C are cross-sectional views of the transistor 200B. Here, FIG. 22B is a cross-sectional view of a portion indicated by the dashed-dotted line B1-B2 in FIG. 22A, and is also a cross-sectional view in the channel length direction of the transistor 200B. FIG. 22C is a cross-sectional view of a portion indicated by the dashed-dotted line B3-B4 in FIG. 22A, and is also a cross-sectional view in the channel width direction of the transistor 200B. Note that some components are not illustrated in the top view of FIG. 22A for clarity of the drawing.

In the transistor 200B, the conductor 242a and the conductor 242b each have a region overlapping with the metal oxide 230c, the insulator 250, and the conductor 260. This enables the transistor 200B to have a high on-state current. This also enables the transistor 200B to be a transistor that is easy to control.

The conductor 260 functioning as a gate electrode includes the conductor 260a and the conductor 260b over the conductor 260a. For the conductor 260a, a conductive material having a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the range of choices for the material of the conductor 260b can be expanded. In other words, the conductor 260a inhibits oxidation of the conductor 260b, thereby preventing a decrease in conductivity.

The insulator 254 is preferably provided to cover the top surface and the side surface of the conductor 260, the side surface of the insulator 250, and the side surface of the metal oxide 230c. Note that an insulating material having a function of inhibiting diffusion of oxygen and impurities such as water or hydrogen is preferably used for the insulator 254.

Providing the insulator 254 can inhibit oxidation of the conductor 260. Moreover, the insulator 254 can inhibit diffusion of impurities such as water or hydrogen contained in the insulator 280 into the transistor 200B.

Structure Example 3 of Transistor

FIG. 23A, FIG. 23B, and FIG. 23C are a top view and cross-sectional views of a transistor 200C that can be used in the display device of one embodiment of the present invention and the periphery of the transistor 200C. The transistor 200C is a modification example of the transistor 200A.

FIG. 23A is a top view of the transistor 200C. FIG. 23B and FIG. 23C are cross-sectional views of the transistor 200C. Here, FIG. 23B is a cross-sectional view of a portion indicated by the dashed-dotted line C1-C2 in FIG. 23A and is also a cross-sectional view in the channel length direction of the transistor 200C. FIG. 23C is a cross-sectional view of a portion indicated by the dashed-dotted line C3-C4 in FIG. 23A and is also a cross-sectional view in the channel width direction of the transistor 200C. Note that some components are not illustrated in the top view of FIG. 23A for clarity of the drawing.

The transistor 200C includes the insulator 250 over the metal oxide 230c and a metal oxide 252 over the insulator 250. The conductor 260 is provided over the metal oxide 252, and an insulator 270 is provided over the conductor 260. An insulator 271 is provided over the insulator 270.

The metal oxide 252 preferably has a function of inhibiting oxygen diffusion. When the metal oxide 252 that inhibits oxygen diffusion is provided between the insulator 250 and the conductor 260, diffusion of oxygen into the conductor 260 is inhibited. In other words, a reduction in the amount of oxygen supplied to the metal oxide 230 can be inhibited. Moreover, oxidization of the conductor 260 due to oxygen can be inhibited.

Note that the metal oxide 252 may function as part of a gate electrode. For example, an oxide semiconductor that can be used for the metal oxide 230 can be used for the metal oxide 252. In that case, when the conductor 260 is formed by a sputtering method, the metal oxide 252 can have a reduced electric resistance and become a conductor. Such a conductor can be referred to as an OC (Oxide Conductor) electrode.

Note that the metal oxide 252 may function as part of a gate insulator. Thus, when silicon oxide, silicon oxynitride, or the like is used for the insulator 250, a metal oxide that is a high-k material with a high relative permittivity is preferably used for the metal oxide 252. Such a stacked-layer structure can be thermally stable and can have a high relative permittivity. Accordingly, a gate potential applied at the time of operation of the transistor can be lowered while the physical thickness is maintained. In addition, the equivalent oxide thickness (EOT) of an insulating layer functioning as a gate insulator can be reduced.

Although the metal oxide 252 in the transistor 200C is illustrated as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200C can be increased without a reduction in the influence of the electric field from the conductor 260. In addition, with the metal oxide 252 functioning as a gate insulator, the distance between the conductor 260 and the metal oxide 230 is kept by the physical thicknesses of the insulator 250 and the metal oxide 252, so that leakage current between the conductor 260 and the metal oxide 230 can be reduced. Thus, with the stacked-layer structure of the insulator 250 and the metal oxide 252, it is easy to adjust the physical distance between the conductor 260 and the metal oxide 230 and the intensity of electric fields applied from the conductor 260 to the metal oxide 230.

Specifically, for the metal oxide 252, a material obtained by reducing the resistance of an oxide semiconductor that can be used for the metal oxide 230 can be used. Alternatively, a metal oxide containing one or more of hafnium, aluminum, gallium, yttrium, zirconium, tungsten, titanium, tantalum, nickel, germanium, magnesium, and the like can be used.

In particular, it is preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is unlikely to be crystallized by heat treatment in a later step. Note that the metal oxide 252 is not an essential component. Design is appropriately determined in consideration of required transistor characteristics.

For the insulator 270, an insulating material having a function of inhibiting the passage of oxygen and impurities such as water or hydrogen is preferably used. For example, aluminum oxide or hafnium oxide is preferably used. Thus, oxidization of the conductor 260 due to oxygen from above the insulator 270 can be inhibited. Moreover, the entry of impurities such as water or hydrogen from above the insulator 270 into the metal oxide 230 through the conductor 260 and the insulator 250 can be inhibited.

The insulator 271 functions as a hard mask. By providing the insulator 271, the conductor 260 can be processed such that the side surface of the conductor 260 is substantially perpendicular; specifically, an angle formed by the side surface of the conductor 260 and a surface of the substrate can be greater than or equal to 75° and less than or equal to 100°, preferably greater than or equal to 80° and less than or equal to 95°.

Note that the insulator 271 may be formed using an insulating material having a function of inhibiting the passage of oxygen and impurities such as water or hydrogen so that the insulator 271 also functions as a barrier layer. In that case, it is not necessary to provide the insulator 270.

Parts of the insulator 270, the conductor 260, the metal oxide 252, the insulator 250, and the metal oxide 230c are selectively removed using the insulator 271 as a hard mask, whereby their side surfaces can be substantially aligned with each other and the surface of the metal oxide 230b can be partly exposed.

The transistor 200C includes a region 243a and a region 243b on part of the exposed surface of the metal oxide 230b. One of the region 243a and the region 243b functions as a source region, and the other of the region 243a and the region 243b functions as a drain region.

The region 243a and the region 243b can be formed by adding an impurity element such as phosphorus or boron to the exposed surface of the metal oxide 230b by an ion implantation method, an ion doping method, a plasma immersion ion implantation method, or plasma treatment, for example. In this embodiment and the like, an "impurity element" refers to an element other than main constituent elements.

The region 243a and the region 243b can also be formed in such manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as "impurity regions" or "low-resistance regions".

The region 243a and the region 243b can be formed in a self-aligned manner by using the insulator 271 and/or the conductor 260 as a mask. Accordingly, the conductor 260 does not overlap with the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves a higher on-state current, a lower threshold voltage, and a higher operating frequency, for example.

The transistor 200C includes an insulator 272 on the side surfaces of the insulator 271, the insulator 270, the conductor 260, the metal oxide 252, the insulator 250, and the metal oxide 230c. The insulator 272 is preferably an insulator having a low relative permittivity. The insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used for the insulator 272, in which case an excess oxygen region can be easily formed in the insulator 272 in a later step. Silicon oxide and silicon oxynitride are preferable because they are thermally stable. The insulator 272 preferably has a function of diffusing oxygen.

Note that an offset region may be provided between the channel formation region and the source/drain region in order to further reduce the off-state current. The offset region is a region where the electrical resistivity is high and a region where the above-described addition of the impurity element is not performed. The offset region can be formed in such a manner that the insulator 272 is formed and then the above-described addition of the impurity element is performed. In that case, the insulator 272 also serves as a mask, like the insulator 271 or the like. Thus, the impurity element is not added to a region of the metal oxide 230b overlapping with the insulator 272, so that the electrical resistivity of the region can be kept high.

The transistor 200C also includes the insulator 254 over the insulator 272 and the metal oxide 230. The insulator 254 is preferably formed by a sputtering method. The insulator formed by a sputtering method can be an insulator containing few impurities such as water or hydrogen.

Note that an oxide film obtained by a sputtering method may extract hydrogen from a structured part over which the oxide film is deposited. For that reason, the hydrogen concentrations in the metal oxide 230 and the insulator 272 can be reduced when the insulator 254 absorbs hydrogen and water from the metal oxide 230 and the insulator 272.

<Materials for Transistor>

Materials that can be used for the transistor will be described.

[Substrate]

As a substrate where the transistor 200A, the transistor 200B, or the transistor 200C is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example includes a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting device, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of leakage current may arise because of a thinned gate insulator. When a high-k material is used for the insulator functioning as a gate insulator, the voltage at the time of operation of the transistor can be reduced while the physical thickness is maintained. By contrast, when a material with a low relative permittivity is used for the insulator functioning as an interlayer film, parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, a structure is employed in which silicon oxide or silicon oxynitride that includes a region containing oxygen to be released by heating is provided in contact with the metal oxide 230, oxygen vacancies in the metal oxide 230 can be compensated.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide in which the channel is formed. A conductive material containing the above metal element and nitrogen may be used. For example, a conductive material containing nitrogen such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

Embodiment 3

Described in this embodiment is a metal oxide (hereinafter also referred to as an oxide semiconductor) applicable to an OS transistor described in the above embodiment.

<Classification of Crystal Structures>

First, the classification of the crystal structures of an oxide semiconductor will be described with reference to FIG. 24A. FIG. 24A is a diagram showing the classification of crystal structures of an oxide semiconductor, typically IGZO (a metal oxide containing In, Ga, and Zn).

As shown in FIG. 24A, an oxide semiconductor is roughly classified into "Amorphous," "Crystalline," and "Crystal." The term "Amorphous" includes a completely amorphous structure. The term "Crystalline" includes CAAC (c-axis-aligned crystalline), nc (nanocrystalline), and CAC (cloud-aligned composite) structures. Note that the term "Crystalline" excludes single crystal, poly crystal, and completely amorphous structures. The term "Crystal" includes single crystal and poly crystal structures.

Note that the structures in the thick frame in FIG. 24A are in an intermediate state between "Amorphous" and "Crystal," and belong to a new crystalline phase. That is, these structures are completely different from "Amorphous," which is energetically unstable, and "Crystal."

A crystal structure of a film or a substrate can be analyzed with an X-ray diffraction (XRD) spectrum. FIG. 24B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method. The XRD spectrum that is shown in FIG. 24B and obtained by GIXD measurement is hereinafter simply referred to as an XRD spectrum. The CAAC-IGZO film in FIG. 24B has an atomic ratio of In:Ga:Zn=4:2:3 or a neighborhood thereof. The CAAC-IGZO film in FIG. 24B has a thickness of 500 nm.

As shown in FIG. 24B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 24B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 24C shows a diffraction pattern of the CAAC-IGZO film. FIG. 24C shows a diffraction pattern obtained by the NBED method in which an electron beam is incident in the direction parallel to the substrate. The CAAC-IGZO film in FIG. 24C has an atomic ratio of In:Ga:Zn=4:2:3 or a neighborhood thereof. In the nanobeam electron diffraction method, electron diffraction is performed with a probe diameter of 1 nm.

As shown in FIG. 24C, a plurality of spots indicating c-axis alignment are observed in the diffraction pattern of the CAAC-IGZO film.

[Structure of Oxide Semiconductor]

Oxide semiconductors might be classified in a manner different from the one in FIG. 24A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

[Composition of Oxide Semiconductor]

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility GO, and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{1\tau}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of this embodiment can be implemented in combination with any of the other embodiments described in this specification as appropriate.

Embodiment 4

In this embodiment, electronic devices each including a display device that is one embodiment of the present invention are described.

Figure 25A:
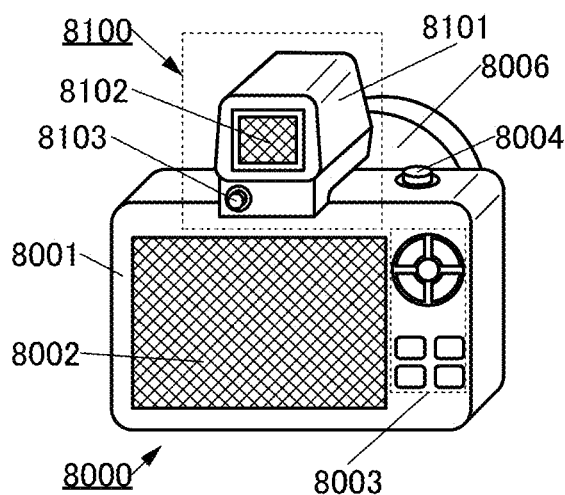
FIG. 25A, FIG. 25B, FIG. 25C, FIG. 25D, and FIG. 25E are perspective views illustrating examples of electronic devices.

FIG. 25A is a diagram illustrating the appearance of a camera 8000 to which a finder 8100 is attached. The camera 8000 is provided with an imaging device. The camera 8000 can be a digital camera, for example. Note that although the camera 8000 and the finder 8100 are separate and detachable electronic devices in FIG. 25A, a finder including a display device may be incorporated in a housing 8001 of the camera 8000.

The camera 8000 includes the housing 8001, a display portion 8002, operation buttons 8003, a shutter button 8004, and the like. A detachable lens 8006 is attached to the camera 8000.

Although the lens 8006 of the camera 8000 here is detachable from the housing 8001 for replacement, the lens 8006 may be integrated with the housing.

The camera 8000 can take images at the press of the shutter button 8004. The display portion 8002 functions as a touch panel and images can also be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like. The finder 8100 can be an electronic viewfinder.

The housing 8101 includes a mount for engagement with the mount of the camera 8000 so that the finder 8100 can be attached to the camera 8000. The mount includes an electrode, and an image or the like received from the camera 8000 through the electrode can be displayed on the display portion 8102.

The button 8103 functions as a power button. The on/off state of the display portion 8102 can be switched with the button 8103.

A display device of one embodiment of the present invention can be used for the display portion 8002 of the camera 8000 and the display portion 8102 of the finder 8100. The display device of one embodiment of the present invention has extremely high-resolution; thus, even when the display portion 8002 or the display portion 8102 is close to the user, a more realistic image can be displayed on the display portion 8002 or the display portion 8102 without perception of pixels by the user. In particular, an image displayed on the display portion 8102 provided in the finder 8100 is perceived when the user brings his/her eyes closer to the eyepiece of the finder 8100; thus, the distance between the user and the display portion 8102 becomes very short. Thus, in particular, the display device of one embodiment of the present invention is preferably used for the display portion 8102. Note that in the case where the display device of one embodiment of the present invention is used for the display portion 8102, the resolution of an image that can be displayed on the display portion 8102 can be 4K, 5K, or higher.

Note that the resolution of an image that can be taken by the imaging device provided in the camera 8000 is preferably the same as or higher than the resolution of an image that can be displayed on the display portion 8002 or the display portion 8102. For example, in the case where an image having a resolution of 4K can be displayed on the display portion 8102, the camera 8000 is preferably provided with an imaging device that can take an image of 4K or higher. Moreover, for example, in the case where an image having a resolution of 5K can be displayed on the display portion 8102, the camera 8000 is preferably provided with an imaging device that can take an image of 5K or higher.

Figure 25B:
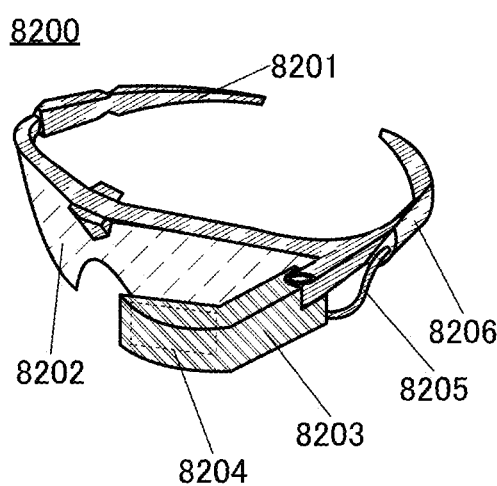

FIG. 25B is a diagram illustrating the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball and the eyelid of the user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display portion 8204 can use the display device of one embodiment of the present invention. Accordingly, the head-mounted display 8200 can have a narrower bezel, and on the display portion 8204, a high-quality image can be displayed and a more realistic image can be displayed.

Figure 25C:
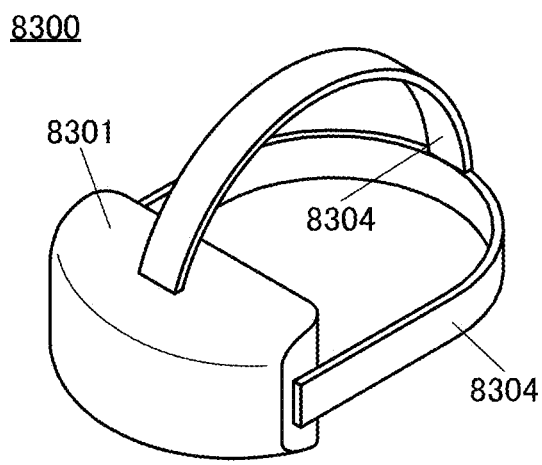
Figure 25D:
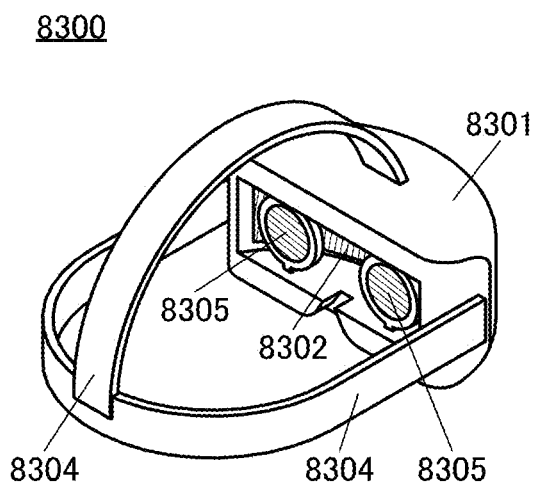
Figure 25E:
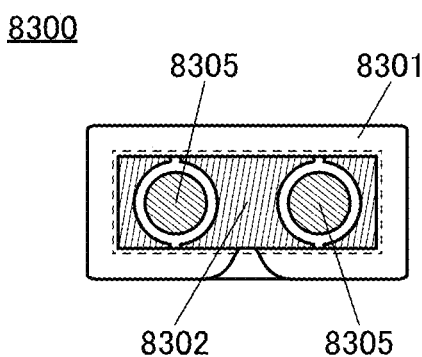

FIG. 25C, FIG. 25D, and FIG. 25E are diagrams illustrating the appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. It is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

Note that the display device of one embodiment of the present invention can be used in the display portion 8302. The display device of one embodiment of the present invention is extremely high-definition; thus, even when an image is magnified using the lenses 8305 as in FIG. 25E, the user does not perceive pixels, and a more realistic image can be displayed.

Next, FIG. 26A to FIG. 26G show examples of electronic devices that are different from the electronic devices illustrated in FIG. 25A to FIG. 25E.

Electronic devices illustrated in FIG. 26A to FIG. 26G include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 26A to FIG. 26G have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 26A to FIG. 26G are not limited thereto, and the electronic devices can have a variety of functions. Although not illustrated in FIG. 26A to FIG. 26G, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, and the like.

The details of the electronic devices illustrated in FIG. 26A to FIG. 26G are described below.

Figure 26A:
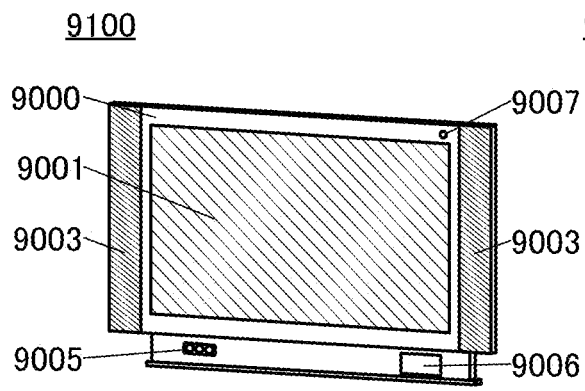
FIG. 26A, FIG. 26B, FIG. 26C, FIG. 26D, FIG. 26E, FIG. 26F, and FIG. 26G are perspective views illustrating examples of electronic devices.

FIG. 26A is a perspective view illustrating a television 9100. The television 9100 can include the display portion 9001 having a large screen size of, for example, 50 inches or more, or 100 inches or more.

The display device of one embodiment of the present invention can be used for the display portion 9001 included in the television 9100. Accordingly, the television 9100 can have a narrower bezel, and on the display portion 9001, a high-quality image can be displayed and a more realistic image can be displayed.

Figure 26D:
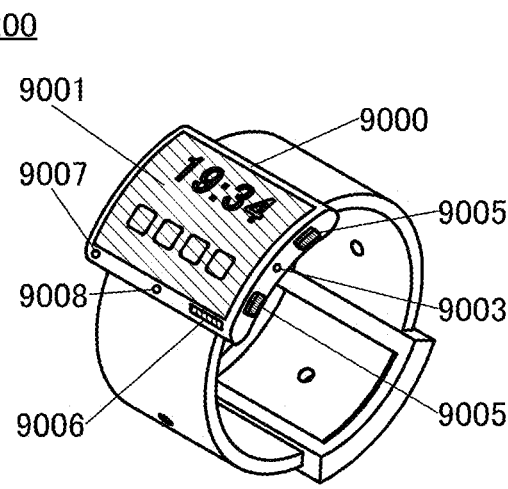
Figure 26B:
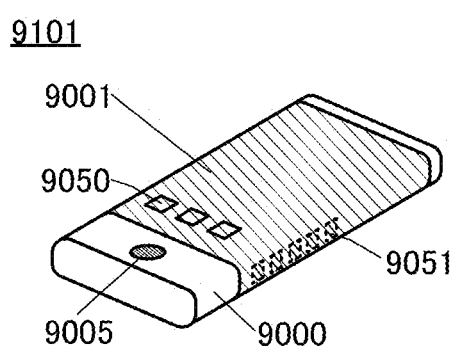

FIG. 26B is a perspective view illustrating a portable information terminal 9101. The portable information terminal 9101 has a function of one or more selected from a telephone set, a notebook, an information browsing device, and the like, for example. Specifically, the portable information terminal can be used as a smartphone. Note that the portable information terminal 9101 may be provided with the speaker 9003, the connection terminal 9006, the sensor 9007, or the like. The portable information terminal 9101 can display characters and image information on its plurality of surfaces. For example, three operation buttons 9050 (also referred to as operation icons, or simply icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display device of one embodiment of the present invention can be used for the display portion 9001 included in the portable information terminal 9101. Accordingly, the size of the portable information terminal 9101 can be reduced, and on the display portion 9001, a high-quality image can be displayed and a more realistic image can be displayed.

Figure 26E:
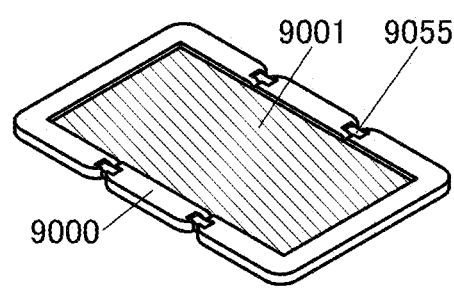
Figure 26C:
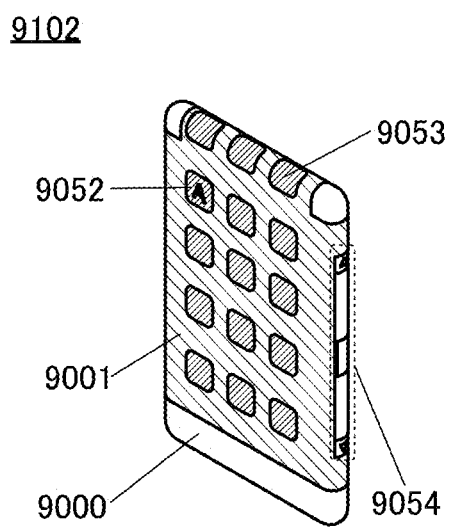

FIG. 26C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The display device of one embodiment of the present invention can be used for the display portion 9001 of the portable information terminal 9102. Accordingly, the size of the portable information terminal 9101 can be reduced, and on the display portion 9001, a high-quality image can be displayed and a more realistic image can be displayed.

FIG. 26D is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used in the display portion 9001 of the portable information terminal 9200. Accordingly, the portable information terminal 9200 can have a narrower bezel, and on the display portion 9001, a high-quality image can be displayed and a more realistic image can be displayed.

Figure 26F:
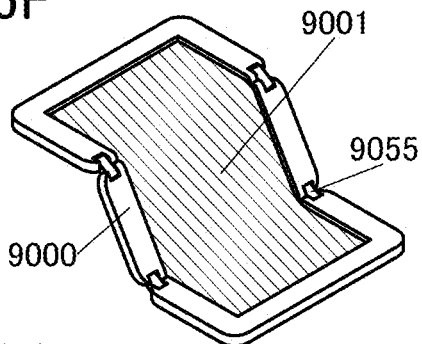
Figure 26G:
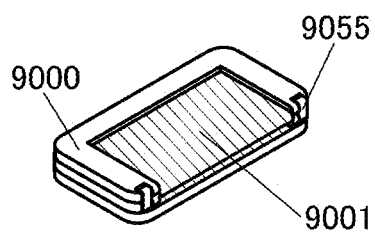

FIG. 26E, FIG. 26F, and FIG. 26G are perspective views illustrating a foldable portable information terminal 9201. FIG. 26E is a perspective view of the portable information terminal 9201 in the opened state, FIG. 26F is a perspective view of the portable information terminal 9201 that is shifted from one of the opened state and the folded state to the other, and FIG. 26G is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The display device of one embodiment of the present invention can be used in the display portion 9001 of the portable information terminal 9201. Accordingly, the portable information terminal 9201 can have a narrower bezel, and on the display portion 9001, a high-quality image can be displayed and a more realistic image can be displayed.

At least part of the structure examples, the drawings corresponding thereto, and the like described in this embodiment can be implemented in combination with any of the other structure examples, the other drawings, and the like as appropriate.

At least part of this embodiment can be implemented in combination with any of the other embodiments described in this specification as appropriate.

Example 1

In this example, a boosting operation with the timing chart shown in FIG. 2 in the pixel circuit configuration illustrated in FIG. 1 is confirmed with use of circuit simulation.

In the simulation, the transistor 101 and the transistor 102 are each an OS transistor having a channel length of 200 μm and a channel width of 60 μm. The transistor 103 and the transistor 104 are each an OS transistor having a channel length of 60 μm and a channel width of 60 μm. The capacitance of each of the capacitor 111 and the capacitor 112 is 7.26 fF. As voltages applied to the wiring 121 and the wiring 122, "High" is 5 V and "Low" is 0 V. The simulation is conducted by setting "Vdata" of the wiring 131 to 0.5 V, 1.0 V, 1.5 V, 2.0 V, 2.5 V, 3.0 V, 3.5 V, and 4.0 V. As the circuit simulation software, SmartSpice by Silvaco, Inc. is used. "Vref" of the wiring 127 is set to 0.5 V, "Vano" of the wiring 128 is set to 8.0 V, and "Vcath" of the wiring 129 is set to −1.5 V.

Figure 27:
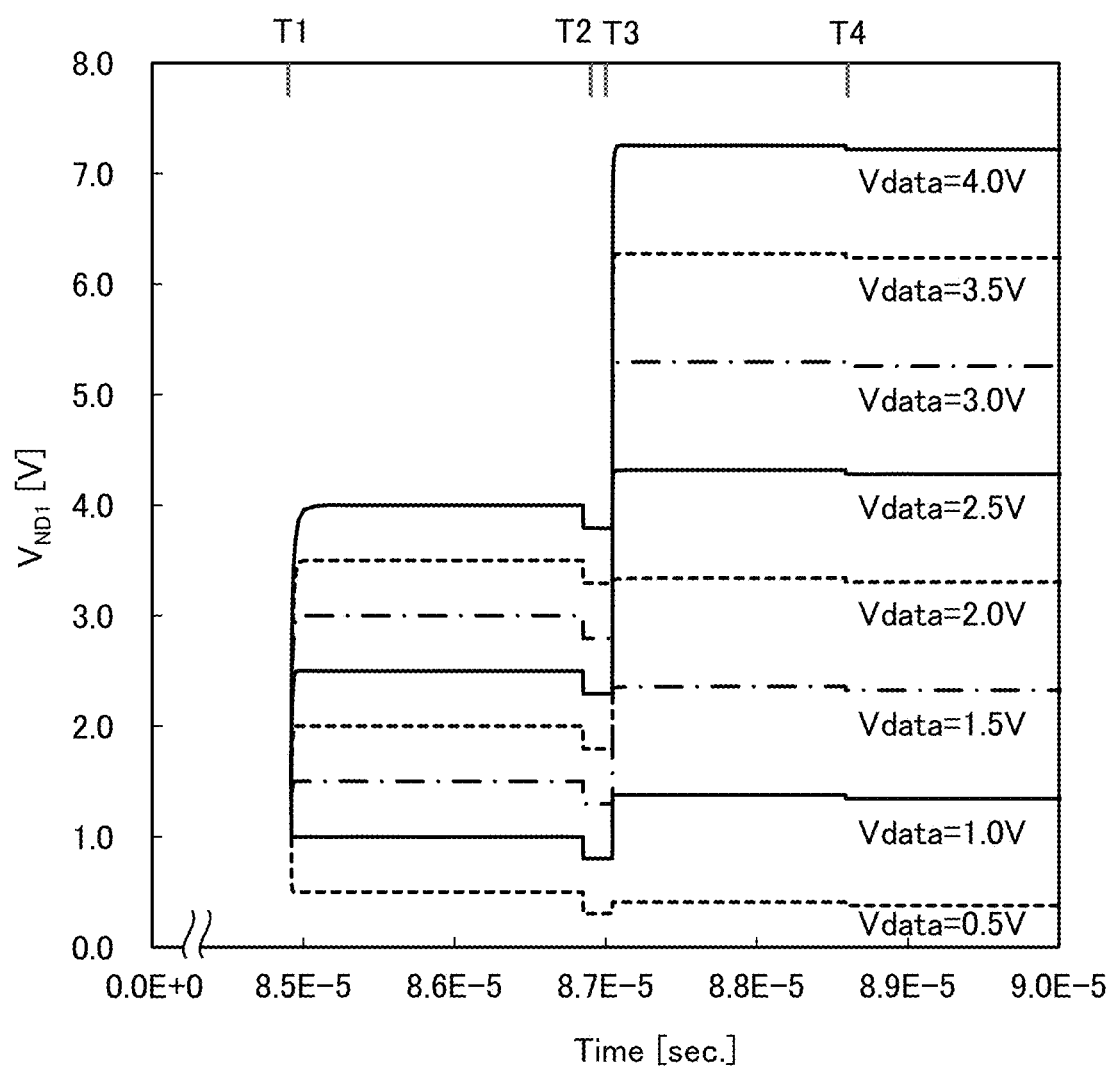
FIG. 27 is a diagram showing a simulation result.

The simulation result is shown in FIG. 27. In FIG. 27, the horizontal axis represents the time (Time) based on the timing chart and the vertical axis represents the minimum value of the potential $V_{ND1}$ of the node ND1 at and after the time T4. Table 1 shows ideal values and simulation results of the potential $V_{ND1}$ of the node ND1.

Note that the ideal values of the potential $V_{ND1}$ in Table 1 are values obtained when the constant a, the constant b, and the constant c in the above-described formula (9) are zero.

TABLE 1

| Vdata [V] | $V_{ND1}$ (ideal value) [V] | $V_{ND1}$ (simulation result) [V] |
|---|---|---|
| 0.5 | 0.5 | 0.37 |
| 1.0 | 1.5 | 1.34 |
| 1.5 | 2.5 | 2.32 |
| 2.0 | 3.5 | 3.30 |
| 2.5 | 4.5 | 4.28 |
| 3.0 | 5.5 | 5.25 |
| 3.5 | 6.5 | 6.23 |
| 4.0 | 7.5 | 7.22 |

As shown in FIG. 27 and Table 1, it is confirmed that the potential $V_{ND1}$ of the node ND1 obtained in the simulation is equivalent to the ideal values. The difference from the ideal values is considered to be influences by feedthrough, charge injection, or the like when the transistor 102, the transistor 103, and the transistor 104 are turned off, which are shown by the constant a, the constant b, and the constant c. It is found that the display device of one embodiment of the present invention can boost $V_{ND1}$ to a voltage higher than a voltage corresponding to the image data supplied to the pixel 10, and can supply the boosted voltage to the transistor 101 serving as a driving transistor. Therefore, it is found that current flowing in the light-emitting device 114 can be increased.

Example 2

In this example, results of simulation under conditions different from those in Example 1 will be described. FIG. 1 and FIG. 2 can be referred to, respectively, for the circuit configuration and the timing chart.

In the simulation, the transistor 101 and the transistor 102 are each an OS transistor having a channel length of 200 μm and a channel width of 60 μm. The transistor 103 and the transistor 104 are each a transistor having a channel length of 60 μm and a channel width of 60 μm. The capacitance of each of the capacitor 111 and the capacitor 112 is 7.26 fF. As voltages applied to the wiring 121 and the wiring 122, "High" is 5 V and "Low" is 0 V. "Vdata" of the wiring 131 is set to 4.3 V, "Vref" of the wiring 127 is set to 1.1 V, "Vano" of the wiring 128 is set to 8.0 V, and "Vcath" of the wiring 129 is subjected to −1.5 V, and the simulation is conducted. SPICE is used as circuit simulation software.

Figure 28:
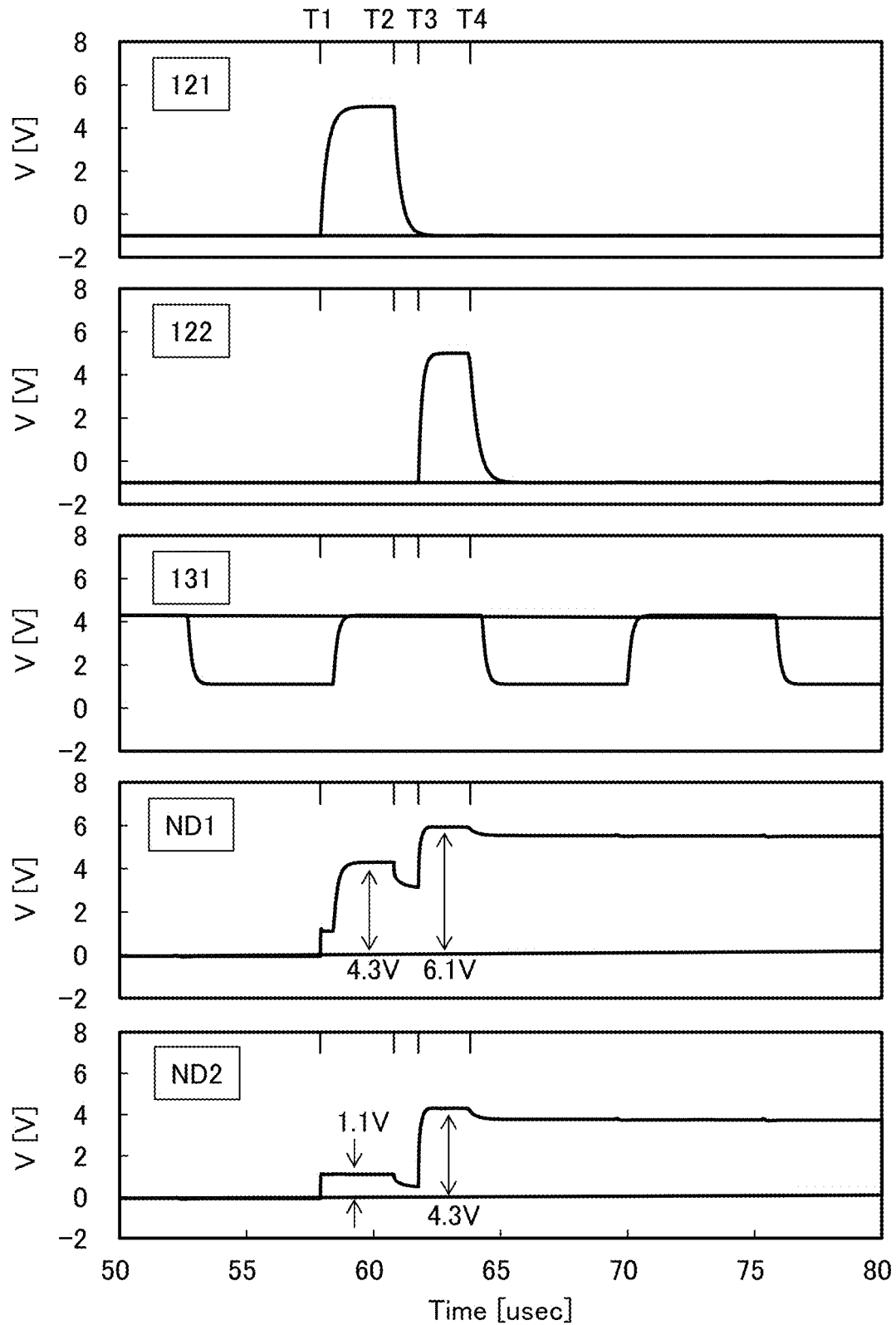
FIG. 28 is a diagram showing a simulation result.

The simulation result is shown in FIG. 28. In FIG. 28, the horizontal axis represents the time (Time) based on the timing chart, and the vertical axis represents the potentials V of the wiring 121, the wiring 122, the wiring 131, the node ND1, and the node ND2.

As shown in FIG. 28, the potential V of the node ND1 obtained through the simulation is 6.1 V and is confirmed to be higher than the supplied potential (the potential of the wiring 131).

REFERENCE NUMERALS

10: pixel, 10A: pixel, 10B: subpixel, 10G: subpixel, 10R: subpixel, 20: first layer, 30: second layer, 51a: display region, 51b: display region, 51c: display region, 53: pixel electrode, 53a: pixel electrode, 53b: pixel electrode, 53c: pixel electrode, 100: display device, 101: transistor, 102: transistor, 103: transistor, 104: transistor, 105: transistor, 111: capacitor, 112: capacitor, 114: light-emitting device, 121: wiring, 122: wiring, 127: wiring, 128: wiring, 129: wiring, 130: driver circuit portion, 131: wiring, 140a: driver circuit portion, 140b: driver circuit portion, 141: wiring, 143: wiring, 150: pixel portion, 200A: transistor, 200B: transistor, 200C: transistor, 205: conductor, 214: insulator, 216: insulator, 222: insulator, 224: insulator, 230a: metal oxide, 230b: metal oxide, 230c: metal oxide, 230: metal oxide, 240a: conductor, 240b: conductor, 240: conductor, 241a: insulator, 241b: insulator, 241: insulator, 242a: conductor, 242b: conductor, 242: conductor, 243a: region, 243b: region, 244: insulator, 250: insulator, 252: metal oxide, 254: insulator, 260a: conductor, 260b: conductor, 260: conductor, 270: insulator, 271: insulator, 272: insulator, 274: insulator, 280: insulator, 281: insulator, 301a: conductor, 301b: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 403: element isolation layer, 405: insulator, 407: insulator, 409: insulator, 411: insulator, 413: insulator, 415: insulator, 417: insulator, 419: insulator, 421: insulator, 441: transistor, 443: conductor, 445: insulator, 447: semiconductor region, 449a: low-resistance region, 449b: low-resistance region, 451: conductor, 453: conductor, 455: conductor, 457: conductor, 459: conductor, 461: conductor, 463: conductor, 465: conductor, 467: conductor, 469: conductor, 471: conductor, 501: insulator, 503: insulator, 505: insulator, 507: insulator, 509: insulator, 572: light-emitting device, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716: FPC, 721: hole-injection layer, 722: hole-transport layer, 723: light-emitting layer, 724: electron-transport layer, 725: electron-injection layer, 730: insulator, 732: sealing layer, 734: insulator, 736: coloring layer, 738: light-blocking layer, 750: transistor, 760: connection electrode, 772: conductor, 778: structured part, 780: anisotropic conductor, 782: light-emitting device, 786a: EL layer, 786b: EL layer, 786c: EL layer, 786: EL layer, 788: conductor, 790: capacitor, 792: charge generation layer, 800: transistor, 801a: conductor, 801b: conductor, 805: conductor, 811: conductor, 813: conductor, 814: insulator, 816: insulator, 817: conductor, 821: insulator, 822: insulator, 824: insulator, 844: insulator, 853: conductor, 854: insulator, 855: conductor, 874: insulator, 880: insulator, 881: insulator, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television, 9101: portable information terminal, 9102: portable information terminal, 9200: portable information terminal, 9201: portable information terminal

The invention claimed is:

1. A display device comprising:
   a pixel portion comprising a plurality of pixels;
   a first wiring;
   a second wiring;
   a third wiring; and
   a fourth wiring,
   wherein the pixels each comprise a light-emitting device, a first transistor, a second transistor, a third transistor, a fourth transistor, a first capacitor, and a second capacitor,
   wherein one electrode of the light-emitting device is electrically connected to one of a source and a drain of the first transistor,
   wherein a gate of the first transistor is electrically connected to one electrode of the first capacitor and one of a source and a drain of the second transistor,
   wherein the other of the source and the drain of the first transistor is electrically connected to one electrode of the second capacitor,
   wherein one electrode of the second capacitor is electrically connected to the first wiring configured to supply a first potential,
   wherein the other electrode of the second capacitor is electrically connected to the other electrode of the first capacitor, one of a source and a drain of the third transistor, and one of a source and a drain of the fourth transistor,
   wherein a gate of the second transistor is electrically connected to the second wiring,
   wherein a gate of the fourth transistor is electrically connected to the second wiring,
   wherein a gate of the third transistor is electrically connected to the third wiring,
   wherein the other of the source and the drain of the second transistor is electrically connected to the fourth wiring, and
   wherein the other of the source and the drain of the third transistor is electrically connected to the fourth wiring.

2. The display device according to claim 1,
   wherein the first transistor comprises a back gate, and
   wherein the back gate is electrically connected to the one of the source and the drain of the first transistor.

3. The display device according to claim 1,
wherein the first transistor comprises a back gate, and
wherein the back gate is electrically connected to the gate of the first transistor.

4. The display device according to claim 1, further comprising a fifth transistor,
wherein one of a source and a drain of the fifth transistor is electrically connected to the one electrode of the light-emitting device.

5. The display device according to claim 1,
wherein the other electrode of the light-emitting device is electrically connected to a fifth wiring configured to supply a second potential, and
wherein the second potential is lower than the first potential.

6. The display device according to claim 1,
wherein the light-emitting device is an organic light-emitting diode.

7. The display device according to claim 1, further comprising a first driver circuit portion,
wherein the first driver circuit portion comprises a region overlapping with the pixel portion, and
wherein the first driver circuit portion is electrically connected to the fourth wiring.

8. The display device according to claim 7, further comprising a first layer and a second layer over the first layer,
wherein the first layer comprises the first driver circuit portion and a second driver circuit portion,
wherein the second layer comprises the pixel portion, and
wherein the second driver circuit portion is electrically connected to the second wiring and the third wiring.

9. The display device according to claim 1,
wherein the first transistor, the second transistor, the third transistor, and the fourth transistor each comprise a metal oxide in a channel formation region, and
wherein the metal oxide comprises indium, zinc, and an element M (one or more of aluminum, titanium, gallium, germanium, yttrium, zirconium, lanthanum, cerium, tin, neodymium, and hafnium).

10. An electronic device comprising the display device according to claim 1 and a camera.

* * * * *